United States Patent
Kim et al.

(10) Patent No.: US 9,608,211 B2
(45) Date of Patent: Mar. 28, 2017

(54) HETEROCYCLIC COMPOUND AND ORGANIC LIGHT-EMITTING DIODE INCLUDING THE SAME

(71) Applicant: SAMSUNG DISPLAY CO., LTD., Yongin, Gyeonggi-Do (KR)

(72) Inventors: Soo-Yon Kim, Yongin (KR); Seok-Hwan Hwang, Yongin (KR); Young-Kook Kim, Yongin (KR); Hye-Jin Jung, Yongin (KR); Jun-Ha Park, Yongin (KR); Eun-Young Lee, Yongin (KR); Jong-Woo Kim, Yongin (KR); Jin-O Lim, Yongin (KR); Sang-Hyun Han, Yongin (KR); Kwang-Hyun Kim, Yongin (KR); Eun-Jae Jeong, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 378 days.

(21) Appl. No.: 14/284,074

(22) Filed: May 21, 2014

(65) Prior Publication Data
US 2015/0053940 A1    Feb. 26, 2015

(30) Foreign Application Priority Data

Aug. 21, 2013 (KR) ........................ 10-2013-0099237

(51) Int. Cl.
*H01L 51/00* (2006.01)
*H01L 51/50* (2006.01)

(52) U.S. Cl.
CPC ........ *H01L 51/0073* (2013.01); *H01L 51/006* (2013.01); *H01L 51/0061* (2013.01);
(Continued)

(58) Field of Classification Search
None
See application file for complete search history.

(56) References Cited

U.S. PATENT DOCUMENTS

| 4,521,605 A | 6/1985 | Okazaki et al. |
| 5,591,554 A | 1/1997 | Mishra et al. |

(Continued)

FOREIGN PATENT DOCUMENTS

| KR | 10-0346984 B1 | 7/2002 |
| KR | 10-0351234 B1 | 9/2002 |

(Continued)

OTHER PUBLICATIONS

"A novel conjugated polymer based on 4H-benzo[def]carbazole backbone for OLED", 2009 Fall Assembly and Symposium., vol. 34, No. 2, 2009.

*Primary Examiner* — J. L. Yang
(74) *Attorney, Agent, or Firm* — Lee & Morse, P.C.

(57) ABSTRACT

A heterocyclic compound and an organic light-emitting diode including the same, the heterocyclic compound being represented by Formula 1 below:

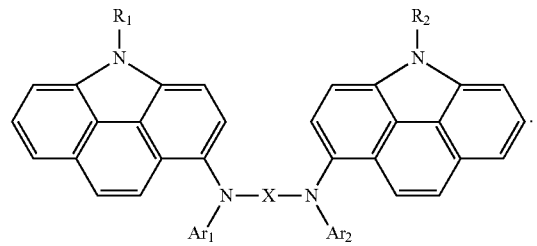

<Formula 1>

20 Claims, 1 Drawing Sheet

(52) U.S. Cl.
CPC ...... *H01L 51/0072* (2013.01); *H01L 51/0081* (2013.01); *H01L 51/0094* (2013.01); *H01L 51/5016* (2013.01); *H01L 51/5056* (2013.01); *H01L 51/5088* (2013.01)

(56) References Cited

U.S. PATENT DOCUMENTS

| | | |
|---|---|---|
| 6,660,410 B2 | 12/2003 | Hosokawa |
| 6,670,054 B1 | 12/2003 | Hu et al. |
| 6,979,414 B2 | 12/2005 | Hosokawa |
| 7,053,255 B2 | 5/2006 | Ikeda et al. |
| 7,233,019 B2 | 6/2007 | Ionkin et al. |
| 7,429,372 B2 | 9/2008 | Pez et al. |
| 2001/0046612 A1 | 11/2001 | Lee et al. |
| 2005/0156164 A1 | 7/2005 | Sotoyama |
| 2009/0019768 A1 | 1/2009 | Toseland et al. |
| 2014/0110675 A1* | 4/2014 | Kim .............. C07D 401/10 257/40 |

FOREIGN PATENT DOCUMENTS

| | | |
|---|---|---|
| KR | 10-2006-0006760 A | 1/2006 |
| WO | WO-02/20694 A1 | 3/2002 |

\* cited by examiner

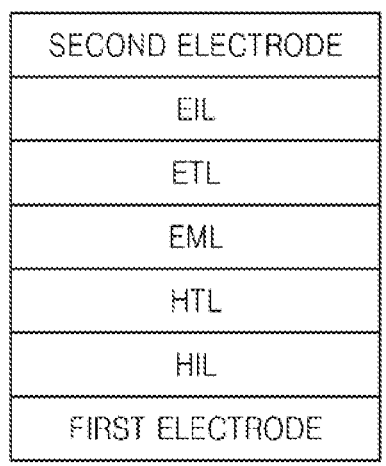

HETEROCYCLIC COMPOUND AND ORGANIC LIGHT-EMITTING DIODE INCLUDING THE SAME

CROSS-REFERENCE TO RELATED APPLICATION

Korean Patent Application No. 10-2013-0099237, filed on Aug. 21, 2013, in the Korean Intellectual Property Office, and entitled: "Heterocyclic Compound and Organic Light-Emitting Diode Including The Same," is incorporated by reference herein in its entirety.

BACKGROUND

1. Field

Embodiments relate to a heterocyclic compound and an organic light-emitting diode including the same.

2. Description of the Related Art

Organic light-emitting diodes (OLEDs), which are self-emitting diodes, have advantages such as wide viewing angle, excellent contrast, quick response, high brightness, excellent driving voltage characteristics, and can provide multicolored images.

An OLED may have a structure including a substrate, an anode on the substrate, and a hole transport layer (HTL), an emission layer (EML), an electron transport layer (ETL), and a cathode that are sequentially stacked on the anode. The HTL, the EML, and the ETL may be organic thin films formed of organic compounds.

An operating principle of an OLED having the above-described structure is as follows.

When a voltage is applied between the anode and the cathode, holes injected from the anode may move to the EML via the HTL, and electrons injected from the cathode may move to the EML via the ETL. Carriers (e.g., the holes and electrons) may recombine in the EML, thereby generating excitons. Then, when excitons drop from an excited state to a ground state, light is emitted.

SUMMARY

Embodiments are directed to a heterocyclic compound and an organic light-emitting diode including the same.

The embodiments may be realized by providing a heterocyclic compound represented by Formula 1 below:

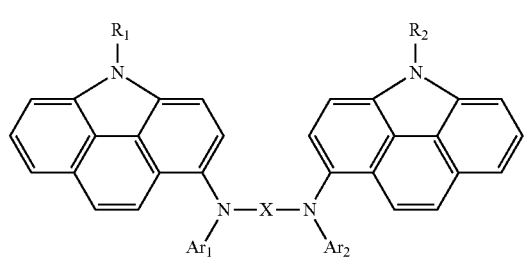

<Formula 1> wherein X is a substituted or unsubstituted $C_6$-$C_{60}$ arylene group, a substituted or unsubstituted $C_2$-$C_{60}$ heteroarylene group, a substituted or unsubstituted $C_6$-$C_{60}$ condensed polycyclic group, or a divalent linking group that connects at least two of the arylene group, the heteroarylene group, and the condensed polycyclic group; $R_1$ and $R_2$ are each independently a substituted or unsubstituted $C_1$-$C_{60}$ alkyl group, a substituted or unsubstituted $C_3$-$C_{30}$ cycloalkyl group, a substituted or unsubstituted $C_6$-$C_{60}$ aryl group, a substituted or unsubstituted $C_2$-$C_{60}$ heteroaryl group, or a substituted or unsubstituted $C_6$-$C_{60}$ condensed polycyclic group; and $Ar_1$ and $Ar_2$ are each independently a substituted or unsubstituted $C_6$-$C_{60}$ aryl group, a substituted or unsubstituted $C_2$-$C_{60}$ heteroaryl group, or a substituted or unsubstituted $C_6$-$C_{60}$ condensed polycyclic group.

$R_1$ and $R_2$ in Formula 1 may be each independently a substituted or unsubstituted $C_6$-$C_{60}$ aryl group or a substituted or unsubstituted $C_2$-$C_{60}$ heteroaryl group.

$Ar_1$ and $Ar_2$ in Formula 1 may be each independently a substituted or unsubstituted $C_6$-$C_{60}$ aryl group or a substituted or unsubstituted $C_2$-$C_{60}$ heteroaryl group.

$R_1$ and $R_2$ in Formula 1 may be each independently a substituted or unsubstituted $C_1$-$C_{20}$ alkyl group or a group represented by one of Formulae 2a to 2d below:

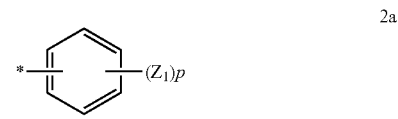

2a

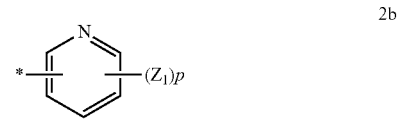

2b

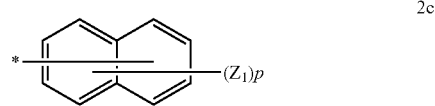

2c

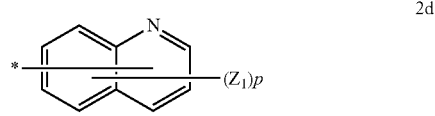

2d wherein $Z_1$ may be a hydrogen, a deuterium, a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted $C_6$-$C_{20}$ condensed polycyclic group, a halogen atom, a cyano group, a nitro group, a hydroxyl group, a carboxyl group, or $Si(Q_3)(Q_4)(Q_5)$, in which $Q_3$ to $Q_5$ may be each independently a hydrogen, a $C_1$-$C_{10}$ alkyl group, a $C_6$-$C_{20}$ aryl group, or a $C_2$-$C_{20}$ heteroaryl group, and each $Z_1$ may be identical to or different from each other when numbers of $Z_1$s are two or greater; p may be an integer of 1 to 7; and * indicates a binding site.

X in Formula 1 may be a group represented by one of Formulae 3a to 3l below:

3a

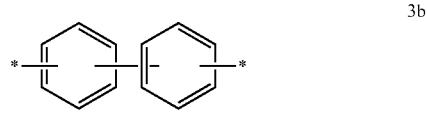

3b

3
-continued

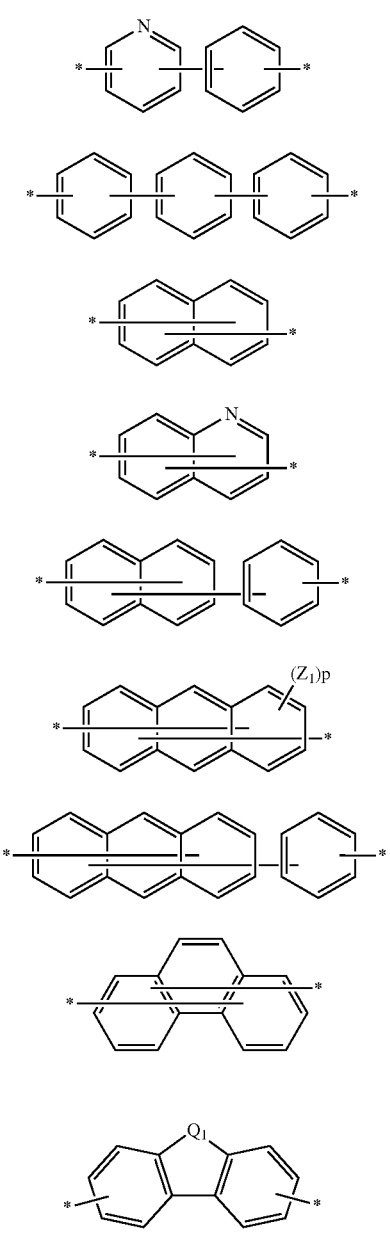

3c
3d
3e
3f
3g
3h
3i
3j
3k

4
-continued

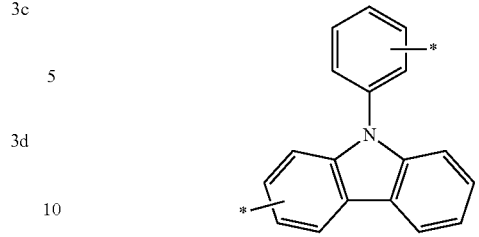

31 wherein $Q_1$ may be $CR_{11}R_{12}$—, —S—, —$NR_{21}$—, —$SiR_{31}R_{32}$—, or —O—; $R_{11}$, $R_{12}$, $R_{21}$, $R_{31}$, $R_{32}$, and $Z_1$ may be each independently a hydrogen, a deuterium, a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted $C_6$-$C_{20}$ condensed polycyclic group, a halogen atom, a cyano group, a nitro group, a hydroxyl group, or a carboxyl group, each $Z_1$ being identical to or different from each other when numbers of $Z_1$s are two or greater; p may be an integer of 1 to 4; and * indicates a binding site.

$Ar_1$ and $Ar_2$ in Formula 1 may be each independently a group represented by one of Formulae 4a to 4c below:

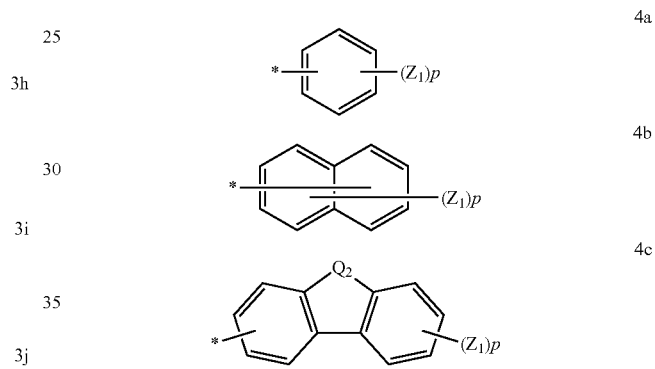

4a

4b

4c wherein $Q_2$ may be —$CR_{11}R_{12}$— or —O—; $R_{11}$, $R_{12}$, and $Z_1$ may be each independently a hydrogen, a deuterium, a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted $C_6$-$C_{20}$ condensed polycyclic group, a halogen atom, a cyano group, a nitro group, a hydroxyl group, or a carboxyl group, each $Z_1$ being identical to or different from each other when numbers of $Z_1$s are two or greater; p may be an integer of 1 to 7; and * indicates a binding site.

The heterocyclic compound represented by Formula 1 may be one of compounds 2, 10, 18, 31, 40, 47, 51, or 56, below:

2

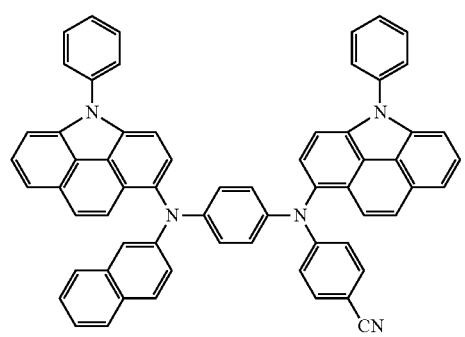

10

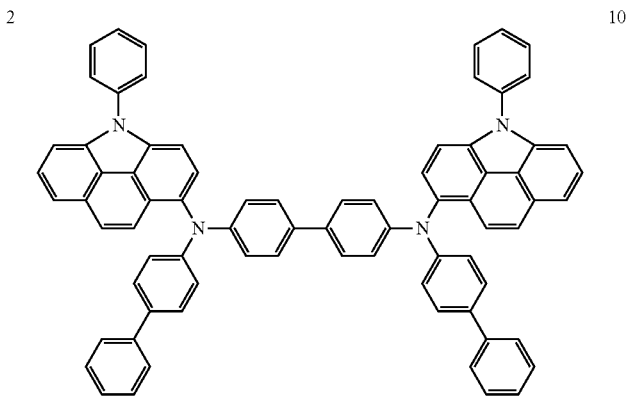

-continued
18
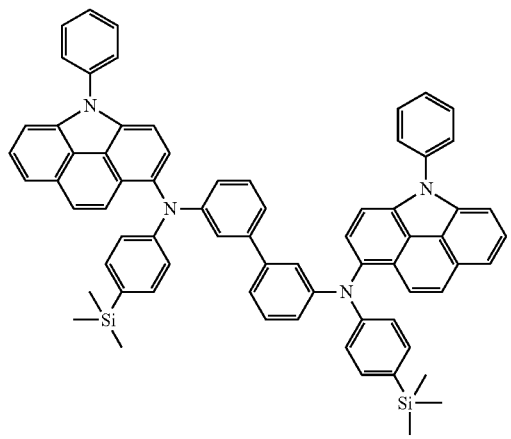
31
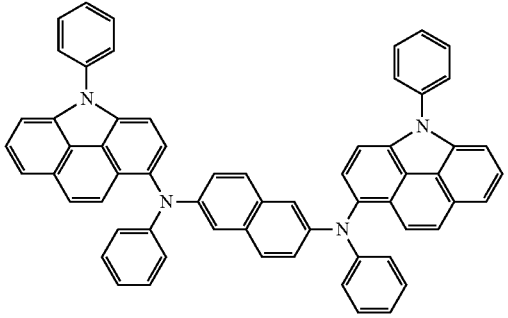
40
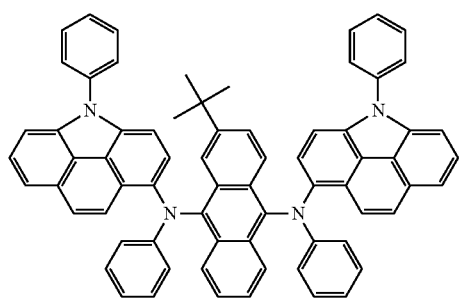
47
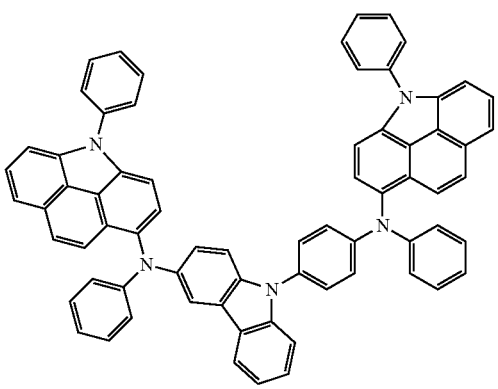
51
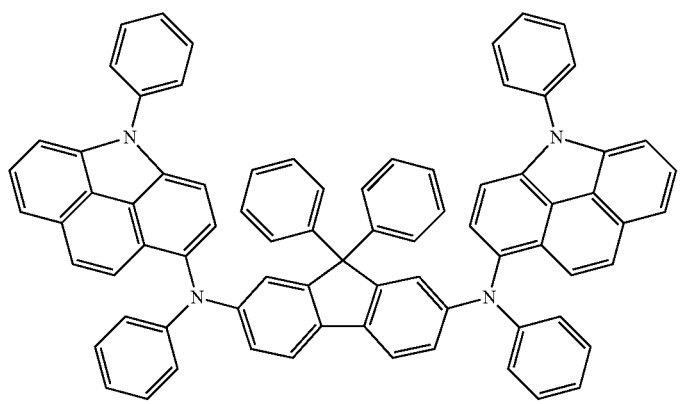
56
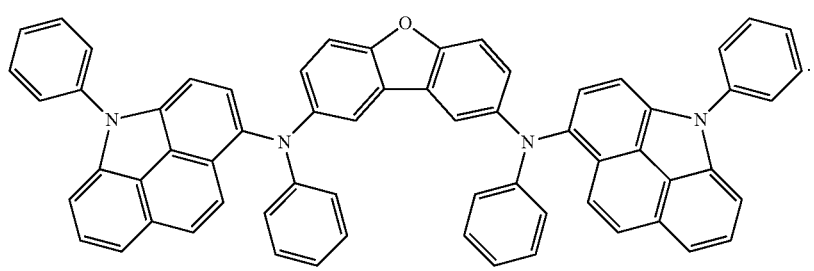

The embodiments may be realized by providing an organic light-emitting diode including a first electrode; a second electrode facing the first electrode; and an organic layer between the first electrode and the second electrode, the organic layer including the heterocyclic compound according to an embodiment.

The organic layer may include a hole transport layer, a hole injection layer, a functional layer having both hole injection and hole transport capabilities, or an emission layer.

The organic layer may include an emission layer, and may further include an electron injection layer, an electron transport layer, a functional layer having both electron injection and electron transport capabilities, a hole injection layer, a hole transport layer, or a functional layer having both hole injection and hole transport capabilities, and the emission layer may include an anthracene-based compound, an arylamine-based compound, or a styryl-based compound.

The organic layer may include an emission layer, and may further include an electron injection layer, an electron transport layer, a functional layer having both electron injection and electron transport capabilities, a hole injection layer, a hole transport layer, or a functional layer having both hole injection and hole transport capabilities, and at least one layer of a red emission layer, a green emission layer, a blue emission layer, and a white emission layer of the emission layer may include a phosphorescent compound.

The organic layer may include the hole injection layer, the hole transport layer, or the functional layer having both hole injection and hole transport capabilities, and the hole injection layer, the hole transport layer, or the functional layer having both hole injection and hole transport capabilities may include a charge-generating material.

The charge-generating material may be a p-dopant.

The p-dopant may be a quinone derivative.

The p-dopant may be a metal oxide.

The p-dopant may be a cyano group-containing compound.

The organic layer may include an electron transport layer that includes a metal complex.

The metal complex may include a lithium complex.

The organic layer including the heterocyclic compound may be formed using a wet process.

The first electrode of the OLED may be electrically connected to a source electrode or a drain electrode in a thin film transistor.

BRIEF DESCRIPTION OF THE DRAWING

Features will be apparent to those of skill in the art by describing in detail exemplary embodiments with reference to the attached drawing in which:

FIG. 1 illustrates a schematic view of a structure of an organic light-emitting diode (OLED) according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration.

As used herein, the term "and/or" includes any and all combinations of one or more of the associated listed items. Expressions such as "at least one of," when preceding a list of elements, modify the entire list of elements and do not modify the individual elements of the list.

According to an embodiment, there is provided an organic light-emitting diode (OLED) including a heterocyclic compound represented by Formula 1 below:

<Formula 1>

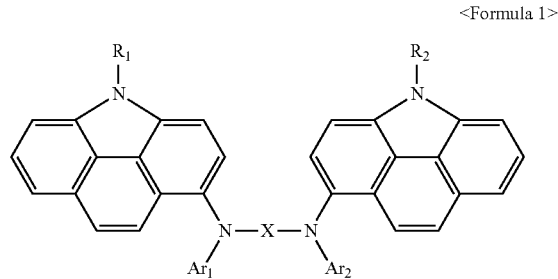

In Formula 1:

X may be a substituted or unsubstituted $C_6$-$C_{60}$ arylene group, a substituted or unsubstituted $C_2$-$C_{60}$ heteroarylene group, a substituted or unsubstituted $C_6$-$C_{60}$ condensed polycyclic group, or a divalent linking group that connects at least two of the arylene group, and the heteroarylene group, and the condensed polycyclic group;

$R_1$ and $R_2$ may be each independently a substituted or unsubstituted $C_1$-$C_{60}$ alkyl group, a substituted or unsubstituted $C_3$-$C_{30}$ cycloalkyl group, a substituted or unsubstituted $C_6$-$C_{60}$ aryl group, a substituted or unsubstituted $C_2$-$C_{60}$ heteroaryl group, or a substituted or unsubstituted $C_6$-$C_{60}$ condensed polycyclic group; and $Ar_1$ and $Ar_2$ may be each independently a substituted or unsubstituted $C_6$-$C_{60}$ aryl group, a substituted or unsubstituted $C_2$-$C_{60}$ heteroaryl group, or a substituted or unsubstituted $C_6$-$C_{60}$ condensed polycyclic group.

A blue light-emitting material having a diphenylanthracene structure in a center thereof and an aryl group substituted at a terminal thereof, and an OLED including the blue light-emitting material have been considered. However, emission efficiency and brightness may not be sufficient. An OLED including a substituted pyrene compound has also been considered. However, implementing a deep blue color may be difficult, possibly due to low color purity of the blue. Accordingly, implementation of a natural, full color OLED may be desirable.

In addition, a carbazole derivative has been considered as a material to form an HIL and/or an HTL of an OLED. However, such an OLED may have high driving voltage, low efficiency, and short lifespan. An OLED having low driving voltage, high efficiency, and long lifespan have been considered by using various types of materials to form an HIL or an HTL that uses the carbazole derivative.

According to an embodiment, an OLED may include an arylamine compound represented by Formula 1 in an HIL or an HTL in fluorescent and phosphorescent devices of all colors including red, green, blue, and white. The material may exhibit excellent light-emitting ability and hole-transporting ability. For example, the compound may be suitable as a material for emitting green, blue, and/or white colors of the fluorescent devices.

Substituents of the compound of Formula 1 used herein will now be described in detail.

According to an embodiment, $R_1$ and $R_2$ in Formula 1 may be each independently a substituted or unsubstituted $C_6$-$C_{60}$ aryl group or a substituted or unsubstituted $C_2$-$C_{60}$ heteroaryl group.

According to an embodiment, $Ar_1$ and $Ar_2$ in Formula 1 may be each independently a substituted or unsubstituted $C_6$-$C_{60}$ aryl group or a substituted or unsubstituted $C_2$-$C_{60}$ heteroaryl group.

According to an embodiment, $R_1$ and $R_2$ in Formula 1 may be each independently a substituted or unsubstituted $C_1$-$C_{20}$ alkyl group or a group represented by one of Formulae 2a to 2d below:

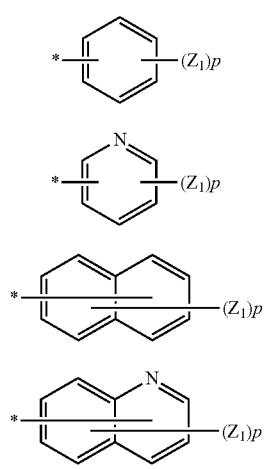

In Formulae 2a to 2d:

$Z_1$ may be a hydrogen, a deuterium, a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted $C_6$-$C_{20}$ condensed polycyclic group, a halogen atom, a cyano group, a nitro group, a hydroxyl group, a carboxyl group, or $Si(Q_3)(Q_4)(Q_5)$, in which $Q_3$ to $Q_5$ may be each independently a hydrogen, a $C_1$-$C_{10}$ alkyl group, a $C_6$-$C_{20}$ aryl group, or a $C_2$-$C_{20}$ heteroaryl group. Each $Z_1$ may be identical to or different from each other when numbers of $Z_1$s are two or greater.

p may be an integer of 1 to 7; and * indicates a binding site.

According to an embodiment, X in Formula 1 may be a group represented by one of Formulae 3a to 3l below:

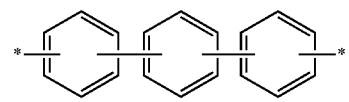

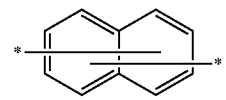

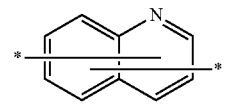

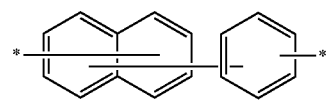

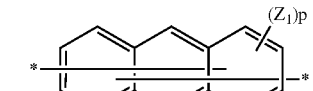

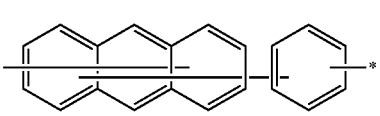

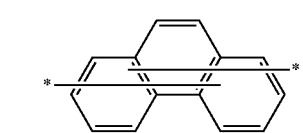

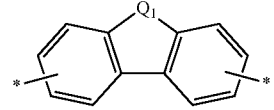

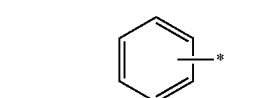

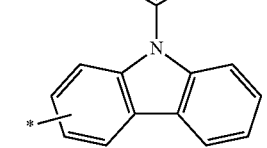

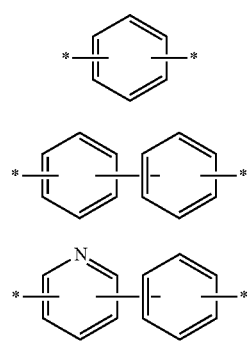

In Formulae 3a to 3l, $Q_1$ may be $CR_{11}R_{12}$—, —S—, —$NR_{21}$—, —$SiR_{31}R_{32}$—, or —O—;

$R_{11}$, $R_{12}$, $R_{21}$, $R_{31}$, $R_{32}$, and $Z_1$ may be each independently a hydrogen, a deuterium, a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted $C_6$-$C_{20}$ condensed polycyclic group, a halogen atom, a cyano group, a nitro group, a hydroxyl group, or a carboxyl group. Each $Z_1$ may be identical to or different from each other when numbers of $Z_1$s are two or greater.

p may be an integer of 1 to 4; and * indicates a binding site.

According to an embodiment, $Ar_1$ and $Ar_2$ in Formula 1 may be each independently a group represented by one of Formulae 4a to 4c below:

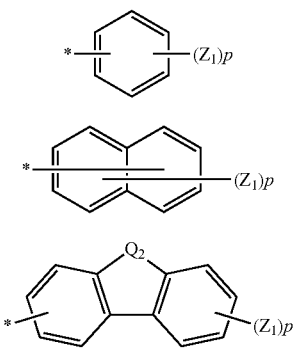

In Formulae 4a to 4c, $Q_2$ may be —$CR_{11}R_{12}$— or —O—;

$R_{11}$, $R_{12}$, and $Z_1$ may be each independently a hydrogen, a deuterium, a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted $C_6$-$C_{20}$ condensed polycyclic group, a halogen atom, a cyano group, a nitro group, a hydroxyl group, or a carboxyl group. Each $Z_1$ may be identical to or different from each other when numbers of $Z_1$s are two or greater;

p may be an integer of 1 to 7; and * indicates a binding site

Hereinafter, definition of a representative substituent used herein will now be described in detail (In this regard, numbers of carbon limiting a substituent are not limited, and thus the substituent characteristics are not limited. Definition of a substituent not described in the present specification may be defined in accordance with the general definition.)

The unsubstituted $C_1$-$C_{60}$ alkyl group used herein may be linear or branched. Non-limiting examples of the unsubstituted $C_1$-$C_{60}$ alkyl group are a methyl group, an ethyl group, a propyl group, an iso-butyl group, a sec-butyl group, a pentyl group, an iso-amyl group, a hexyl group, a heptyl group, an octyl group, a nonanyl group, and a dodecyl group. When substituted, at least one hydrogen of the unsubstituted $C_1$-$C_{60}$ alkyl group may be substituted with a deuterium, a halogen atom, a hydroxyl group, a nitro group, a cyano group, an amino group, an aminido group, a hydrazine group, a hydrazone group, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxy group, a $C_2$-$C_{10}$ alkenyl group, a $C_2$-$C_{10}$ alkynyl group, a $C_6$-$C_{16}$ aryl group, or a $C_2$-$C_{16}$ heteroaryl group.

The unsubstituted $C_2$-$C_{60}$ alkenyl group indicates an unsubstituted alkyl group having at least one carbon-carbon double bond in the center or at a terminal thereof. Examples of the unsubstituted $C_2$-$C_{60}$ alkenyl are an ethenyl group, a propenyl group, and a butenyl group. When substituted, at least one hydrogen of the unsubstituted $C_2$-$C_{60}$ alkenyl group may be substituted with the same substituent as used in the substituted alkyl group described above.

The unsubstituted $C_2$-$C_{60}$ alkynyl group indicates an unsubstituted alkyl group having at least one carbon-carbon triple bond in the center or at a terminal of thereof. Examples of the unsubstituted $C_2$-$C_{60}$ alkynyl group are acetylene, propyne, phenylacetylene, naphthylacetylene, isopropylacetylene, t-butylacetylene, and diphenylacetylene. When substituted, at least one hydrogen of the unsubstituted $C_2$-$C_{60}$ alkynyl group may be substituted with the same substituent as used in the substituted alkyl group described above.

The unsubstituted $C_3$-$C_{60}$ cycloalkyl group indicates an alkyl group in the form of $C_3$-$C_{60}$ rings. When substituted, at least one hydrogen of the unsubstituted $C_3$-$C_{60}$ cycloalkyl group may be substituted with the same substituent as used in the $C_1$-$C_{60}$ alkyl group described above.

The unsubstituted $C_1$-$C_{60}$ alkoxy group has a structure of —OA (wherein, A is an unsubstituted $C_1$-$C_{60}$ alkyl group as described above). Non-limiting examples of the unsubstituted $C_1$-$C_{60}$ alkoxy group are a methoxy group, an ethoxy group, a propoxy group, an isopropyloxy group, a butoxy group, and a pentoxy group. When substituted, at least one hydrogen atom of the unsubstituted $C_1$-$C_{60}$ alkoxy group may be substituted with the same substituent as used in the substituted alkyl group described above.

The unsubstituted $C_6$-$C_{60}$ aryl group indicates a carbocyclic aromatic system including at least one ring. When the unsubstituted $C_6$-$C_{60}$ aryl group has two or more of rings, the rings may be fused or linked to each other by a single bond. The term 'aryl' refers to an aromatic system, such as phenyl, napthyl, and anthracenyl. When substituted, at least one hydrogen of the unsubstituted $C_6$-$C_{60}$ aryl group may be substituted with the same substituent as used in the $C_1$-$C_{60}$ alkyl group described above.

Examples of the substituted or unsubstituted $C_6$-$C_{60}$ aryl group are a phenyl group, a $C_1$-$C_{10}$ alkylphenyl group (e.g., an ethylphenyl group), a biphenyl group, a $C_1$-$C_{10}$ alkylbiphenyl group, a $C_1$-$C_{10}$ alkoxybiphenyl group, an o-, m-, and p-toryl group, an o-, m-, and p-cumenyl group, a mesityl group, a phenoxyphenyl group, an ($\alpha,\alpha$-dimethylbenzene) phenyl group, an (N,N'-dimethyl)aminophenyl group, an (N,N'-diphenyl)aminophenyl group, a pentalenyl group, an indenyl group, a naphthyl group, a $C_1$-$C_{10}$ alkylnaphthyl group (e.g., a methylnaphthyl group), a $C_1$-$C_{10}$ alkoxynaphthyl group (e.g., a methoxynaphthyl group), an anthracenyl group, an azulenyl group, an acenaphthylenyl group, a phenalenyl group, a fluorenyl group, an anthraquinolyl group, a methylanthryl group, a phenanthryl group, a triphenylene group, a pyrenyl group, a chrycenyl group, an ethyl-chrysenyl group, a picenyl group, a perylenyl group, a pentaphenyl group, a pentacenyl group, a tetraphenylenyl group, a hexaphenyl group, a hexacenyl group, a rubicenyl group, a coroneryl group, a trinaphthylenyl group, a heptaphenyl group, a heptacenyl group, a pyranthrenyl group, and an ovalenyl group.

The unsubstituted $C_2$-$C_{60}$ heteroaryl group used herein may include one, two, three, or four hetero atoms selected from N, O, P, or S. When the unsubstituted $C_2$-$C_{60}$ heteroaryl group has two or more of rings, the rings may be fused or linked to each other by a single bond. Examples of the unsubstituted $C_2$-$C_{60}$ heteroaryl group are a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazol group, an indolyl group, a quinolinyl group, an isoquinolinyl group, and a dibenzothiophene group. When substituted, at least one hydrogen of the unsubstituted $C_2$-$C_{60}$ heteroaryl group may be substituted with the same substituent as used in the unsubstituted $C_1$-$C_{60}$ alkyl group described above.

The unsubstituted $C_6$-$C_{60}$ aryloxy group is a group represented by —$OA_1$, wherein $A_1$ is a $C_6$-$C_{60}$ aryl group. An example of the unsubstituted $C_6$-$C_{60}$ aryloxy group is a phenoxy group. When substituted, at least one hydrogen atom of the unsubstituted $C_6$-$C_{60}$ aryloxy group may be substituted with the same substituent as used in the unsubstituted $C_1$-$C_{60}$ alkyl group described above.

The unsubstituted $C_6$-$C_{60}$ arylthio group is a group represented by —$SA_1$, wherein $A_1$ is a $C_6$-$C_{60}$ aryl group. Examples of the unsubstituted $C_6$-$C_{60}$ arylthio group are a benzenethio group and a naphthylthio group. When substituted, at least one hydrogen of the unsubstituted $C_6$-$C_{60}$ arylthio group may be substituted with the same substituent as used in the unsubstituted $C_1$-$C_{60}$ alkyl group described above.

The unsubstituted $C_6$-$C_{60}$ condensed polycyclic group used herein refers to a substituent including at least two rings, wherein at least one aromatic ring and/or at least one non-aromatic ring are fused to each other, or refers to a substituent having an unsaturated group in a ring that may not form a conjugated structure. Thus, the unsubstituted $C_6$-$C_{60}$ condensed polycyclic group is distinct from an aryl group or a heteroaryl group in terms of being non-aromatic.

According to an embodiment, the compound represented by Formula 1 may be one of the compounds below.

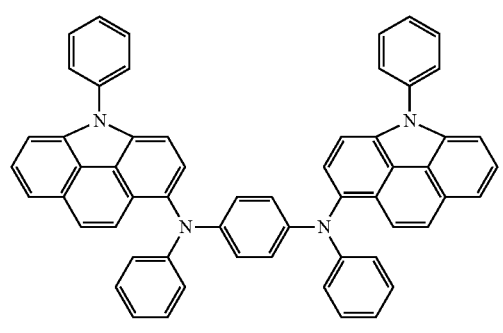

1

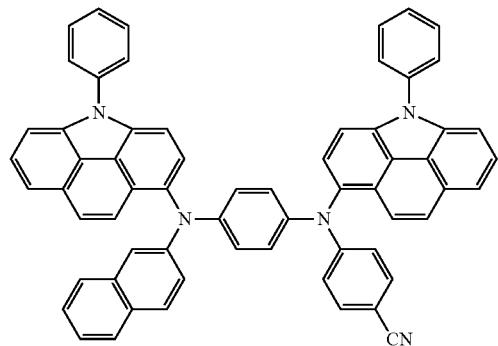

2

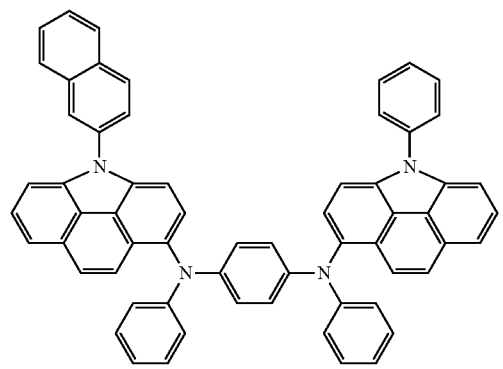

3

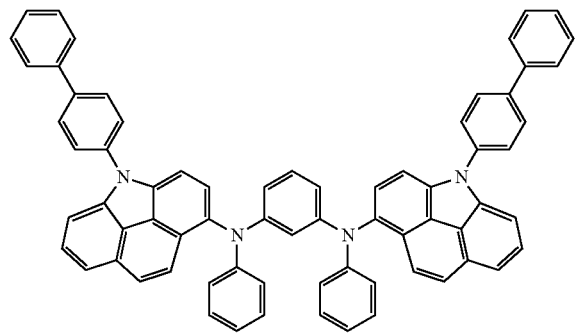

4

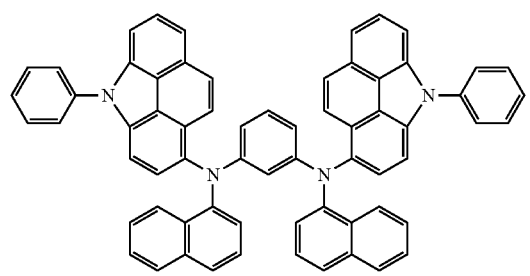

5

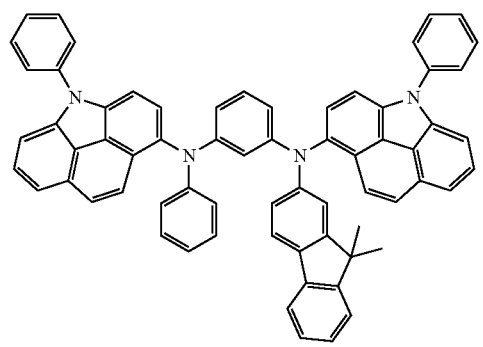

6

-continued
7
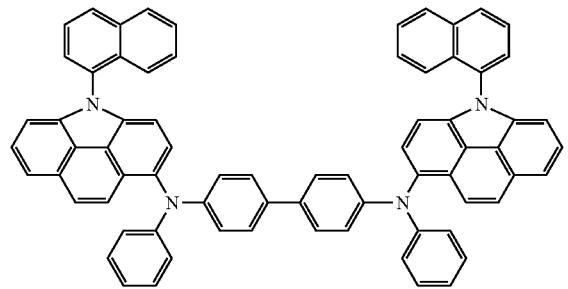
8
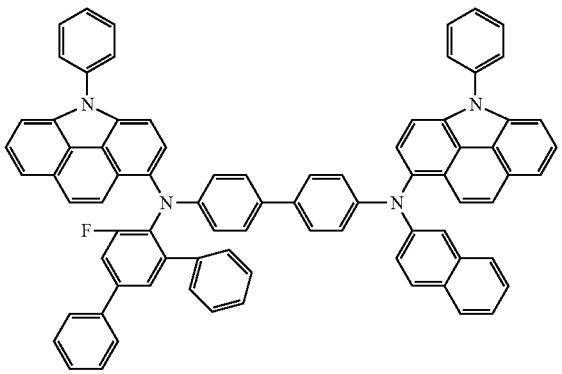
9
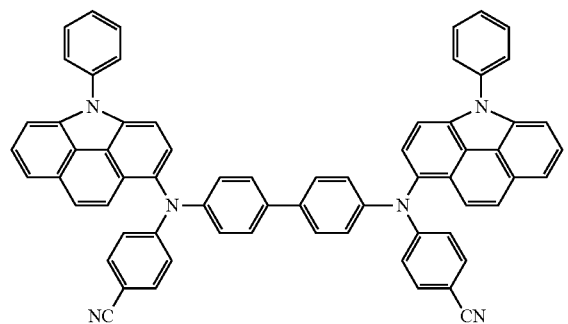
10
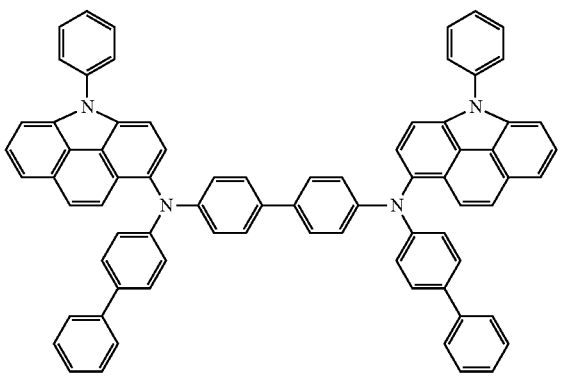
11
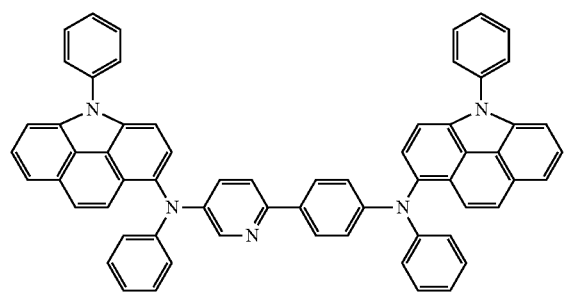
12
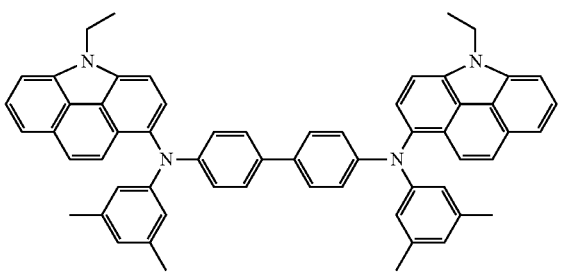
13
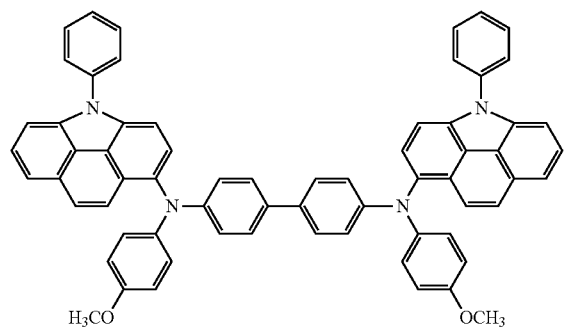
14
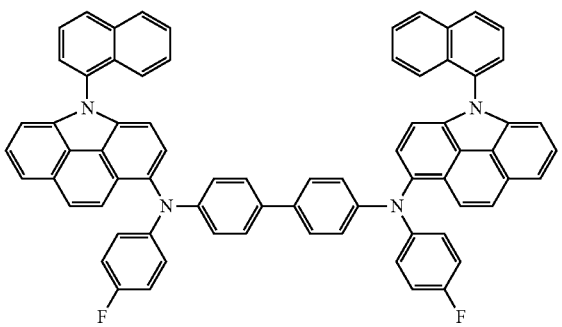

15
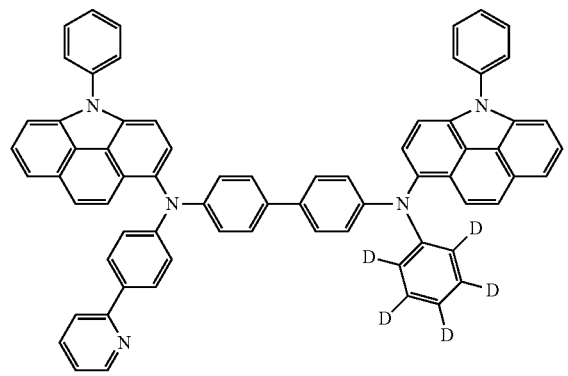
16
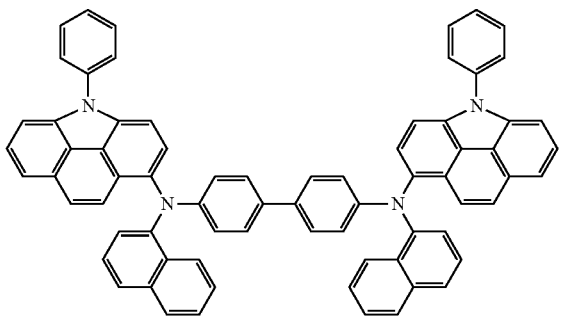
17
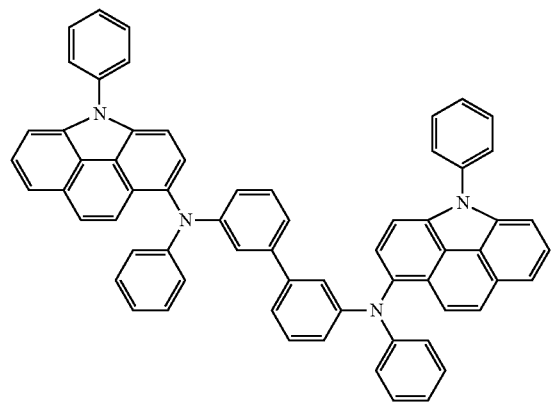
18
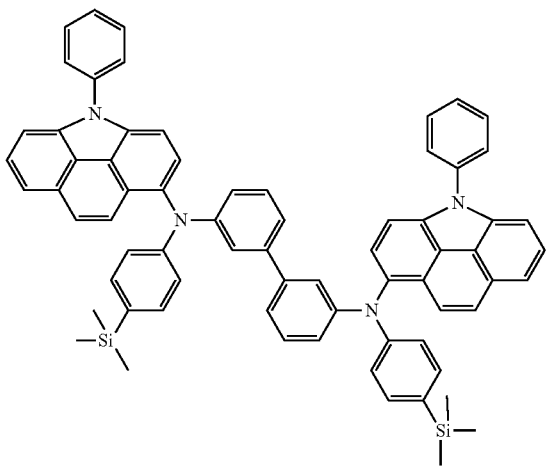
19
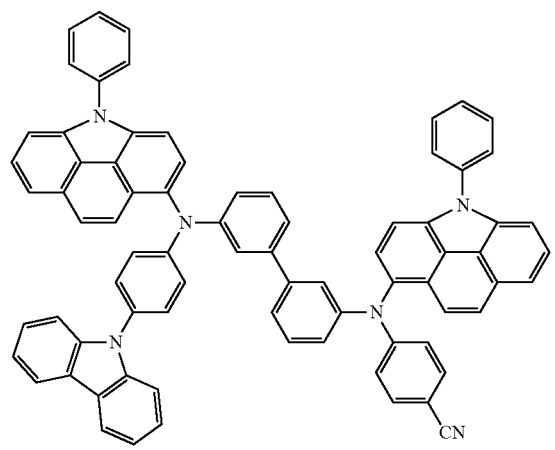
20
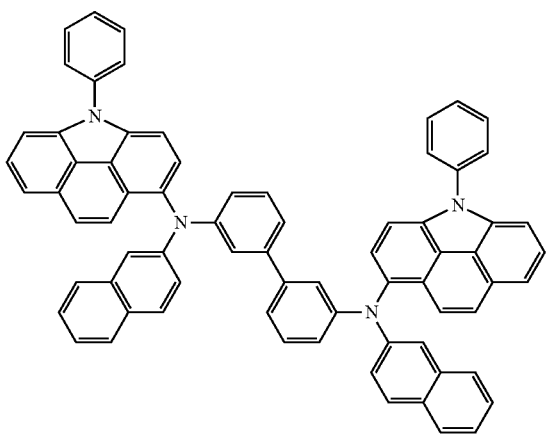

-continued
21
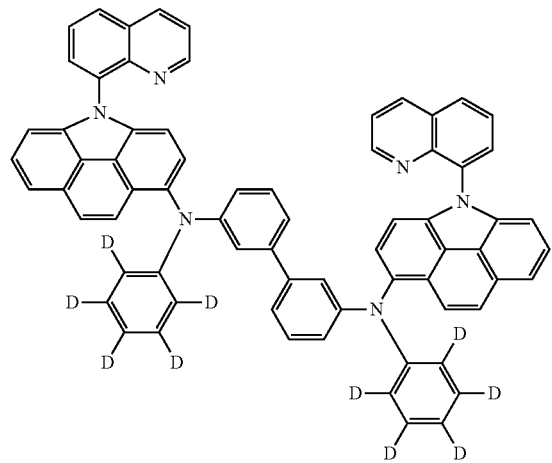
22
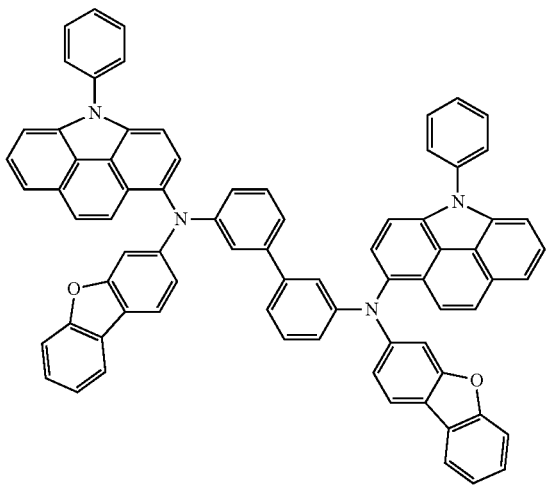
23
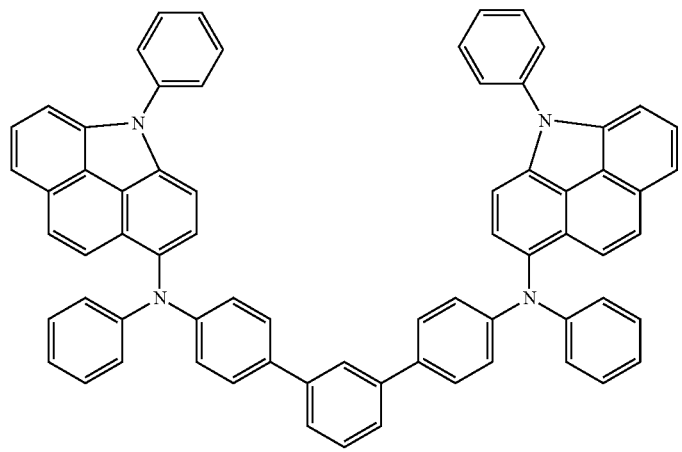
24
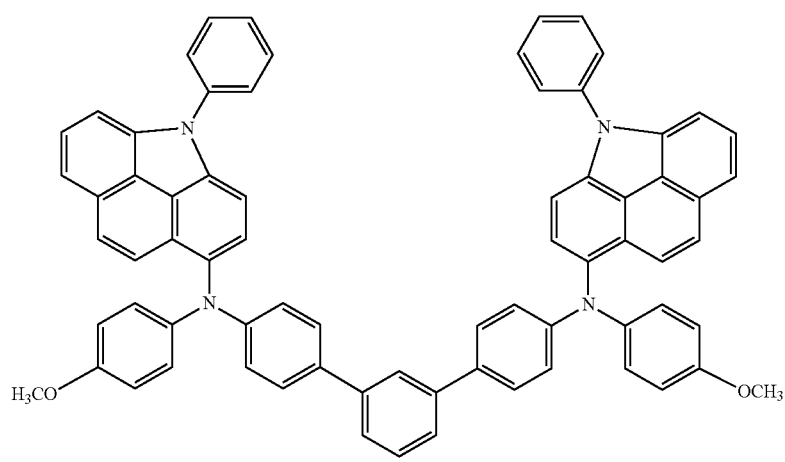

25
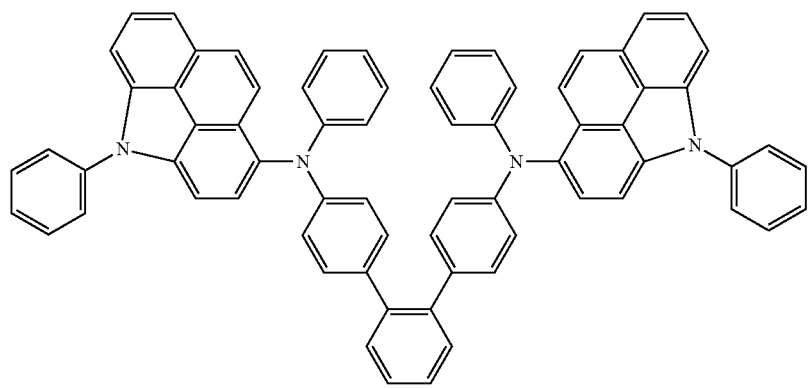
26
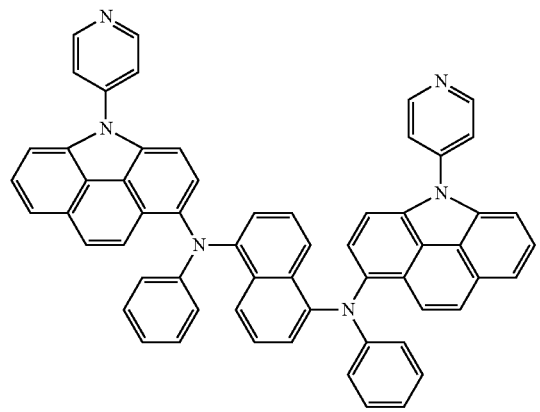
27
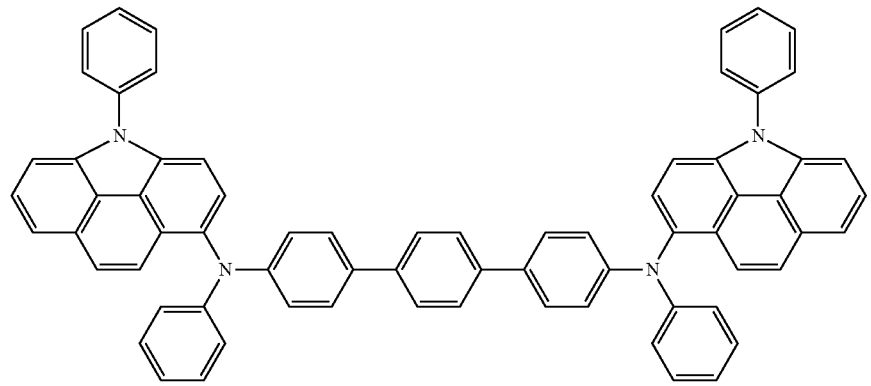
28
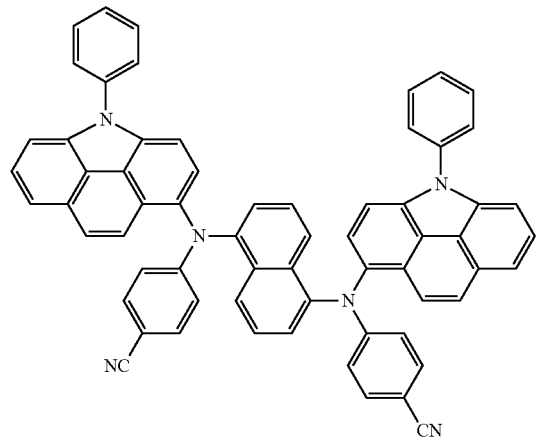
29
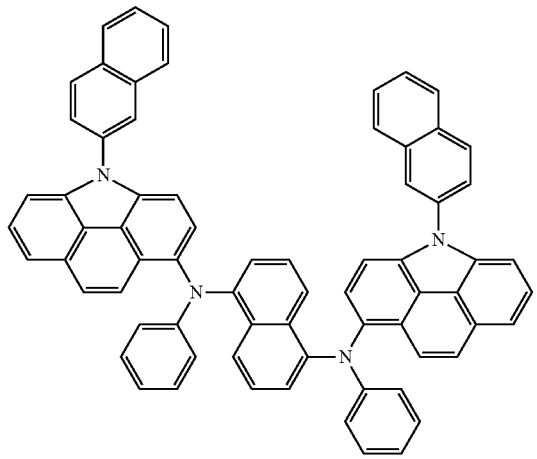

-continued
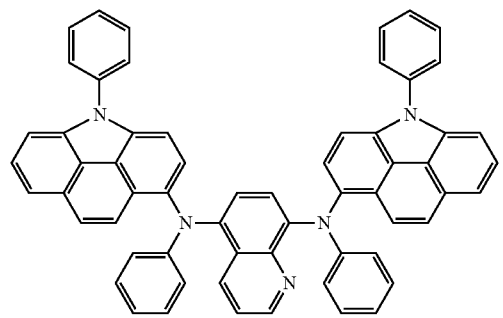
30
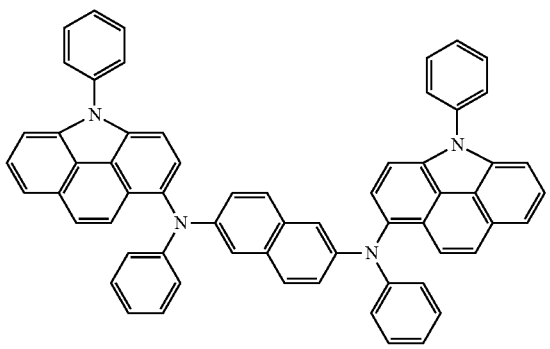
31
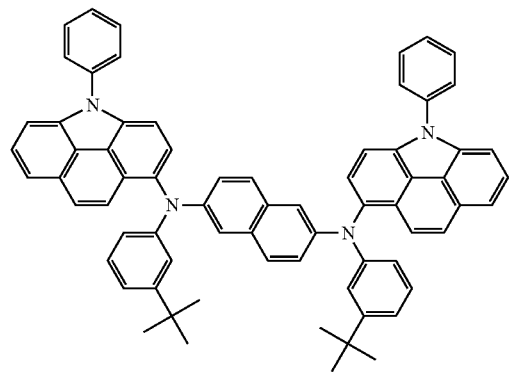
32
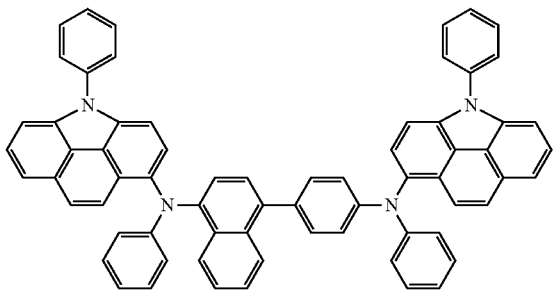
33
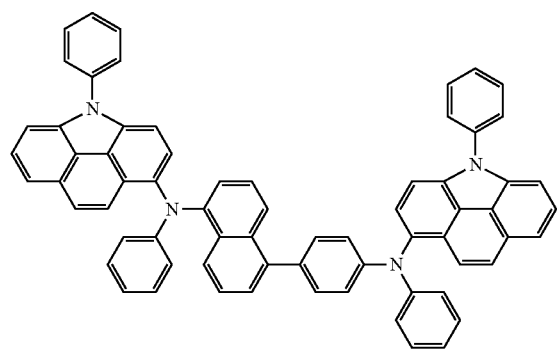
34
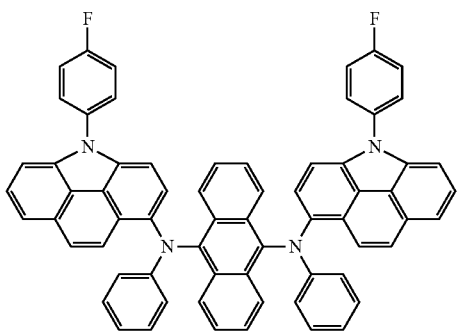
35
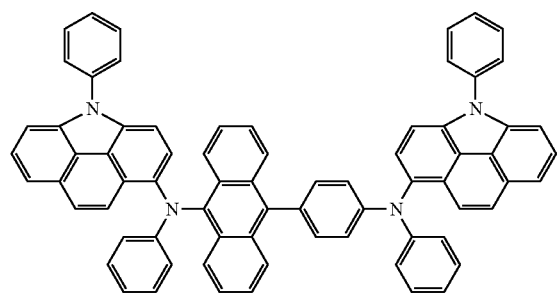
36
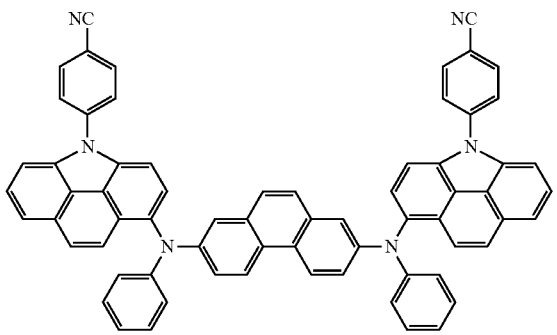
37

-continued
38
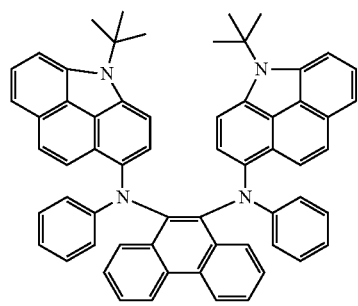
39
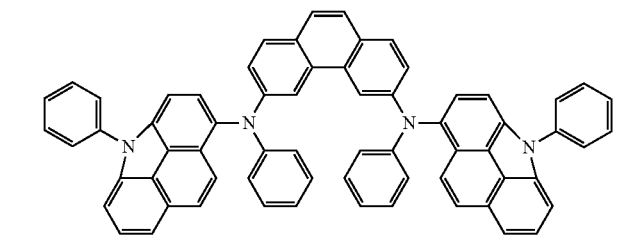
40
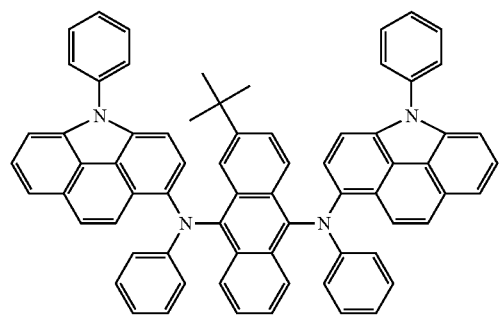
41
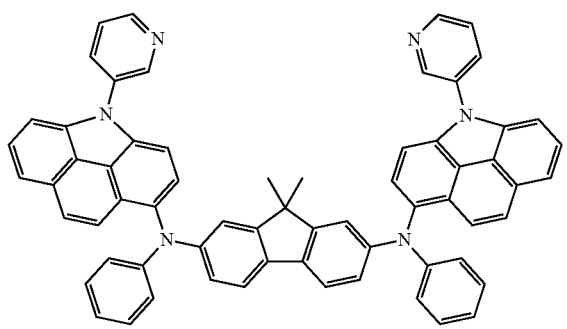
42
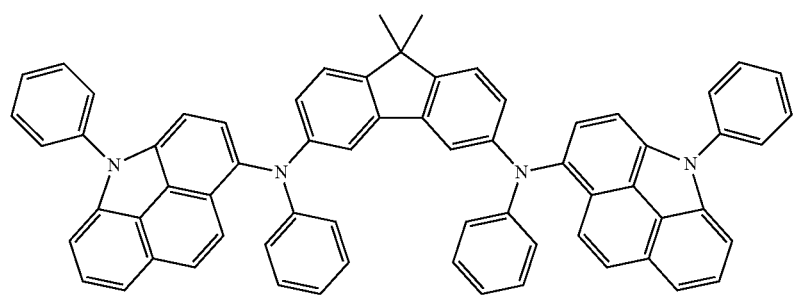
43
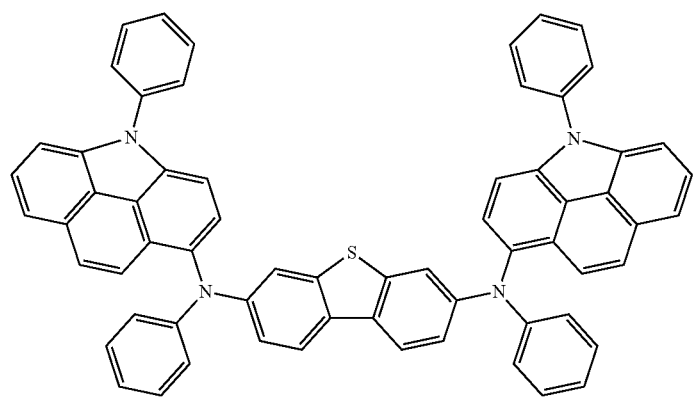
44
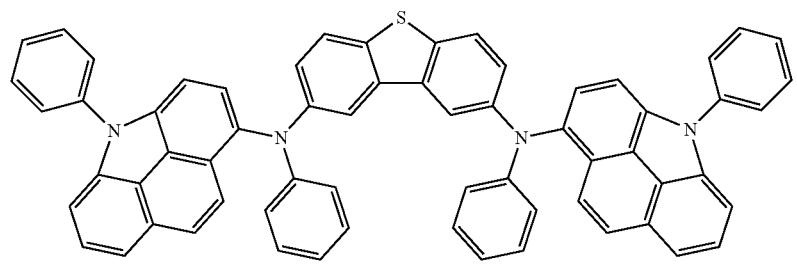

45
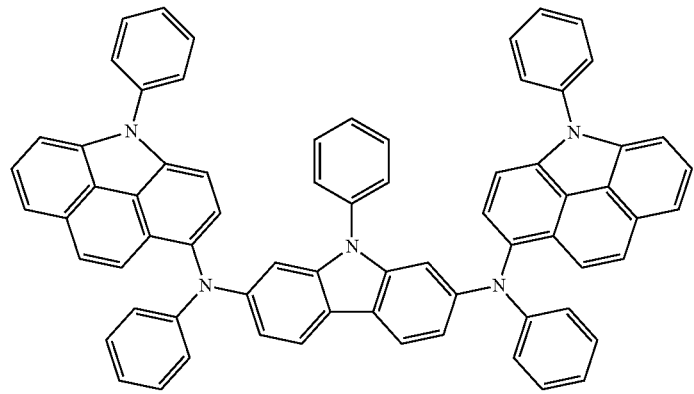
46
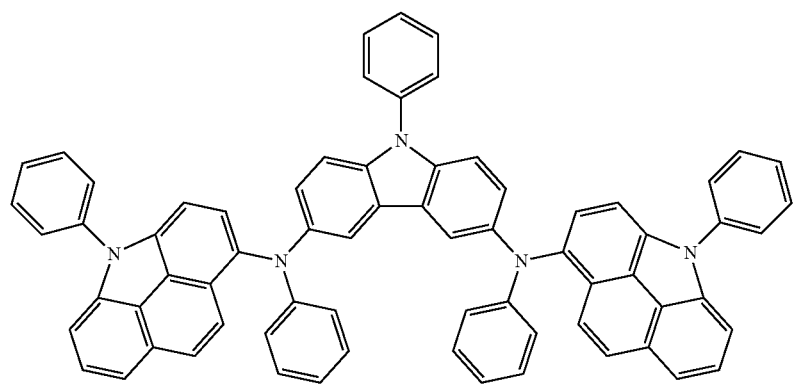
47
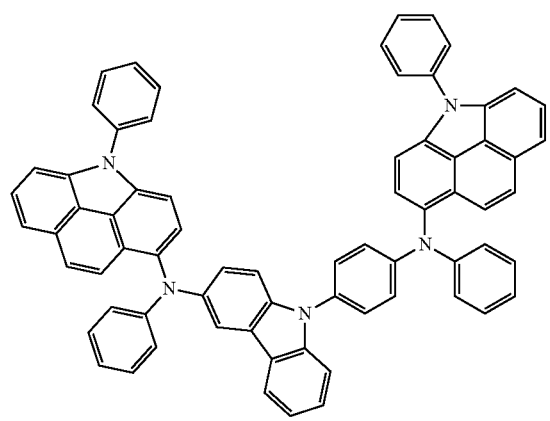
48
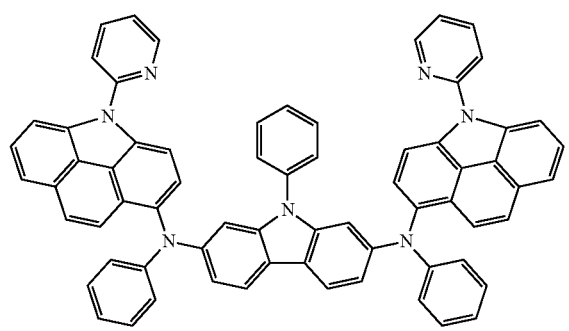
49
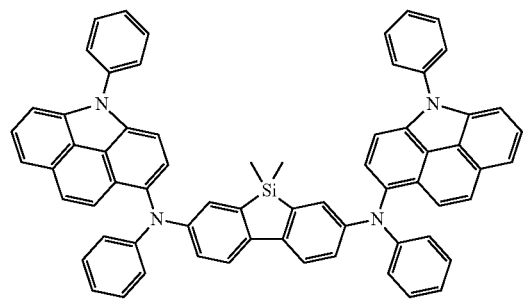
50
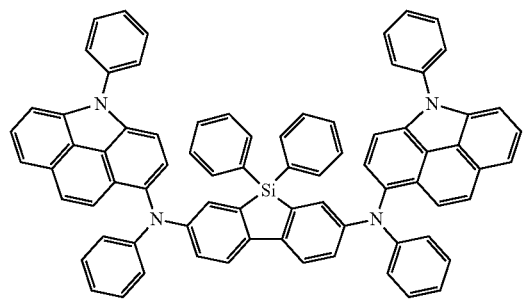

-continued
51
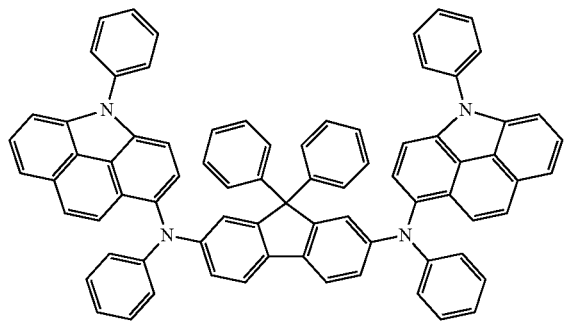
52
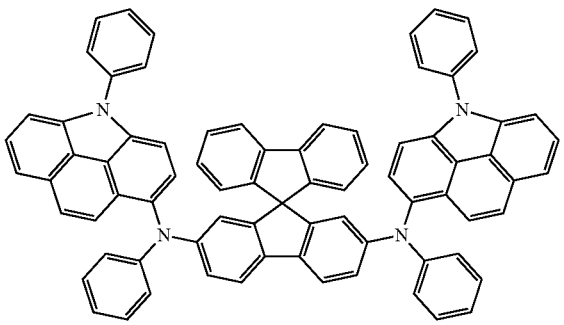
53
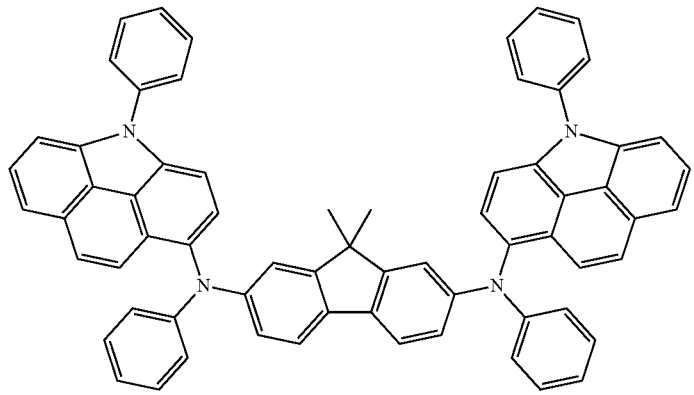
54
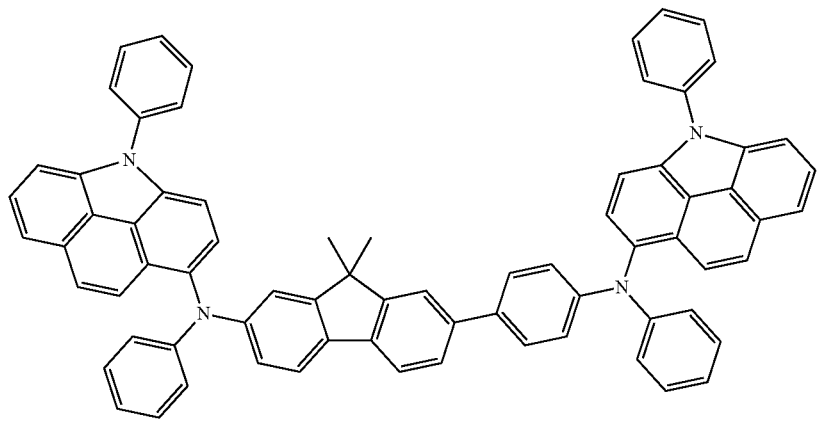
55
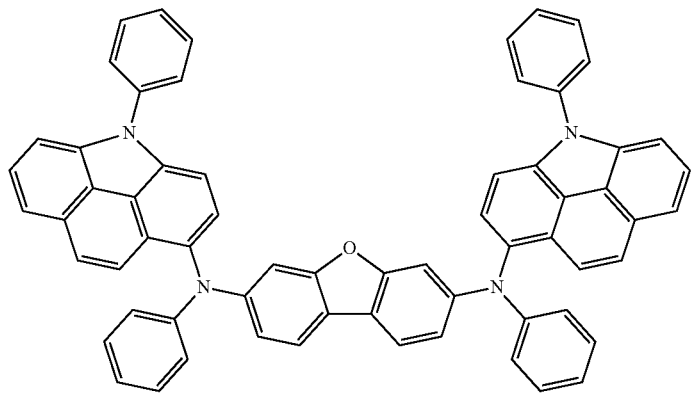

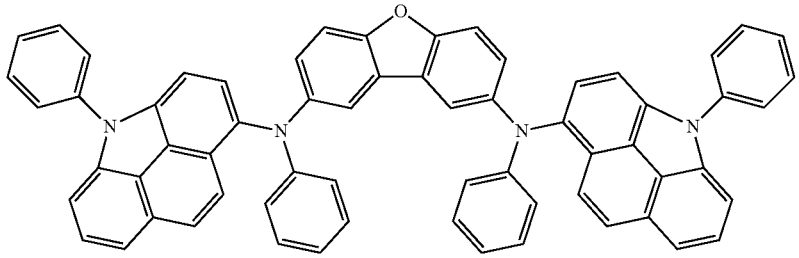

56

According to an embodiment, an organic-light emitting diode (OLED) may include a first electrode; a second electrode; and an organic layer between the first electrode and the second electrode. The organic layer may include the heterocyclic compounds of Formula 1

The organic layer may include at least one layer selected from a hole injection layer (HIL), a hole transport layer (HTL), a functional layer having both hole injection and hole transport capabilities (hereinafter, referred to as a "H-functional layer"), a buffer layer, an electron blocking layer (EBL), an emission layer (EML), a hole blocking layer (HBL), an electron transport layer (ETL), an electron injection layer (EIL), and a functional layer having both electron injection and electron transport capabilities (hereinafter, referred to as an "E-functional layer").

For example, the organic layer may include an HTL, an HIL, an H-functional layer having both hole injection and hole transport capabilities, or an EML.

According to an embodiment, the organic layer may include an EML, and may further include an EIL, an ETL, an E-functional layer having both electron injection and electron transport capabilities, an HIL, an HTL, or an H-functional layer having both hole injection and hole transport capabilities. The EML may include an anthracene-based compound, an arylamine-based compound, or a styryl-based compound.

According to an embodiment, the organic layer may include an EML, and may further include an EIL, an ETL, an E-functional layer having both electron injection and electron transport capabilities, an HIL, an HTL, or an H-functional layer having both hole injection and hole transport capabilities. At least one layer of a red EML, a green EML, a blue EML, or a white EML of the EML may include a phosphorescent compound. The HIL, the HTL, or the H-functional layer having both hole injection and hole transport capabilities may include a charge-generating material. The charge-generating material may be a p-dopant. The p-dopant may include, e.g., a quinone derivative, a metal oxide, or a cyano group-containing compound.

According to an embodiment, the organic layer may include an ETL, and the ETL may include an electron-transporting organic compound and a metal complex. In an implementation, the metal complex may be a lithium (Li) complex.

The term "organic layer" used herein refers to a single- and/or multi-layer disposed between the first electrode and the second electrode of the OLED.

FIG. 1 illustrates a schematic view of a structure of the OLED according to an embodiment. Hereinafter, a structure and a manufacturing method of the OLED according to an embodiment will be described in detail with reference to FIG. 1.

A substrate (not illustrated), which may be a suitable substrate that is in used in an OLED, may include, e.g., a glass substrate or a transparent plastic substrate with excellent mechanical strength, thermal stability, transparency, surface smoothness, ease of handling, and water resistance.

The first electrode may be formed by depositing or sputtering a first electrode-forming material on the substrate. When the first electrode is an anode, a material having a high work function may be used as the first electrode-forming material to facilitate hole injection. The first electrode may be a reflective electrode or a transmission electrode. Examples of the first electrode-forming material are indium tin oxide (ITO), indium zinc oxide (IZO), tin oxide ($SnO_2$), and zinc oxide (ZnO). When magnesium (Mg), aluminum (Al), aluminum-lithium (Al—Li), calcium (Ca), magnesium-indium (Mg—In), or magnesium-silver (Mg—Ag) are used, the first electrode may be formed as a reflective electrode.

The first electrode may have a single-layer structure or a multi-layer structure including at least two layers. For example, the first electrode may have a three-layered structure of ITO/Ag/ITO, but is not limited thereto.

The organic layer may be disposed on the first electrode.

The organic layer may include an HIL, an HTL, a buffer layer (not illustrated), an EML, an ETL, or an EIL.

An HIL may be formed on the first electrode by using various methods, such as vacuum deposition, spin coating, casting, and Langmuir-Blodgett (LB) deposition.

When the HIL is formed by using vacuum deposition, the vacuum deposition conditions may vary according to the compound that is used to form the HIL, and the desired structure and thermal properties of the HIL to be formed. For example, the vacuum deposition may be performed at a temperature in a range of about 100° C. to about 500° C., a pressure in a range of about $10^{-8}$ torr to about $10^{-3}$ torr, and a deposition rate in a range of about 0.01 Å/sec to about 100 Å/sec. However, the deposition conditions are not limited thereto.

When the HIL is formed by using spin coating, the coating conditions may vary according to the compound that is used to form the HIL, and the desired structure and thermal properties of the HIL to be formed. For example, the coating rate may be in a range of about 2,000 to about 5,000 rpm, and a temperature at which heat treatment is performed to remove a solvent after coating may be in a range of about 80° C. to about 200° C. However, the coating conditions are not limited thereto.

The compound of Formula 1 above or a material that is suitable to form an HIL may be used. Examples thereof may include N,N'-diphenyl-N,N'-bis-[4-(phenyl-m-tolyl-amino)-phenyl]-biphenyl-4,4'-diamine, (DNTPD), a phthalocyanine compound such as copper phthalocyanine, 4,4',4"-tris(3-methylphenylphenylamino) triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), and polyaniline/poly(4-styrenesulfonate) (PANI/PSS), but are not limited thereto.

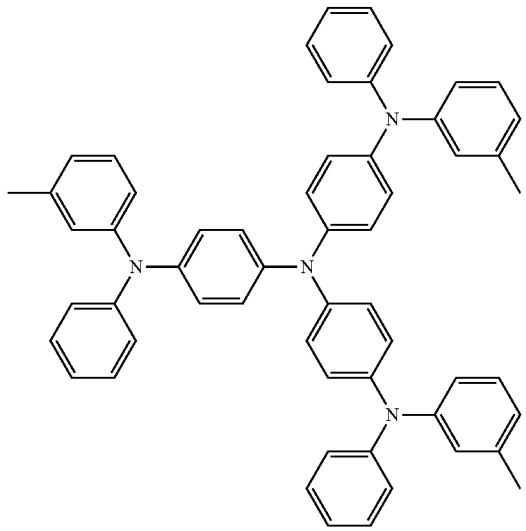

m-MTDATA

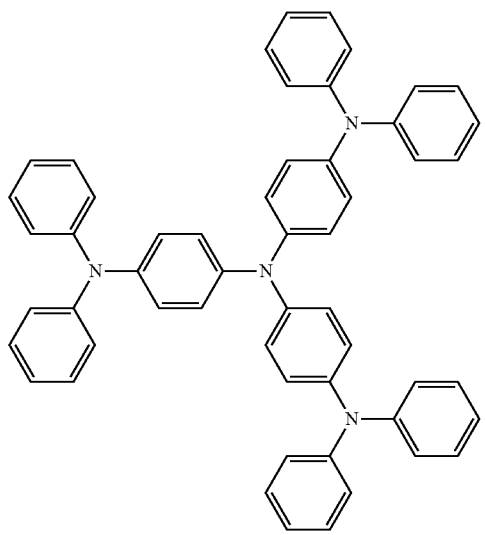

TDATA

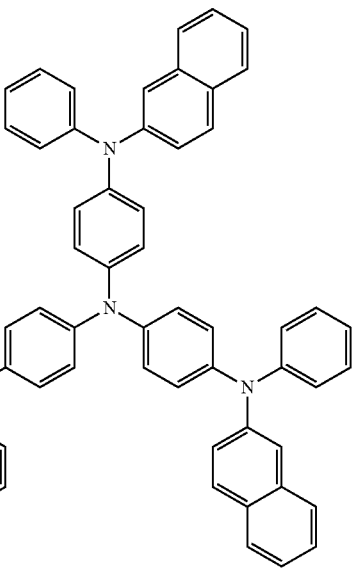

2-TNATA

A thickness of the HIL may be about 100 Å to about 10,000 Å, e.g., about 100 Å to about 1,000 Å. When the thickness of the HIL is within the above ranges, the HIL may have satisfactory hole injecting capabilities without a substantial increase in a driving voltage.

Then, an HTL may be formed on the HIL by using various methods, such as vacuum deposition, spin coating, casting, and LB deposition. When the HTL is formed by using vacuum deposition or spin coating, the deposition and coating conditions may be similar to those for the formation of the HIL, although the deposition and coating conditions may vary according to the compound that is used to form the HTL.

The compound of Formula 1 above, or a material that is suitable to form an HTL, may be used. Examples thereof may include a carbazole derivative such as N-phenylcarbazole and polyvinylcarbazole, N,N'-bis(3-methylphenyl)-N,N'-diphenyl-[1,1-biphenyl]-4,4'-diamine (TPD), 4,4',4"-tris(N-carbazolyl)triphenylamine) (TCTA), and N,N'-di(1-naphthyl)-N,N'-diphenylbenzidine (NPB), but are not limited thereto.

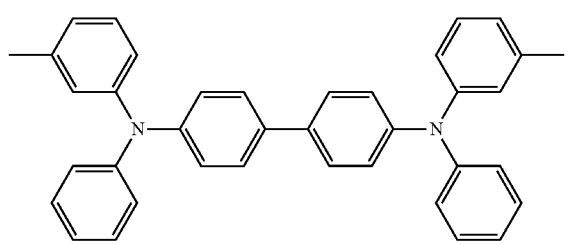

TPD

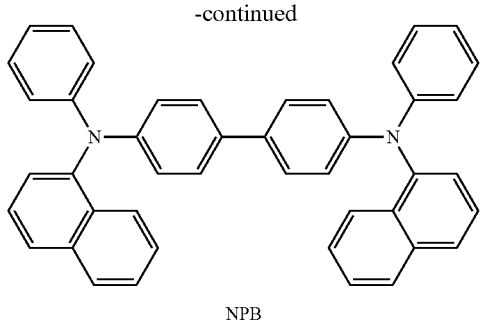

NPB

A thickness of the HTL may be about 50 Å to about 2,000 Å, e.g., about 100 Å to about 1,500 Å. When the thickness of the HTL is within the above ranges, the HTL may have satisfactory hole transporting capabilities without a substantial increase in a driving voltage.

The H-functional layer (having both hole injection and hole transport capabilities) may include at least one material selected from the above-described materials for the HIL and the HTL. A thickness of the H-functional layer may be about 50 Å to about 10,000 Å, e.g., about 100 Å to about 1,000 Å. When the thickness of the H-functional layer is within the above ranges, the H-functional layer may have satisfactory hole injecting and transporting capabilities without a substantial increase in a driving voltage.

In an implementation, at least one layer of the HIL, the HTL, and the H-functional layer may include at least one of compounds represented by Formulae 300 and 350 below:

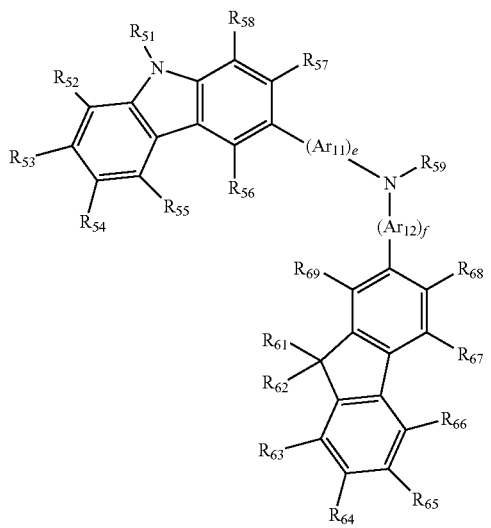

<Formula 300>

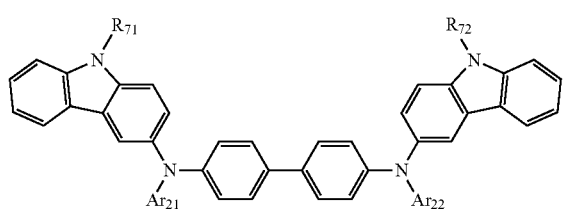

<Formula 350>

In Formulae 300 and 350, $Ar_{11}$, $Ar_{12}$, $Ar_{21}$, and $Ar_{22}$ may be each independently a substituted or unsubstituted $C_5$-$C_{60}$ arylene group.

In Formula 300, e and f may be each independently an integer of 0 to 5, for example, may be 0, 1, or 2. In some embodiments, e may be 1 and f may by 0, but are not limited thereto.

In Formulae 300 and 350, $R_{51}$ to $R_{58}$, $R_{61}$ to $R_{69}$, $R_{71}$, and $R_{72}$ may be each independently a hydrogen, a deuterium, a halogen atom, a hydroxyl group, a cyano group, a nitro group, an amino group, an aminido group, a hydrazine group, a hydrazone group, a carboxyl group or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, or a substituted or unsubstituted $C_5$-$C_{60}$ arylthio group. For example, $R_{51}$ to $R_{58}$, $R_{61}$ to $R_{69}$, $R_{71}$, and $R_{72}$ may be each independently a hydrogen; a deuterium; a halogen atom; a hydroxyl group; a cyano group; a nitro group; an amino group; an amidino group; a hydrazine group; a hydrazone group; a carboxyl group or a salt thereof; a sulfonic acid or a salt thereof; a phosphoric acid or a salt thereof; a $C_1$-$C_{10}$ alkyl group (e.g., a methyl group, an ethyl group, a propyl group, a butyl group, a pentyl group, and a hexyl group); a $C_1$-$C_{10}$ alkoxy group (e.g., a methoxy group, an ethoxy group, a propoxy group, a butoxy group, and a pentoxy group); a $C_1$-$C_{10}$ alkyl group and a $C_1$-$C_{10}$ alkoxy group, each substituted with at least one substituent selected from a deuterium, a halogen atom, a hydroxyl group, a cyano group, a nitro group, an amino group, an amidino group, a hydrazine group, a hydrazone group, a carboxyl group or a salt thereof, a sulfonic acid or a salt thereof, and a phosphoric acid or a salt thereof; a phenyl group; a naphthyl group; an anthryl group; a fluorenyl group; a pyrenyl group; and a phenyl group, a naphthyl group, an anthryl group, a fluorenyl group, and a pyrenyl group, each substituted with at least one substituent selected from a deuterium, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{10}$ alkyl group, and a $C_1$-$C_{10}$ alkoxy group, but are not limited thereto.

In Formula 300, $R_{59}$ may be a phenyl group; a naphthyl group; an anthryl group; a biphenyl group; a pyridyl group; and a phenyl group, a naphthyl group, an anthryl group, a biphenyl group, and a pyridyl group, each substituted with at least one substituent selected from a deuterium, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a substituted or unsubstituted $C_1$-$C_{20}$ alkyl group, and a substituted or unsubstituted $C_1$-$C_{20}$ alkoxy group.

According to another embodiment, the compound of Formula 300 may be a compound represented by Formula 300A below, but is not limited thereto:

<Formula 300A>
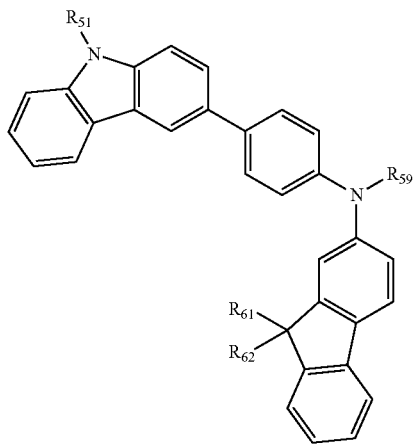
In Formula 300A, $R_{51}$, $R_{61}$, $R_{62}$, and $R_{59}$ may be as defined above.
For example, at least one layer of the HIL, HTL, and the H-functional layer may include at least one of Compounds 301 to 320, but is not limited thereto:
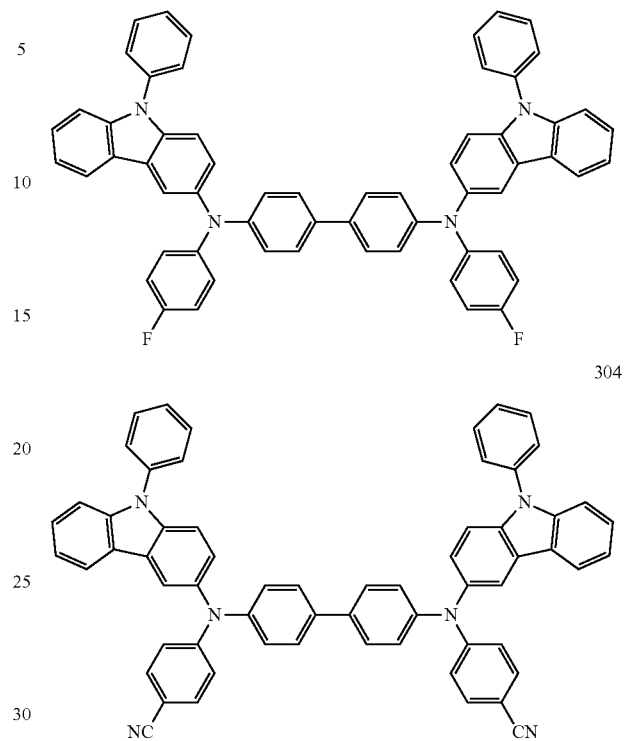
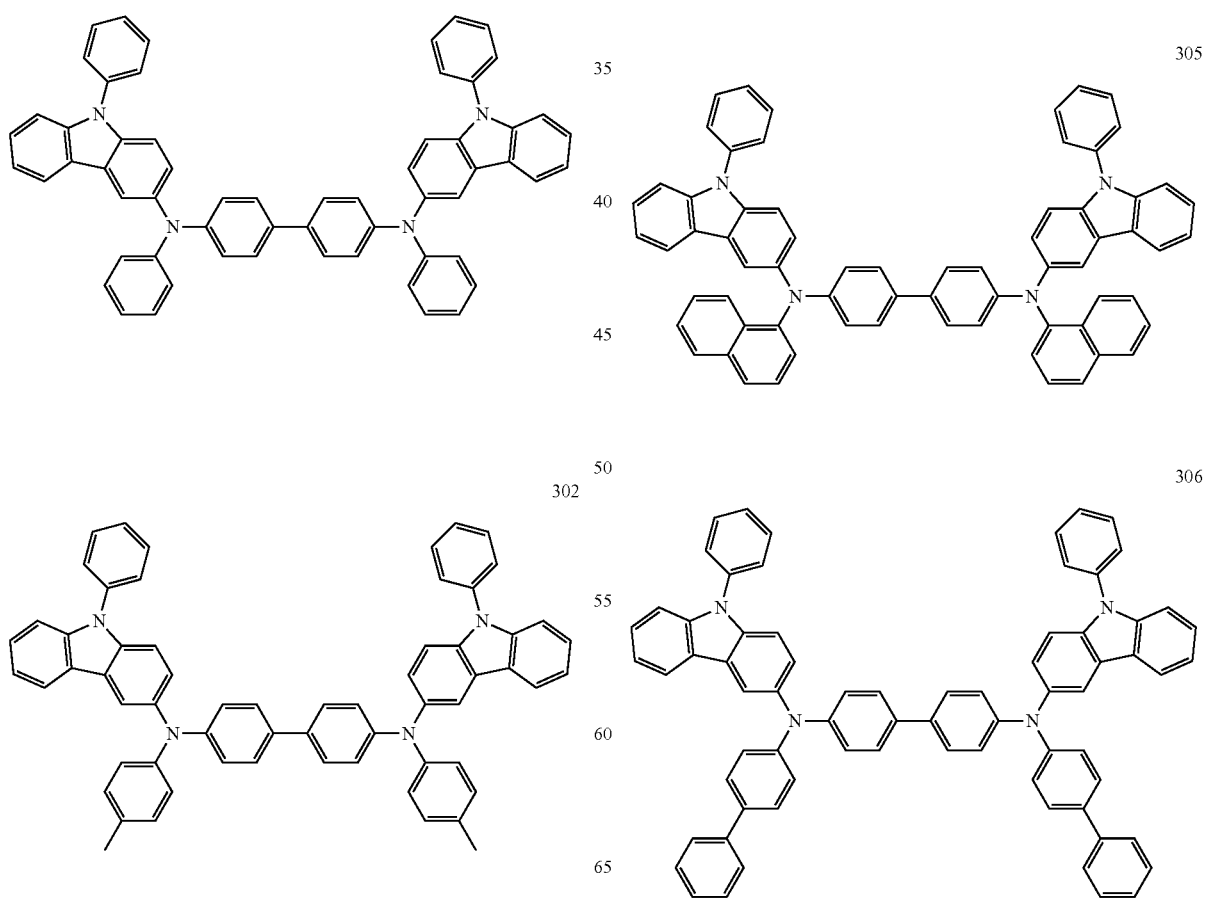

307
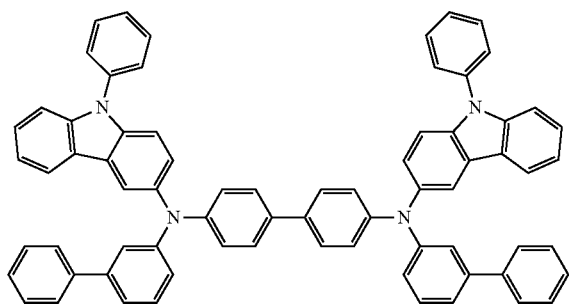
308
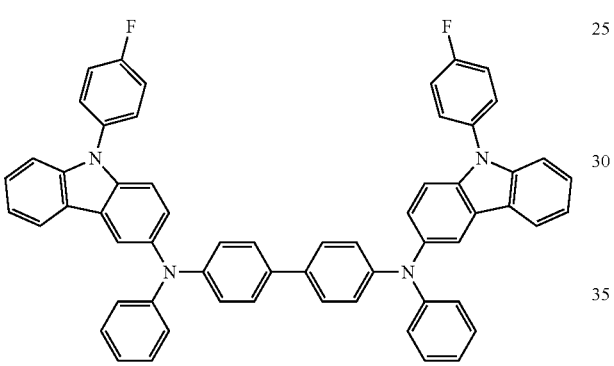
309
310
311
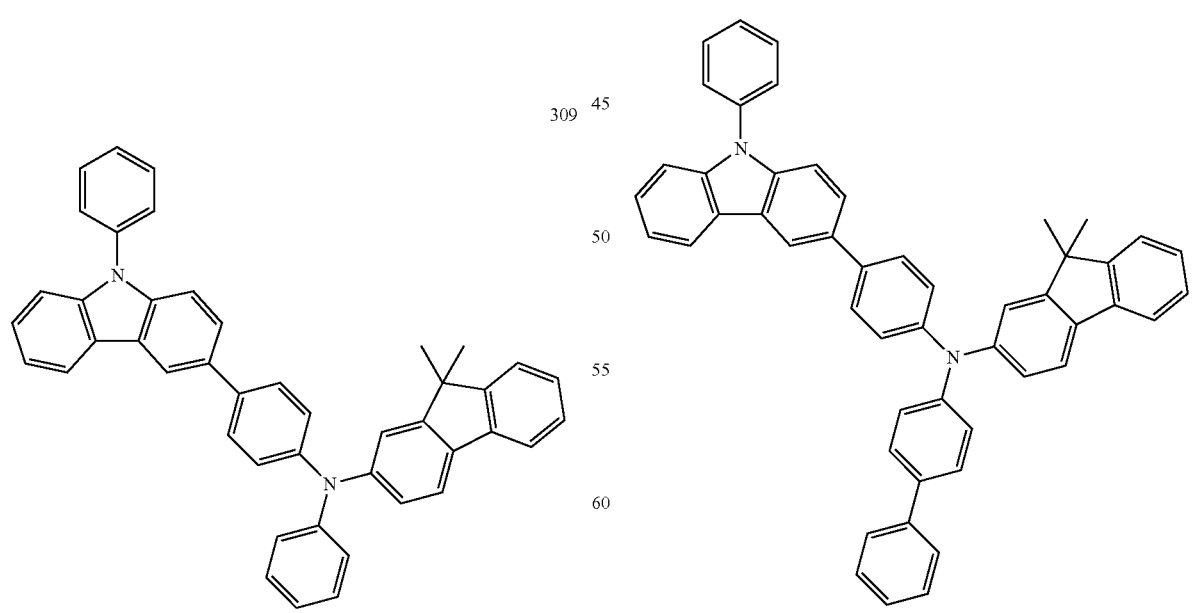

41
-continued
312
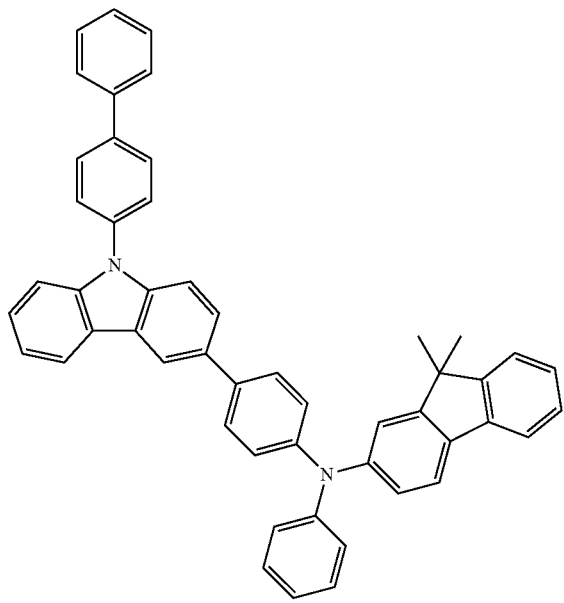
313
314
-continued
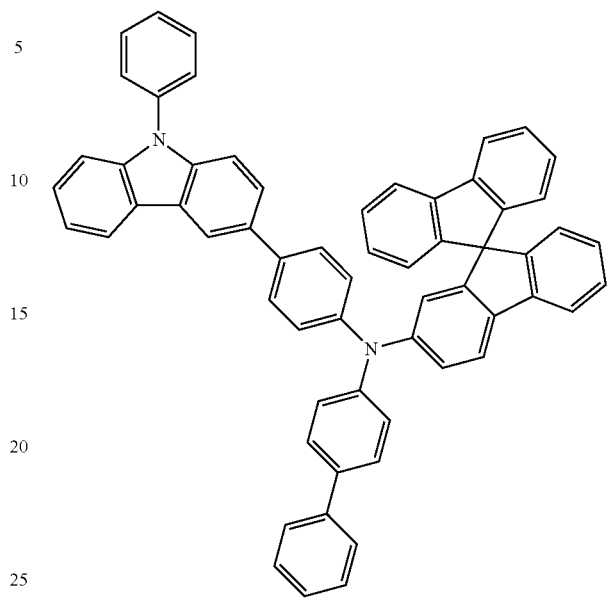
315
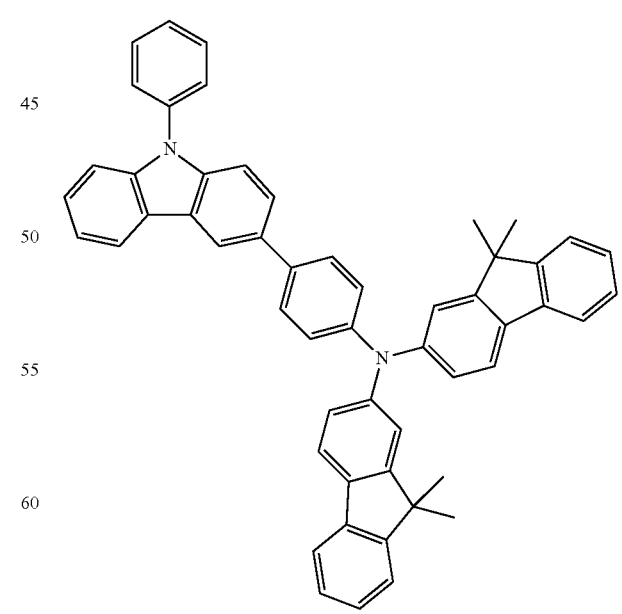

316

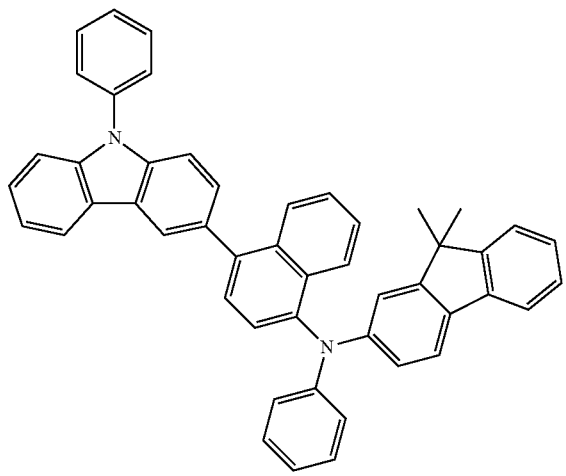

317

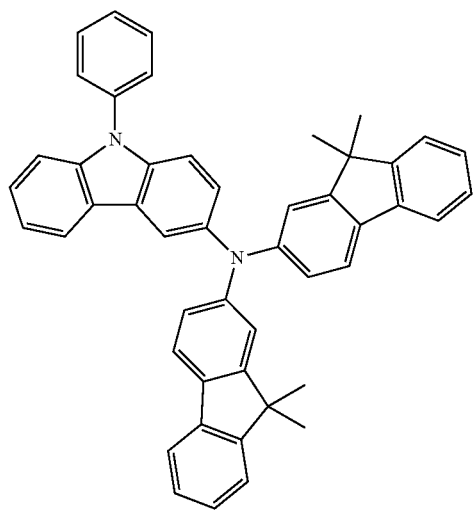

318

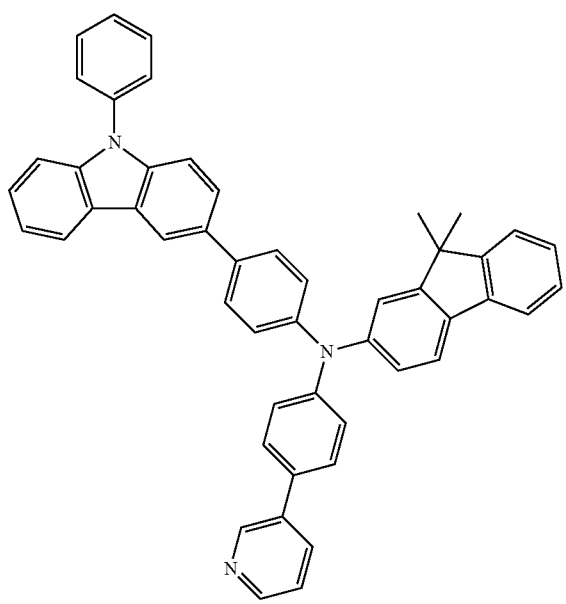

319

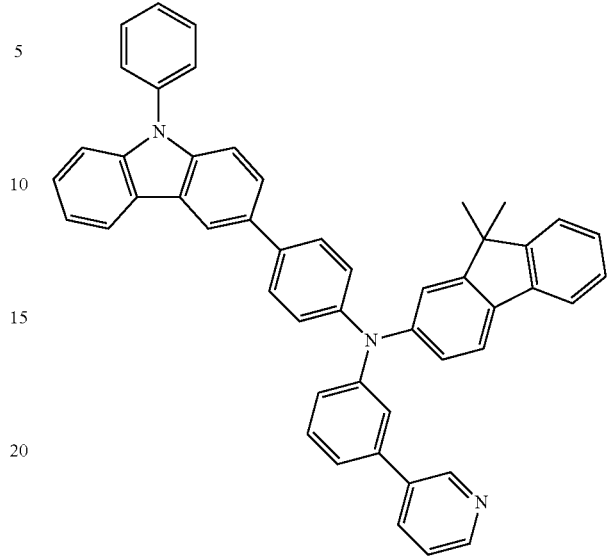

320

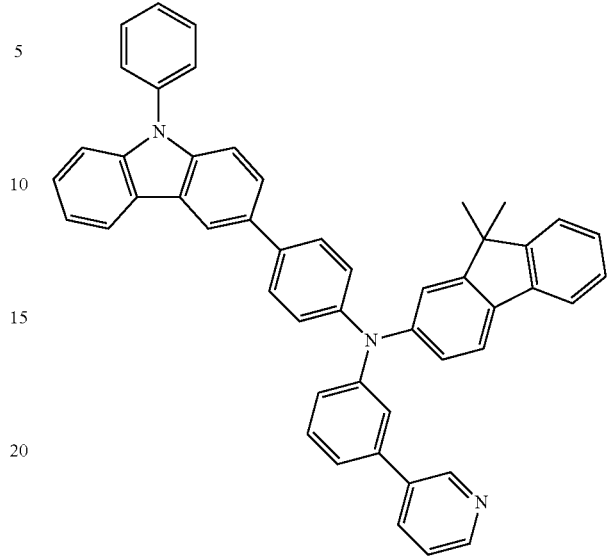

At least one layer of the HIL, HTL, and the H-functional layer may include a charge-generating material in addition to suitable hole-injecting materials, suitable hole-transporting materials, and/or suitable H-functional materials having both hole injection and hole transport capabilities, to improve conductivity of a film.

The charge-generating material may be, e.g., a p-dopant. The p-dopant may include, e.g., one of quinone derivatives, metal oxides, and cyano group-containing groups, but is not limited thereto. Non-limiting examples of the p-dopant may include quinone derivatives such as tetracyanoquinodimethane (TCNQ) and 2,3,5,6-tetrafluoro-tetracyano-1,4-benzoquinodimethane (F4-TCNQ); metal oxides such as a tungsten oxide and a molybdenym oxide; and cyano group-containing compound such as Compound 200 below, but are not limited thereto:

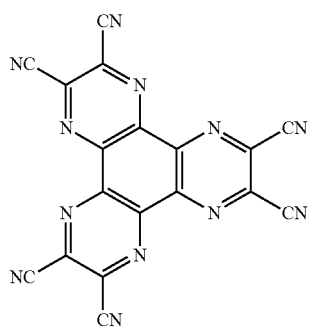

<Compound 200>

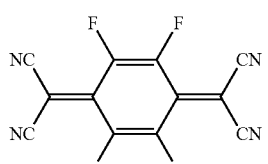

<F4-TCNQ>

When the HIL, the HTL, or the H-functional layer includes the charge-generating material, the charge-generating material may be homogeneously dispersed or heterogeneously distributed throughout the above-described layers.

A buffer layer may be disposed between at least one of the HIL, HTL, and the H-functional layer, and the EML. The buffer layer may help compensate for an optical resonance distance of light according to a wavelength of the light emitted from the EML, and thus may increase efficiency. The buffer layer may include a suitable hole injecting material or hole transporting material. In an implementation, the buffer layer may include the same material as one of the materials included in the HIL, the HTL, and the H-functional layer that underlie the buffer layer.

Then, an EML may be formed on the HIL, the H-functional layer, or the buffer layer by vacuum deposition, spin coating, casting, or LB deposition. When the EML is formed by using vacuum deposition or spin coating, the deposition and coating conditions may be similar to those for the formation of the HIL, although the conditions for deposition and coating may vary according to the compound that is used to form the EML.

The EML may be formed using the compound of Formula 1 above, or a variety of a suitable host and a suitable dopant. In regard to the dopant, the compound of Formula 1, a suitable fluorescent dopant or a suitable phosphorescent dopant may be used.

For example, the host may include Alq$_3$, 4,4'-N,N'-dicarbazole-biphenyl (CBP), poly(n-vinylcarbazole) (PVK), 9,10-di(naphthylene-2-yl)anthracene (ADN), TCTA, 1,3,5-tris(N-phenylbenzimidazole-2-yl)benzene (TPBI), 3-tert-butyl-9,10-di(naphth-2-yl) anthracene (TBADN), E3, distyrylarylene (DSA), dmCBP (see Formula below), or Compounds 501 to 509 below, but are not limited thereto:

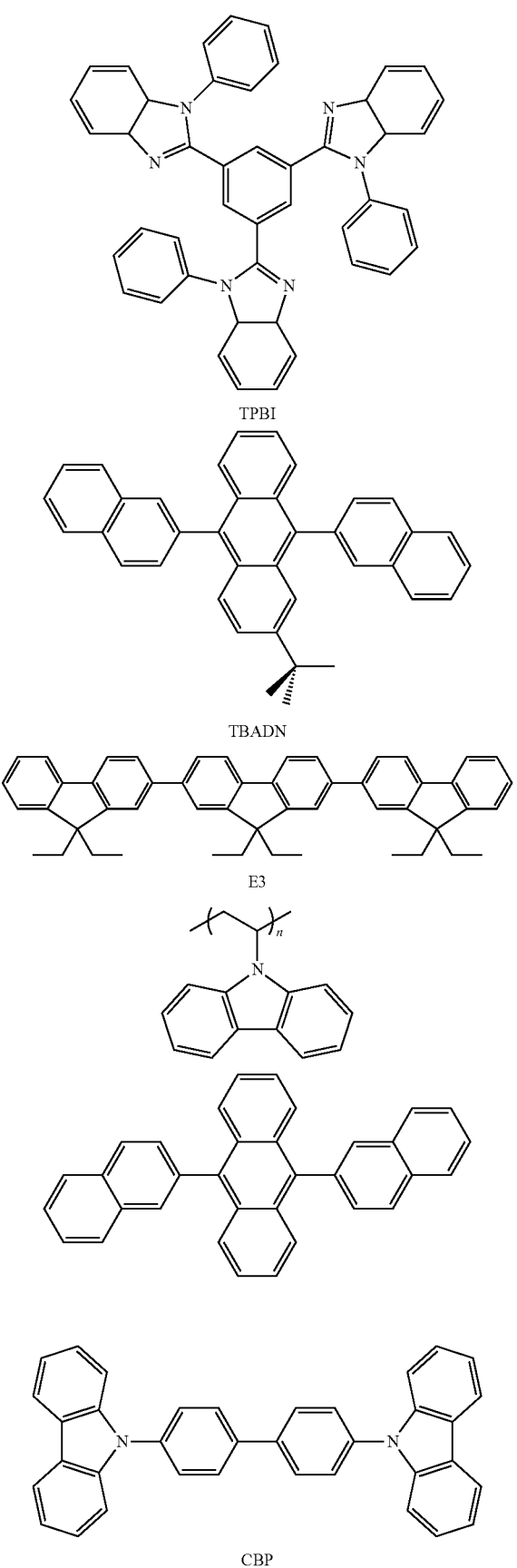

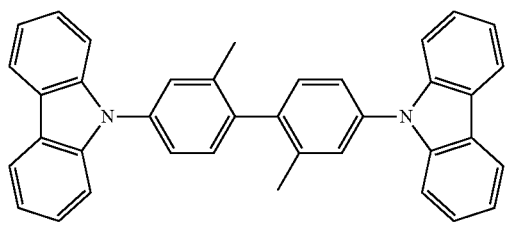
dmCBP
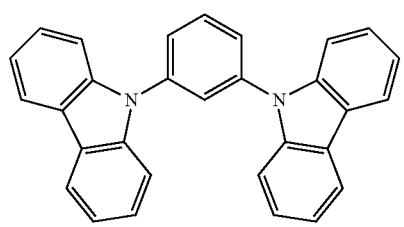
501
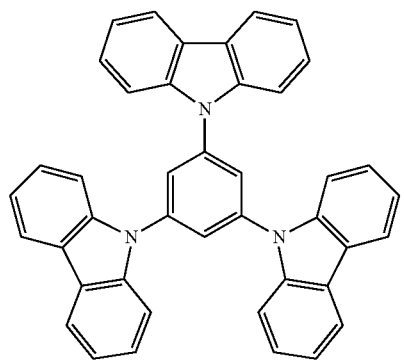
502
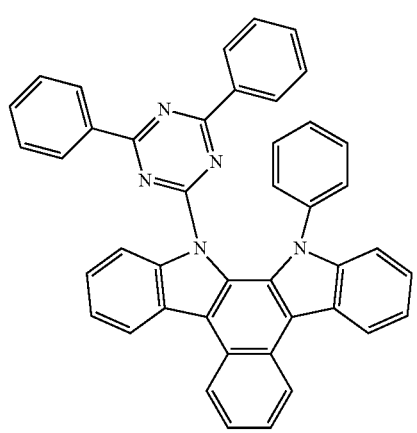
503
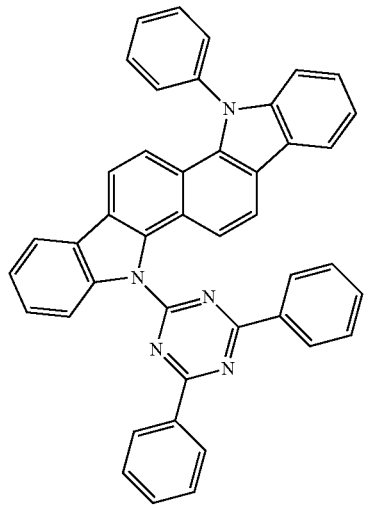
504
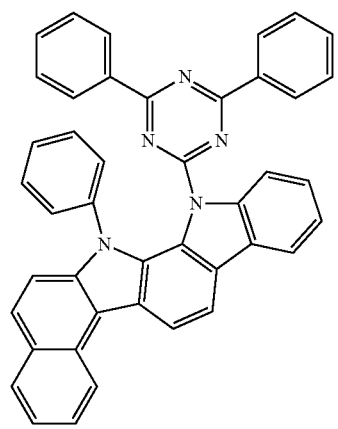
505
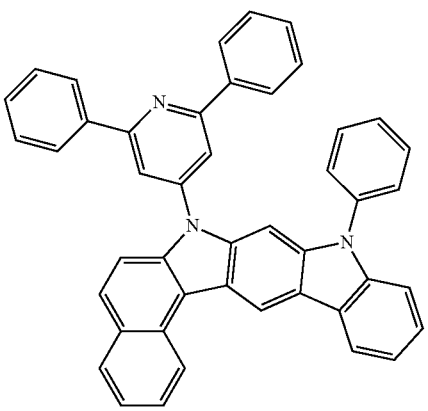
506

-continued

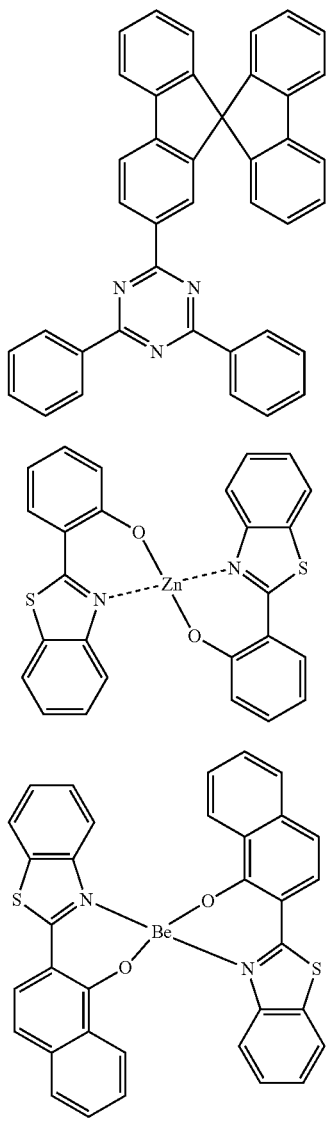

507

508

509

In an implementation, an anthracene-based compound represented by Formula 400 below may be used as the host:

<Formula 400>

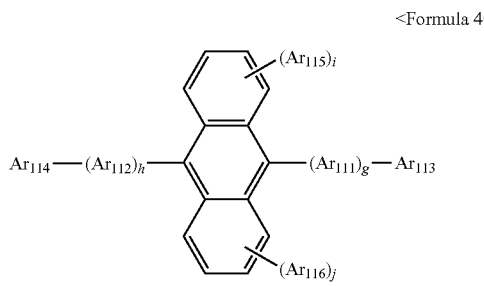

In Formula 400, $Ar_{111}$ and $Ar_{112}$ may be each independently a substituted or unsubstituted $C_5$-$C_{60}$ arylene group; $Ar_{113}$ to $Ar_{116}$ may be each independently a substituted or unsubstituted $C_1$-$C_{10}$ alkyl group, or a substituted or unsubstituted $C_5$-$C_{60}$ aryl group; and g, h, i, and j may be each independently an integer of 0 to 4.

In an implementation, in Formula 400, $Ar_{111}$ and $Ar_{112}$ may be each independently a phenylene group, a naphthylene group, a phenanthrenylene group, or a pyrenylene group; or a phenylene group, a naphthylene group, a phenanthrenylene group, a fluorenyl group, or a pyrenylene group, each substituted with at least one substituent selected from a phenyl group, a naphthyl group, and an anthryl group, but are not limited thereto.

In Formula 400, g, h, i and j may be each independently, 0, 1, or 2.

In Formula 400, $Ar_{113}$ to $Ar_{116}$ may be each independently a $C_1$-$C_{10}$ alkyl group substituted with at least one of a phenyl group, a naphthyl group, and an anthryl group; a phenyl group; a naphthyl group; an anthryl group; a pyrenyl group; a phenanthrenyl group; a fluorenyl group; a phenyl group, a naphthyl group, an anthryl group, a pyrenyl group, a phenanthrenyl group, and a fluorenyl group, each substituted with at least one substituent selected from a deuterium, a halogen atom, a hydroxyl group, a cyano group, a nitro group, an amino group, an amidino group, a hydrazine group, a hydrazone group, a carboxyl group or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and a fluorenyl group; and

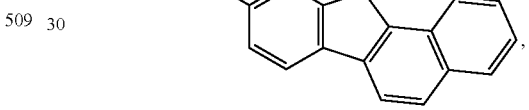

but are not limited thereto.

In an implementation, the anthracene-based compound of Formula 400 above may include one of compounds represented by Formulae below, but is not limited thereto:

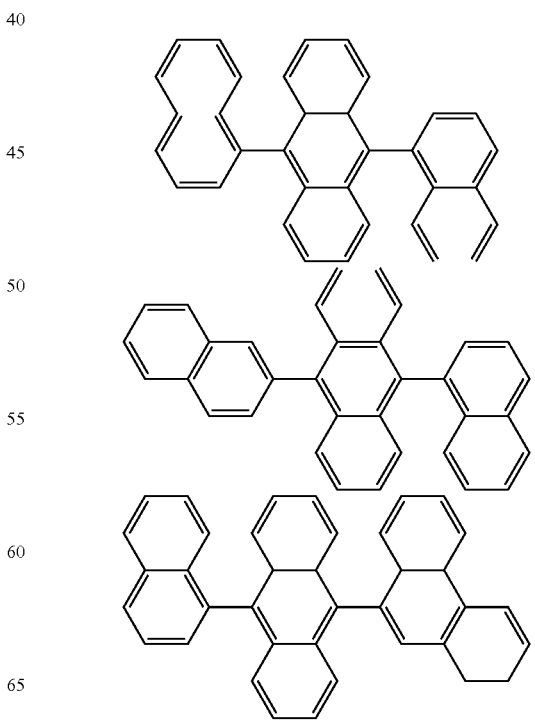

51
-continued
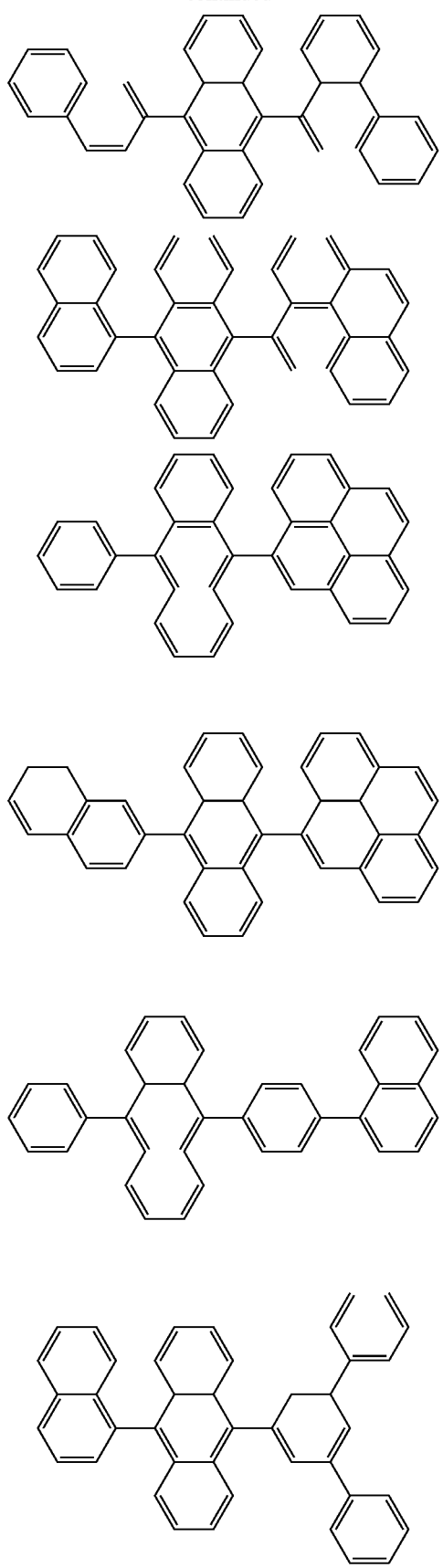
52
-continued
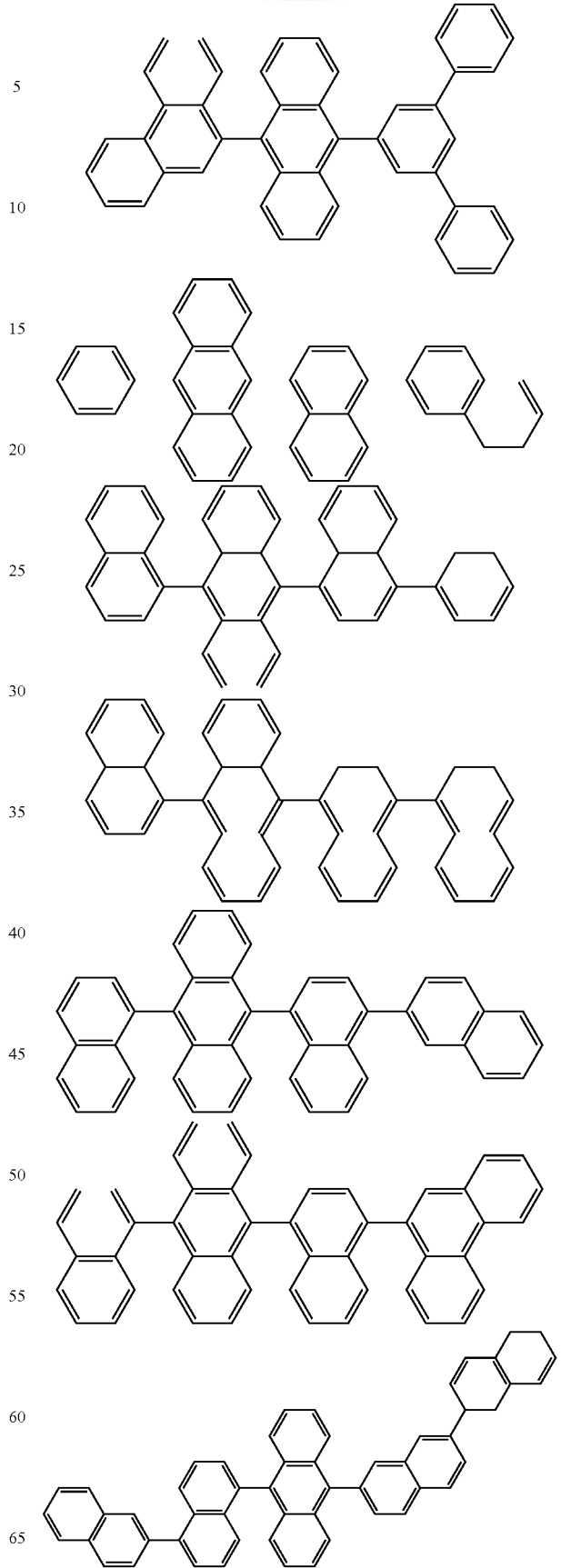

-continued
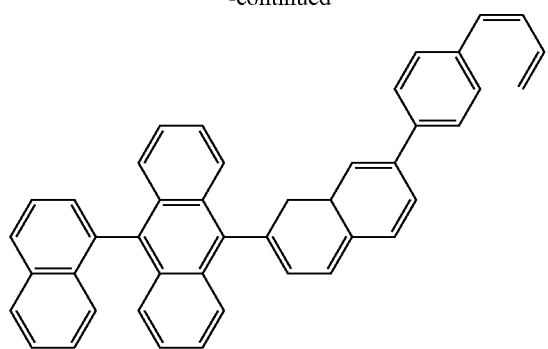
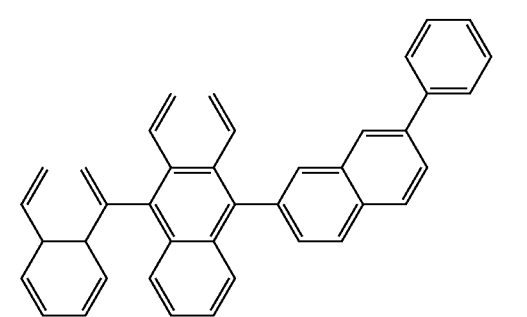
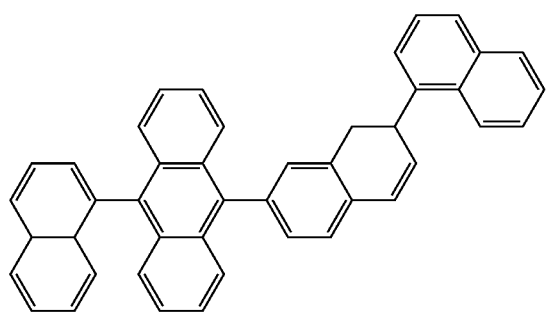
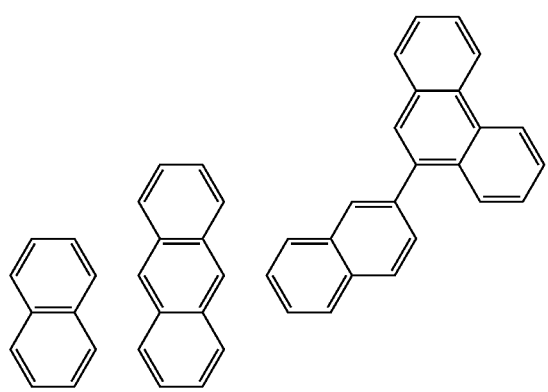
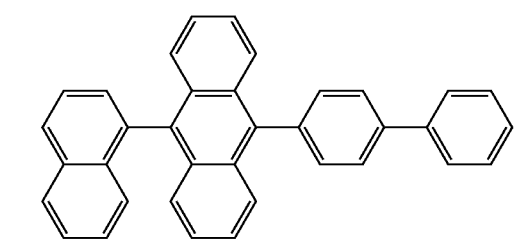
-continued
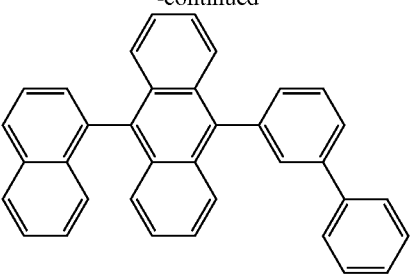
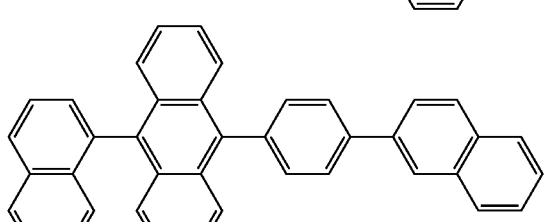
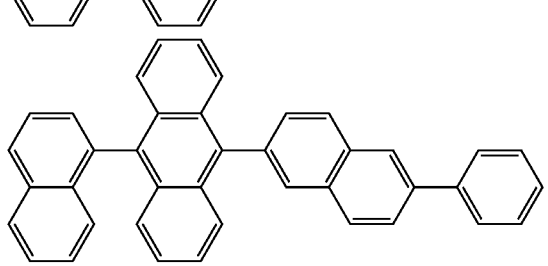
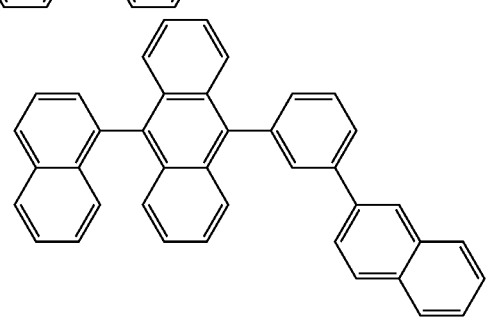
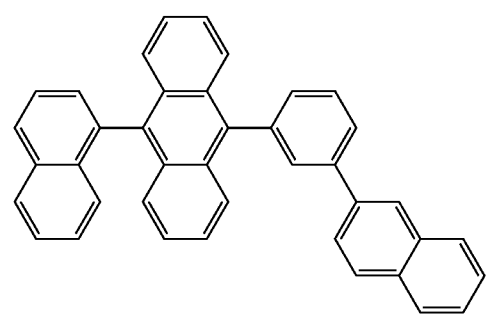
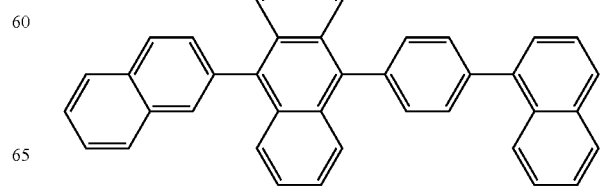

-continued
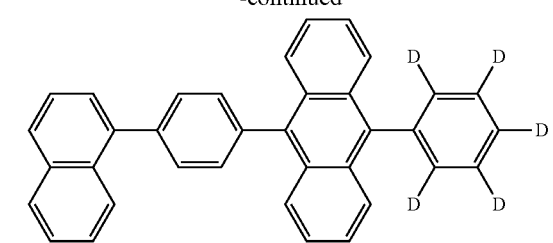
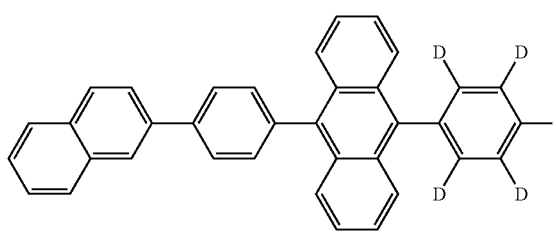
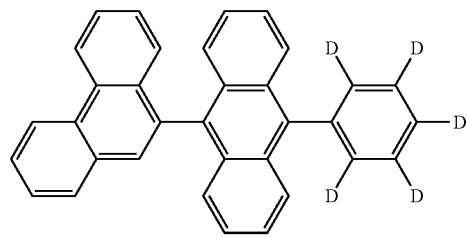
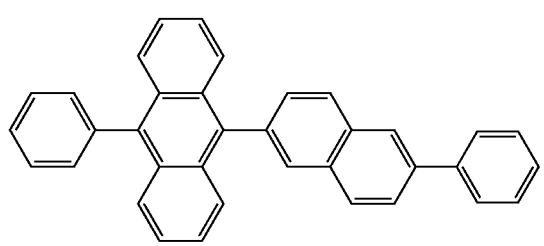
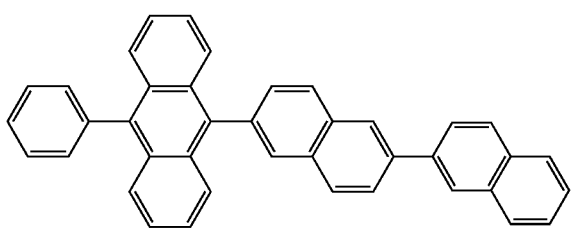
-continued
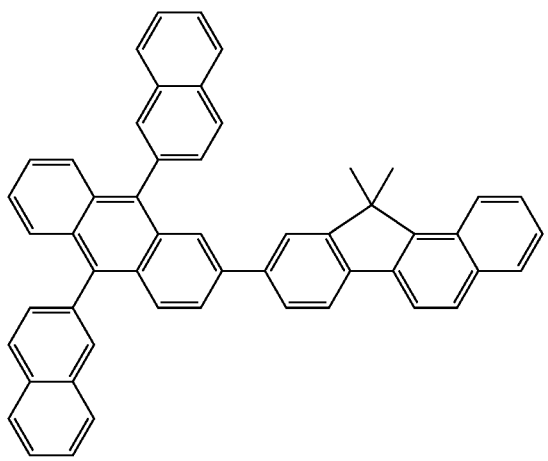
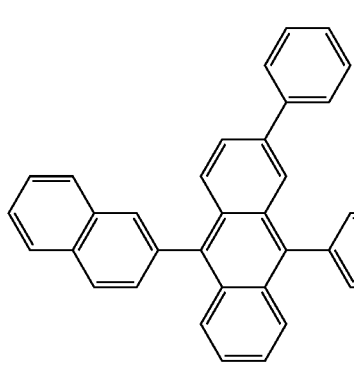
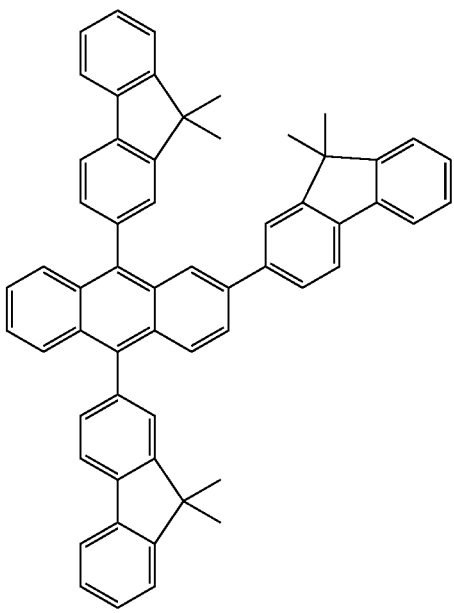

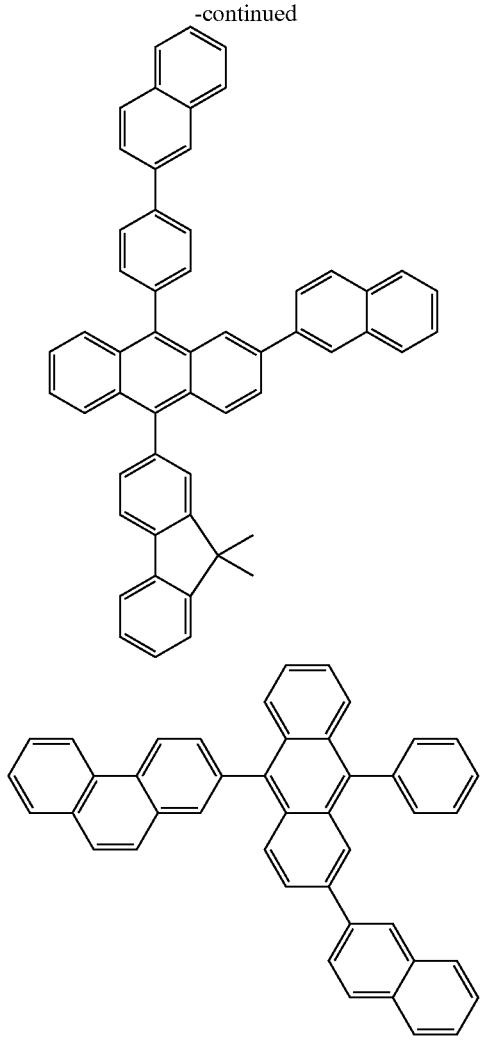

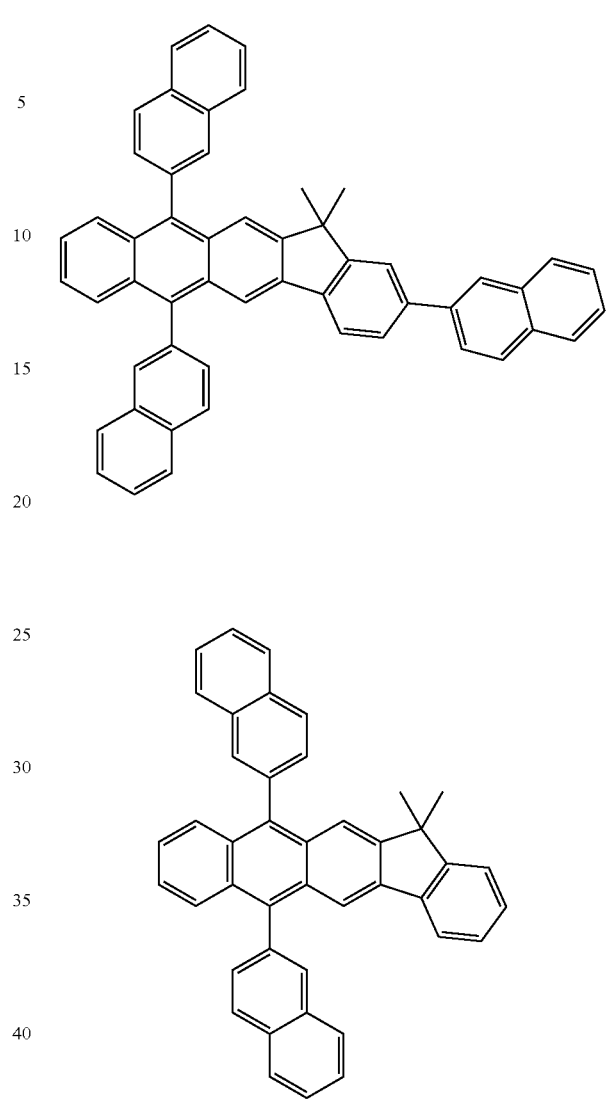

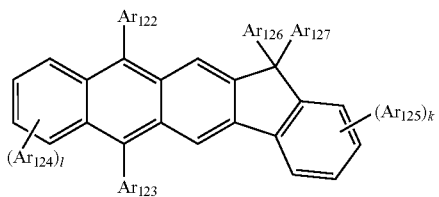

In an implementation, an anthracene-based compound represented by Formula 401 below may be used as the host:

<Formula 401>

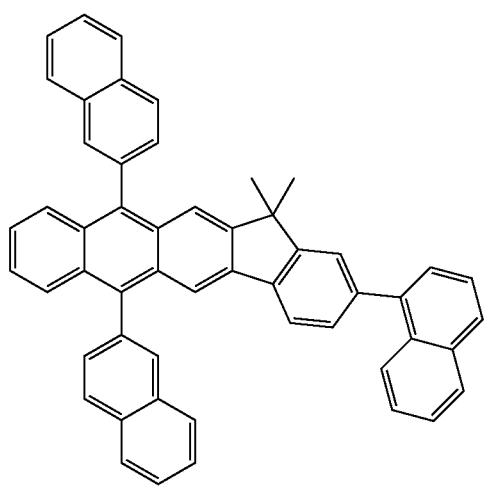

In Formula 401, $Ar_{122}$ to $Ar_{125}$ may be defined as described above in conjunction with $Ar_m$ of Formula 400.

In Formula 401 above, $Ar_{126}$ and $Ar_{127}$ may be each independently a $C_1$-$C_{10}$ alkyl group (e.g., a methyl group, an ethyl group, or a propyl group).

In Formula 401 above, $Ar_{126}$ and $Ar_{127}$ may be each independently a $C_1$-$C_{10}$ alkyl group (e.g., a methyl group, an ethyl group, or a propyl group).

In an implementation, the anthracene compound of Formula 401 above may include one of compounds represented by the Formulae below, but is not limited thereto:

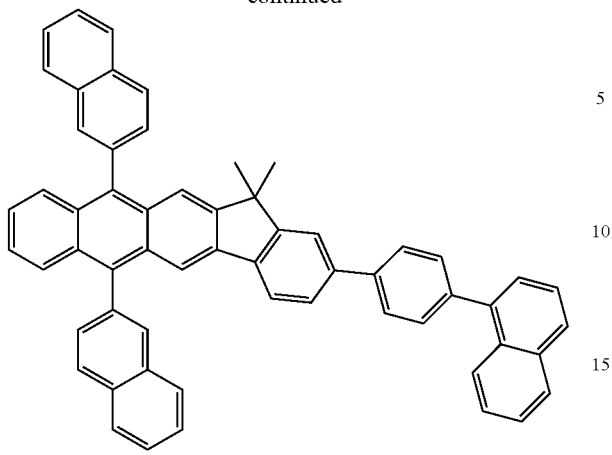
When the OLED is a full color OLED, the EML may be patterned into a red EML, a green EML, and a blue EML.
At least one layer of the red EML, the green EML, and the blue EML may include one of the dopants below (ppy=phenylpyridine).
The blue dopant may include one of the compounds below, but is not limited thereto:
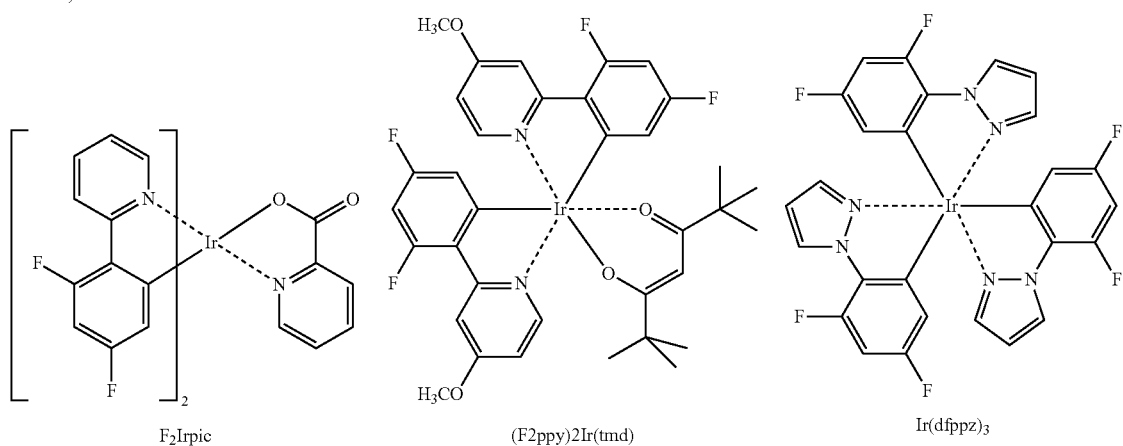
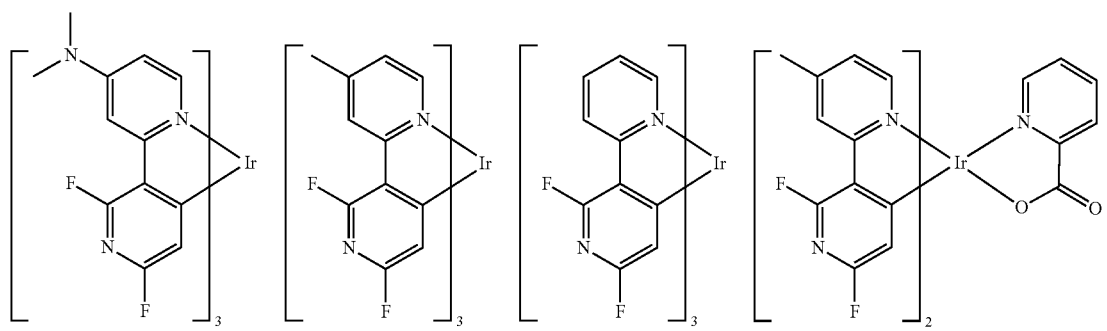

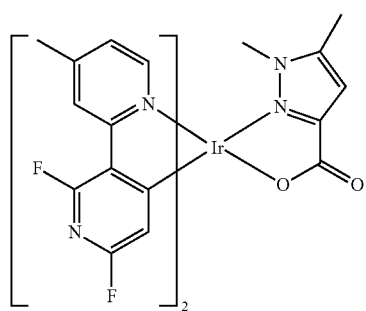
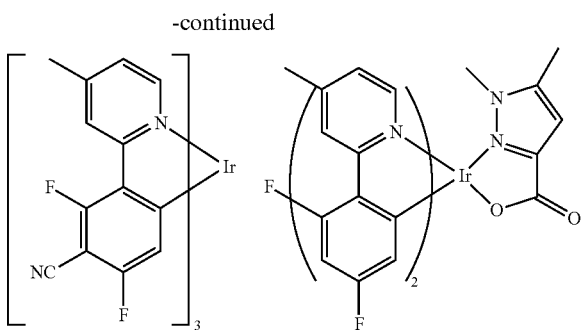
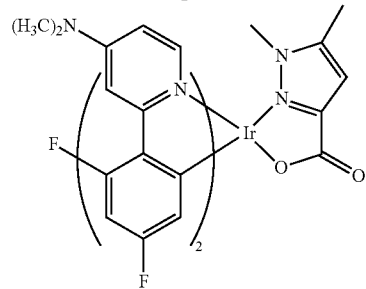
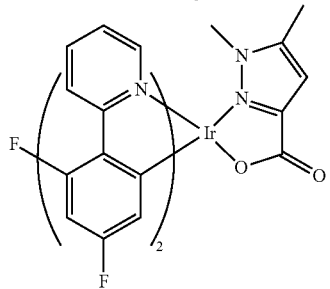
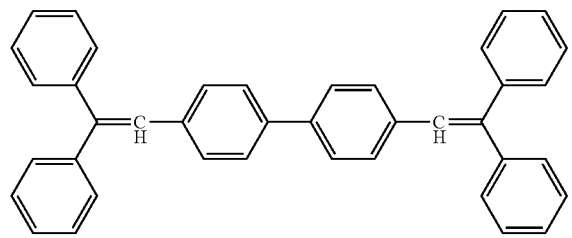
DPVBi
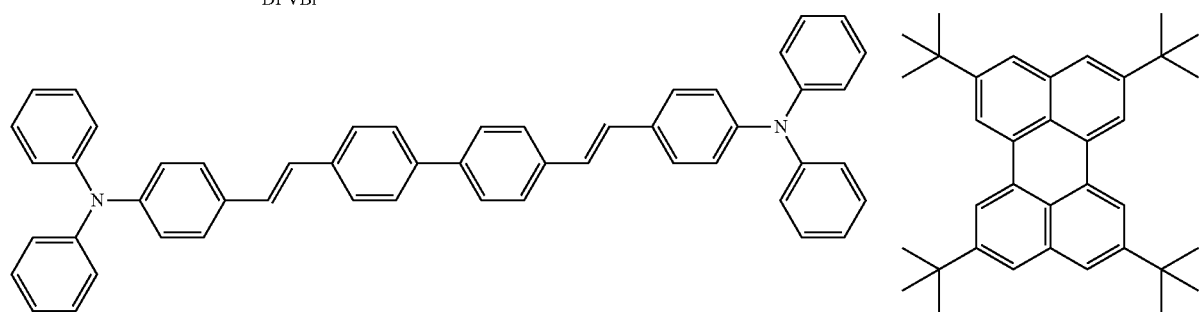
DPAVBi
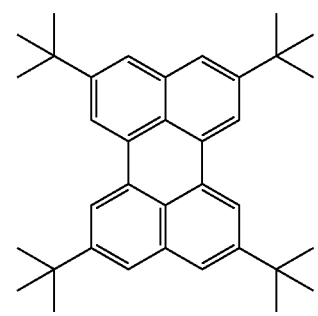
TBPe
The red dopant may include one of the compounds below, but is not limited thereto:
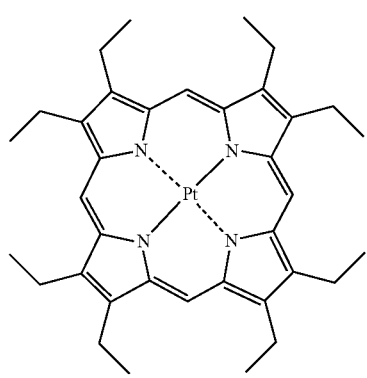
PtOEP
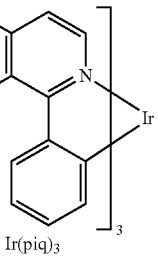
Ir(piq)$_3$
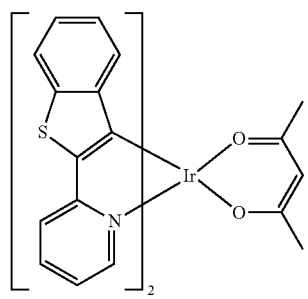
Btp$_2$Ir(acac)

-continued
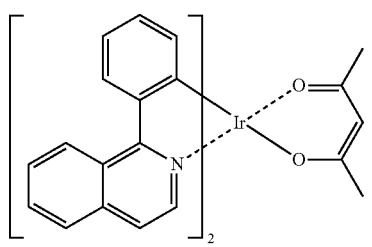
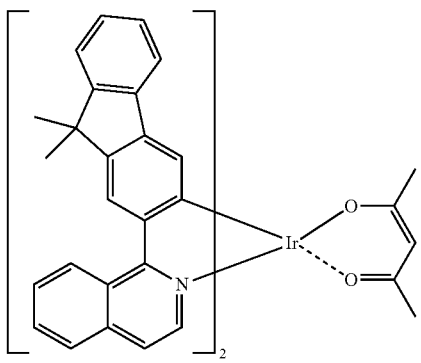
Ir(fliq)₂(acac)
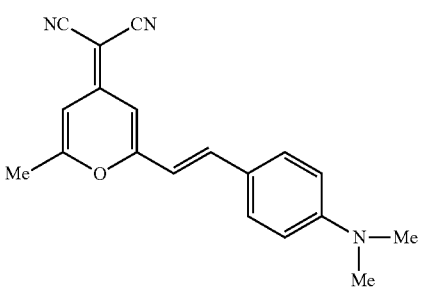
DCM
Ir(pq)₂(acac)
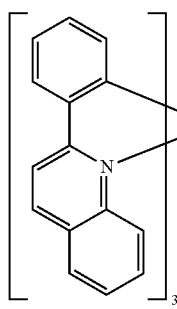
Ir(2-phq)₃
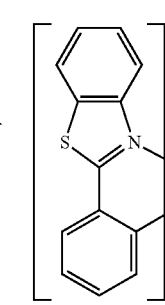
Ir(BT)₂(acac)
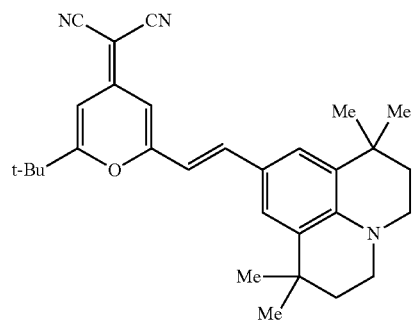
DCJTB
The green dopant may include one of the compounds below, but is not limited thereto:
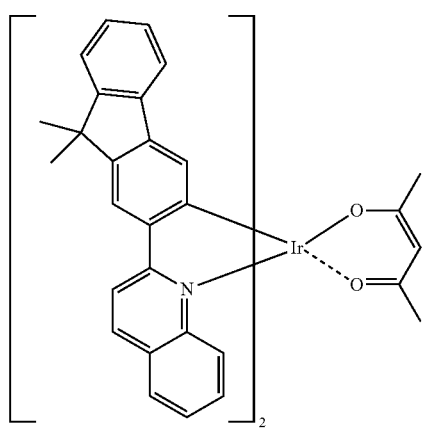
Ir(flq)₂(acac)
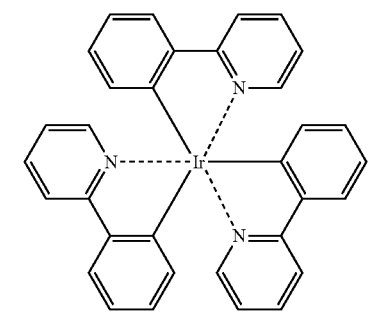
Ir(ppy)₃

-continued
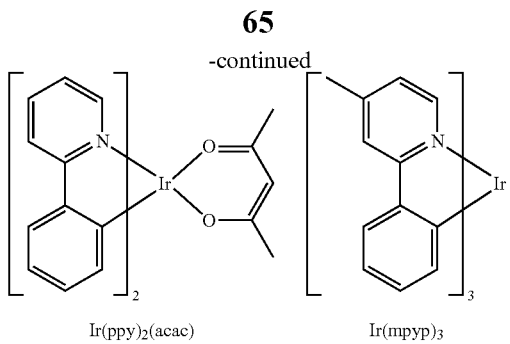
Ir(ppy)₂(acac)   Ir(mpyp)₃
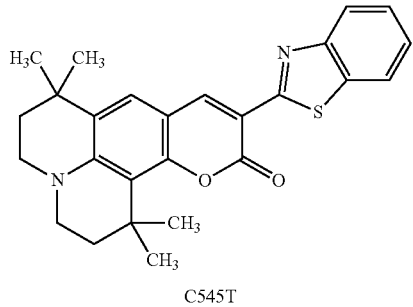
C545T
A dopant used in the EML may include a Pd-complex or a Pt-complex represented by one of the Formulae below, but is not limited thereto:
D1
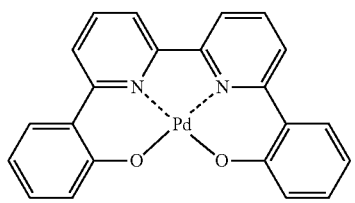
D2
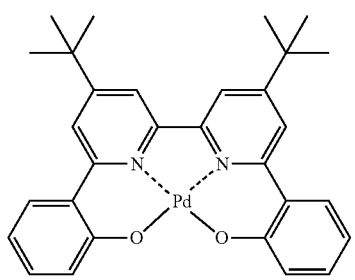
D3
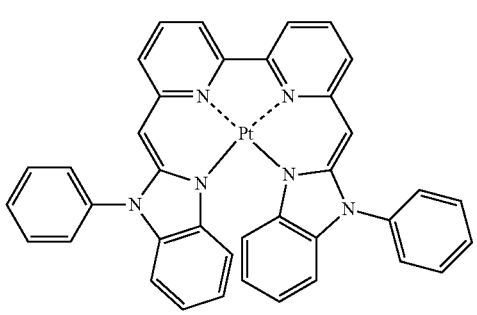
-continued
D4
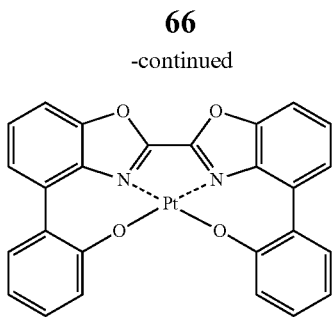
D5
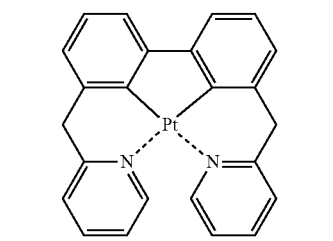
D6
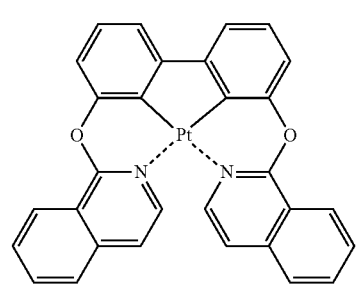
D7
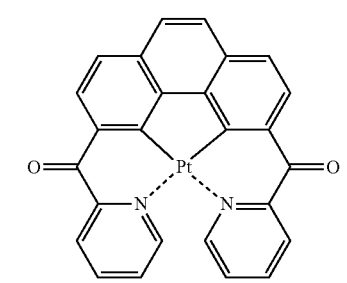
D8
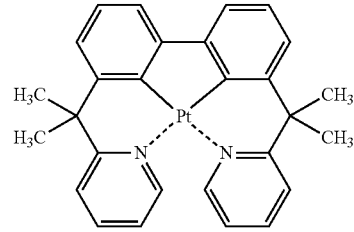
D9
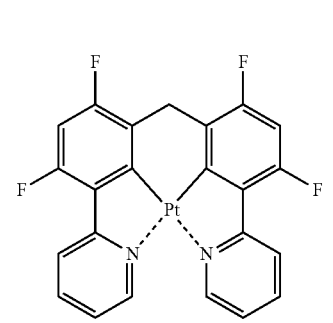

-continued
D10
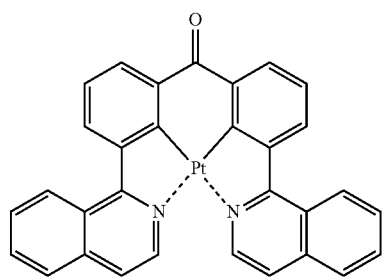
D11
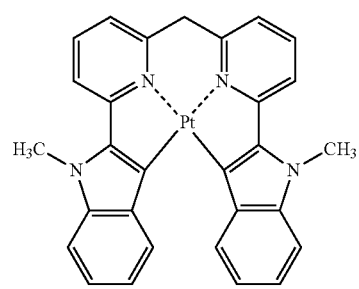
D12
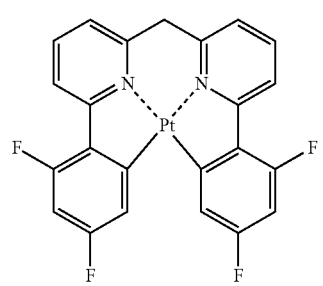
D13
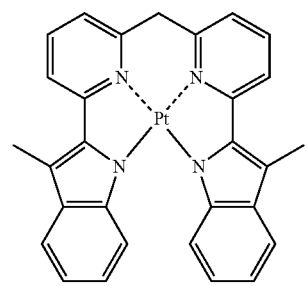
D14
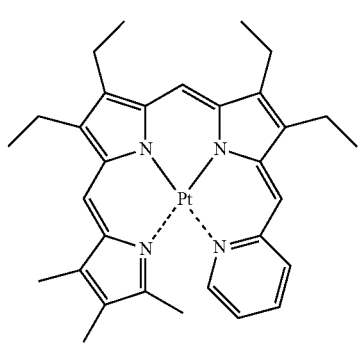
-continued
D15
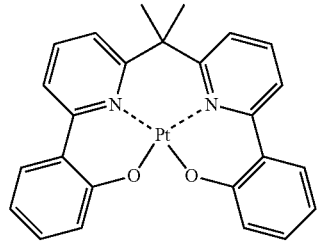
D16
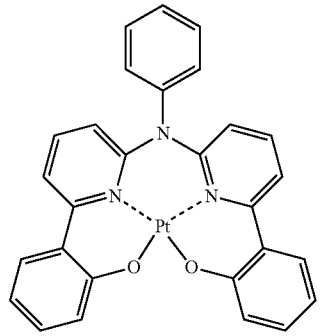
D17
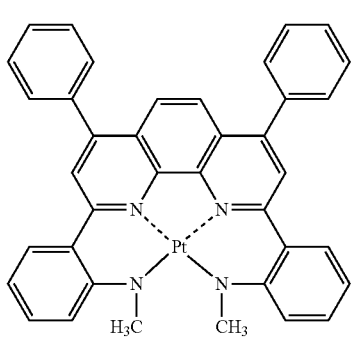
D18
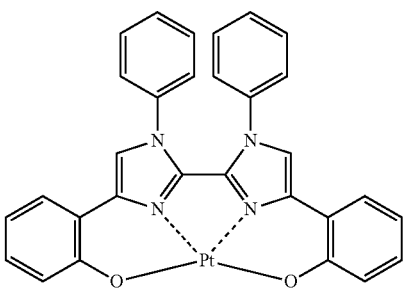
D19
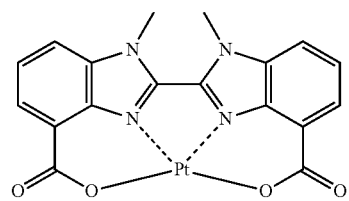
D20
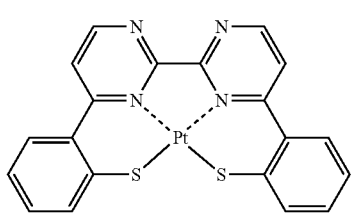

-continued
D21
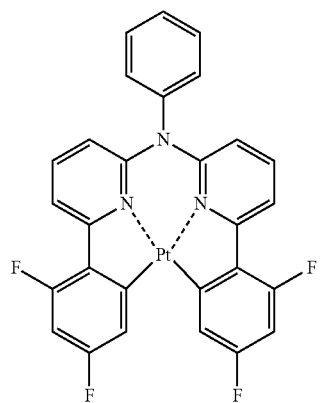
D22
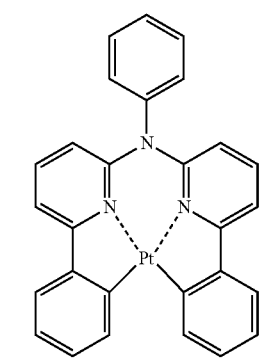
D23
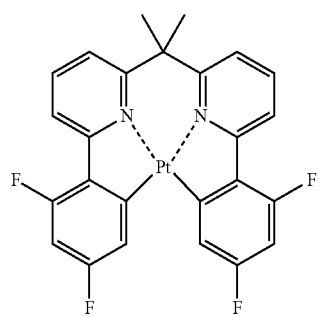
D24
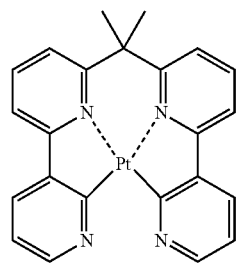
D25
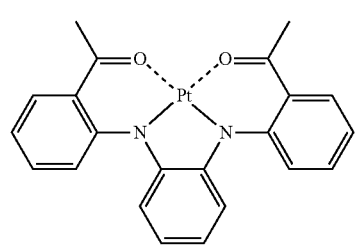
-continued
D26
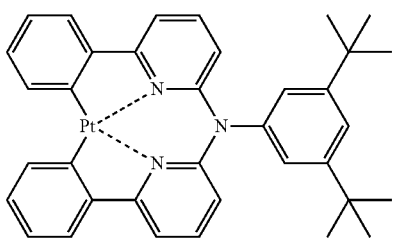
D27
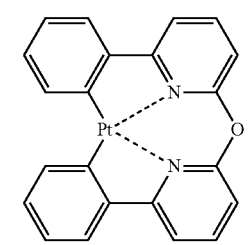
D28
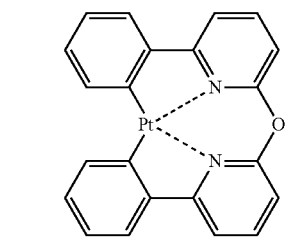
D29
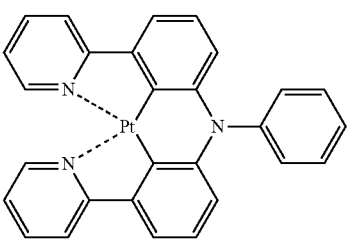
D30
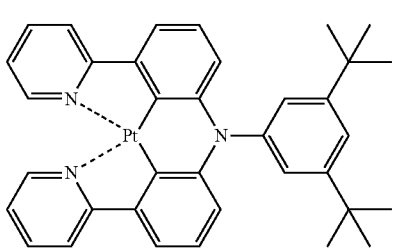
D31
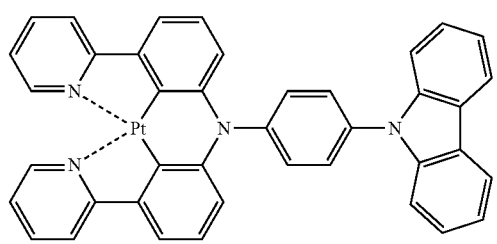

-continued
D32
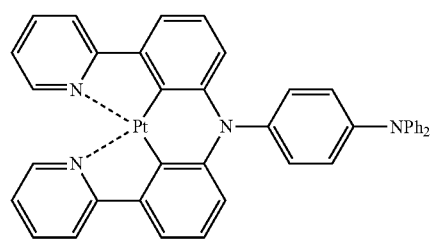
D33
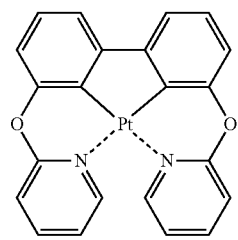
D34
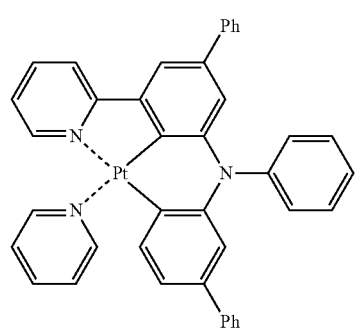
D35
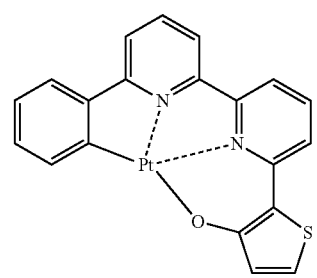
D36
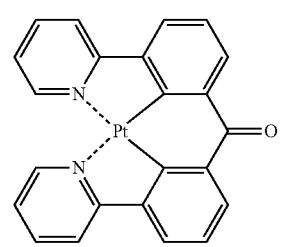
D37
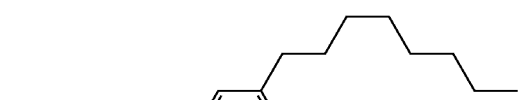
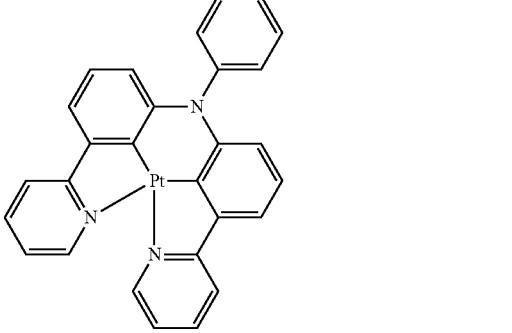
D38
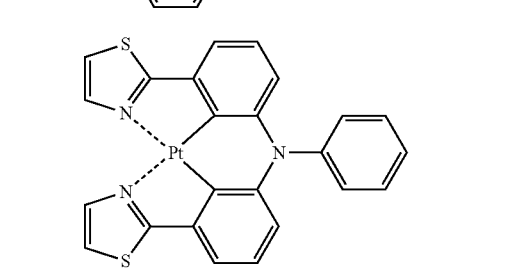
D39
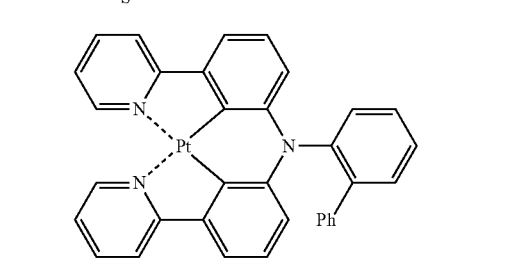
D40
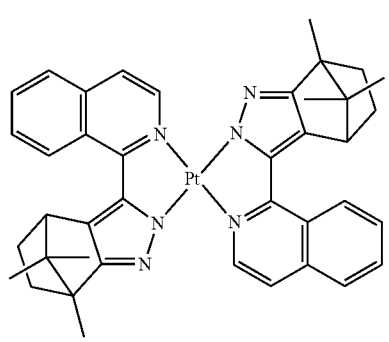
D41
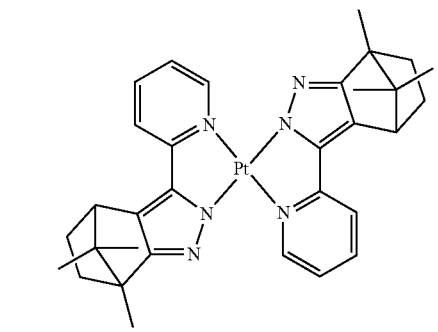

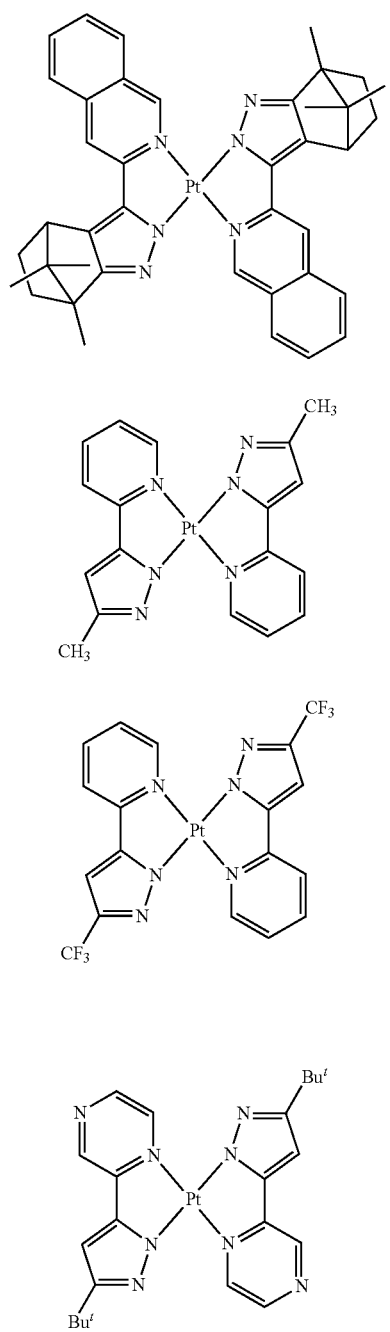
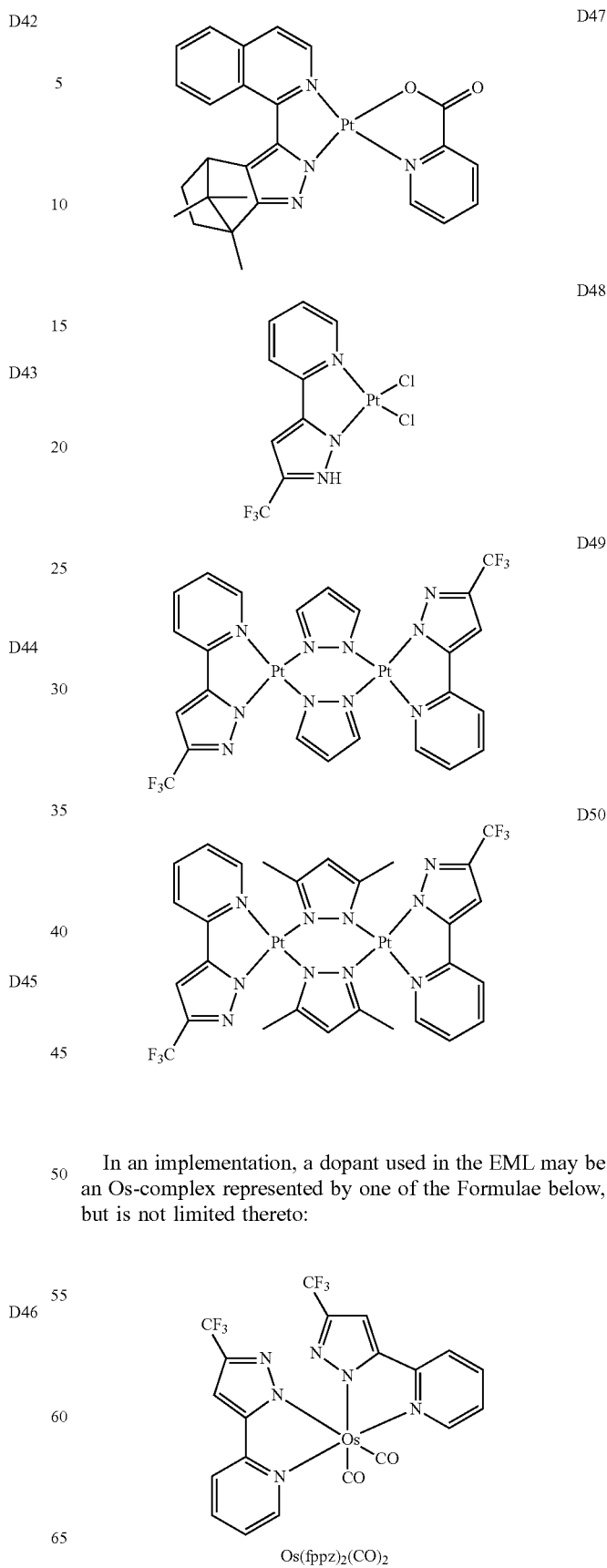
In an implementation, a dopant used in the EML may be an Os-complex represented by one of the Formulae below, but is not limited thereto:

-continued

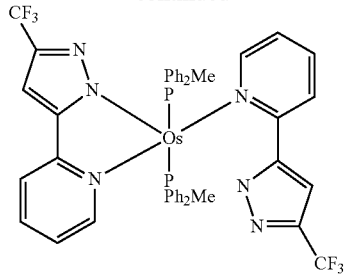

Os(fppz)₂(PPh₂Me)₂

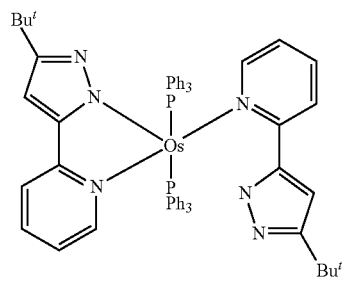

Os(bppz)₂(PPh₃)₂

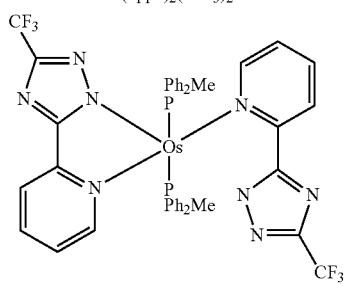

Os(fptz)₂(PPh₂Me)₂

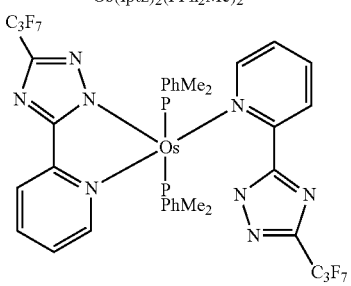

Os(hptz)₂(PPhMe₂)₂

When the EML includes a host and a dopant, an amount of the dopant may be about 0.01 to about 15 parts by weight, based on 100 parts by weight of the host, but is not limited thereto.

A thickness of the EML may be about 100 Å to about 1,000 Å, e.g., about 200 Å to about 600 Å. When the thickness of the EML is within the above ranges, the EML may have satisfactory light-emitting capabilities without a substantial increase in driving voltage.

Then, an ETL may be formed on the EML by using various methods, such as vacuum deposition, spin coating, and casting. When the ETL is formed by using vacuum deposition or spin coating, the deposition and coating conditions may be similar to those for the formation of the HIL, although the deposition and coating conditions may vary depending on the compound that is used to form the ETL.

A material that stably transports electrons that are injected from an electron injection electrode (i.e., a cathode) may be used as an ETL-forming material.

Examples of the known ETL-forming materials may include a quinoline derivative such as tris(8-quinolinorate) aluminum (Alq₃), TAZ, Balq, beryllium bis(benzoquinolin-10-olate (Bebq₂), ADN, Compound 201, and Compound 202, but are not limited thereto:

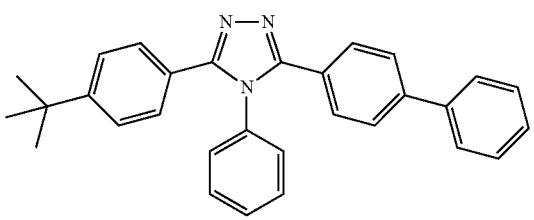

TAZ

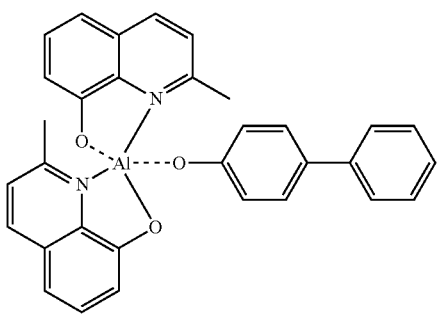

BAlq

<Compound 201>

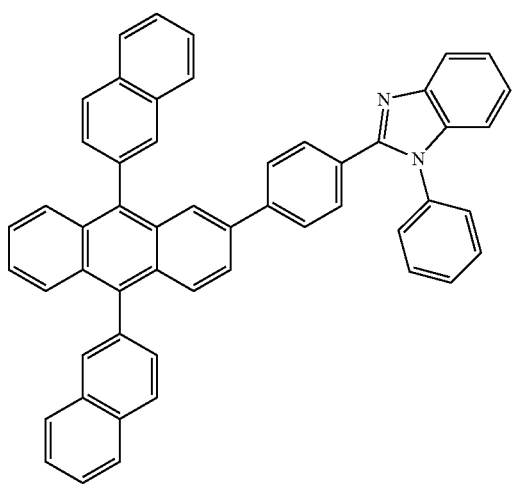

-continued

<Compound 202>

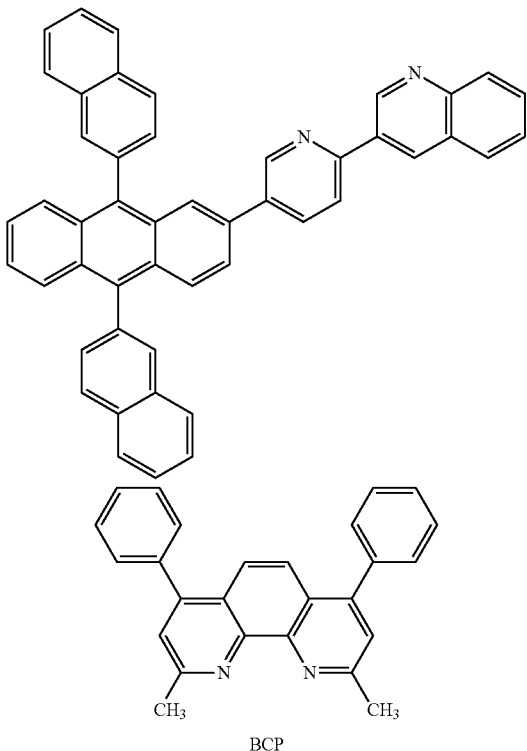

A thickness of the ETL may be about 100 Å to about 1,000 Å, e.g., about 150 Å to about 500 Å. When the thickness of the ETL is within the above ranges, the ETL may have satisfactory electron transporting capabilities without a substantial increase in driving voltage.

In an implementation, the ETL may include a metal-containing material, in addition to an organic compound for the ETL.

The metal-containing material may include a lithium (Li) complex. Non-limiting examples of the Li complex may include lithium quinolate (LiQ) and Compound 203 below:

<Compound 203>

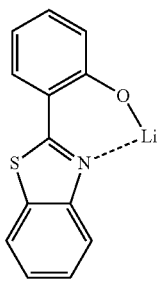

Then, an EIL, which facilitates injection of electrons from the cathode, may be formed on the ETL. A suitable electron-injecting material may be used to form the EIL.

Examples of the EIL-forming materials may include LiF, NaCl, CsF, Li$_2$O, and BaO, which are known in the art. In an implementation, a suitable EIL-forming material may be used. Deposition conditions of the EIL may be similar to those for the formation of the HIL, although the conditions may vary depending on the compound that is used to form the EIL.

A thickness of the EIL may be about 1 Å to about 100 Å, e.g., about 3 Å to about 90 Å. When the thickness of the EIL is within the above ranges, the EIL may have satisfactory electron injection capabilities without a substantial increase in driving voltage.

A second electrode may be disposed on the organic layer. When the second electrode is a cathode that is an electron injection electrode, materials having a low work function, such as a metal, an alloy, and an electro-conductive compound, and a mixture thereof may be used as the second electrode-forming material. The second electrode may be formed as a thin film type transmission electrode using lithium (Li), magnesium (Mg), aluminum (Al), aluminum-lithium (Al—Li), calcium (Ca), magnesium-indium (Mg—In), magnesium-silver (Mg—Ag). In an implementation, to manufacture a top-emission light-emitting diode, the transmission electrode may be formed of indium tin oxide (ITO) or indium zinc oxide (IZO).

Although the OLED is described with respect to FIG. 1, the description of the OLED is not limited thereto.

When a phosphorescent dopant is used in the EML, a HBL may be formed between the ETL and the EML or between the E-functional layer and the EML by using vacuum deposition, spin coating, casting, or LB deposition, in order to help prevent diffusion of triplet excitons or holes into the ETL. When the HBL is formed using vacuum deposition or spin coating, the conditions for deposition and coating may be similar to those for the formation of the HIL, although the conditions for deposition and coating may vary according to the material that is used to form the HBL. A suitable hole-blocking material may be used. Examples of the suitable hole-blocking materials may include oxadiazole derivatives, triazole derivatives, and phenanthroline derivatives. For example, BCP below may be used to form the HBL.

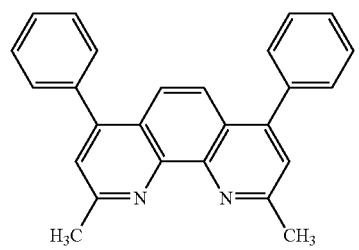

BCP

A thickness of the HBL may be about 20 Å to about 1,000 Å, e.g., about 30 Å to about 300 Å. When the thickness of the HBL is within the above ranges, the HBL may have satisfactory hole blocking capabilities without a substantial increase in driving voltage.

The OLED according to another embodiment may be provided in various types of flat panel display devices such as passive matrix OLED devices and active matrix OLED devices. For example, when the OLED is provided in an active matrix OLED, the first electrode acting as a pixel electrode on the substrate may be electrically connected to a source electrode or a drain electrode of a thin-film transistor (TFT). In an implementation, the OLED may be provided in a flat panel display device having double-sided screens.

Alternatively, the organic layer of the OLED according to an embodiment may be formed by using vacuum deposition using above-described compounds, or by using a wet process that coats the above-described compounds present in a liquid state.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE

Synthesis Example 1

Synthesis Example 1

Synthesis of Compound 2

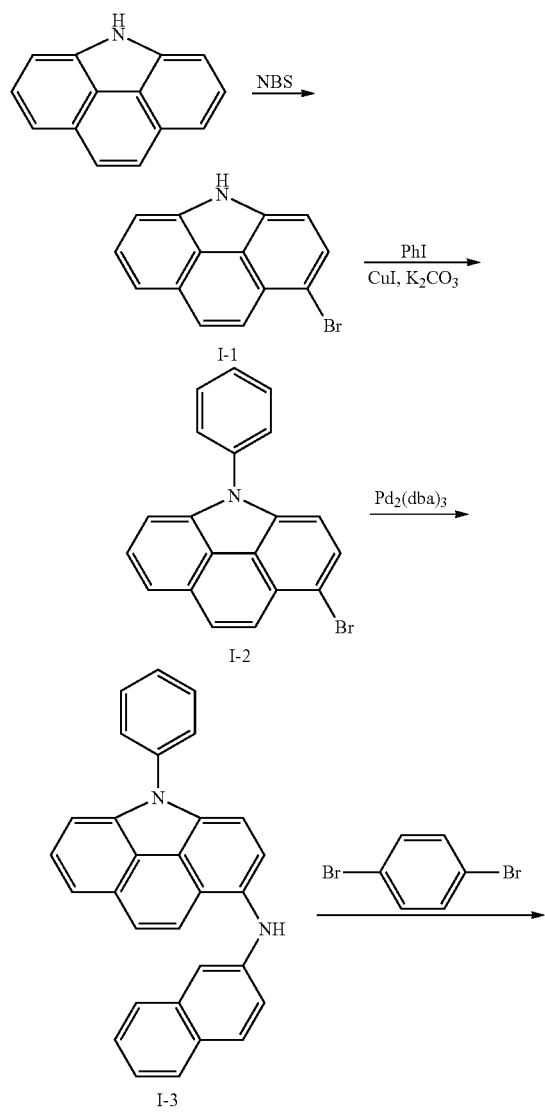

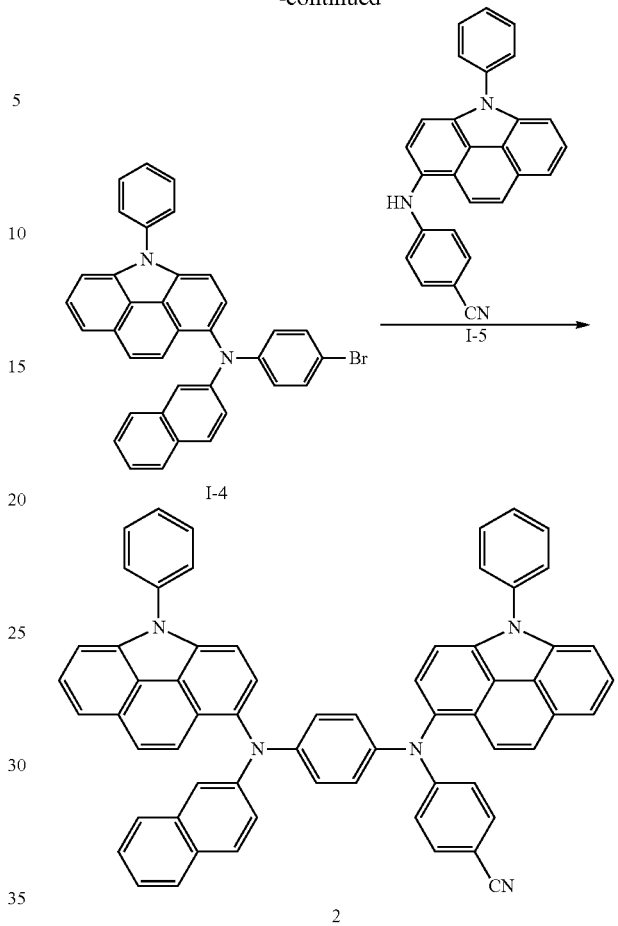

Synthesis of Intermediate I-1

After completely dissolving 1.91 g (10 mmol) of 6H-benzo[def]carbazole in 60 mL of carbon tetrachloride ($CCl_4$), 1.78 g (10 mmol) of N-bromosuccinimide was added thereto. The reacting solution was stirred at a temperature of 80° C. for 30 minutes, cooled down to room (e.g., ambient) temperature, and stirred for 30 minutes to precipitate crystals. The crystals that were collected by a pressure reducing filter were washed out with methanol to obtain 1.35 g (Yield: 50%) of white crystalline Intermediate I-1. The obtained compound was then confirmed by LC-MS ($C_{14}H_8BrN$: $M^+$ 268.95).

Synthesis of Intermediate I-2

2.7 g (10 mmol) of Intermediate I-1, 2.45 g (12 mmol) of iodobenzene, 0.18 g (1 mmol) of 1,10-phenanthroline, 0.38 g (2.0 mmol) of CuI, and 4.15 g (30.0 mmol) of $K_2CO_3$ were dissolved in 75 mL of dimethylformamide (DMF). The reacting solution was stirred at a temperature of 80° C. for 24 hours, cooled down to room temperature, and extracted with 75 mL of water to collect an organic layer. The organic layer was then dried with magnesium sulfate, and residues obtained by evaporation of the solvent were separation-purified by silica gel column chromatography to obtain 2.63 g (Yield: 76%) of Intermediate I-2. The obtained compound was then confirmed by LC-MS ($C_{20}H_{12}BrN$: $M^+$ 345.15).

Synthesis of Intermediate I-3

3.46 g (10 mmol) of Intermediate I-2, 2.15 g (15 mmol) of naphthalene-2-amine, 0.18 g (0.2 mmol) of Pd$_2$(dba)$_3$, 0.02 g (0.2 mmol) of PtBu$_3$, and 1.68 g (15 mmol) of KOtBu were dissolved in 75 mL of toluene. The reacting solution was stirred at a temperature of 85° C. for 4 hours, cooled down to room temperature, and extracted with 50 mL of water three times and 50 mL of diethyl ether three times to collect an organic layer. The organic layer was then dried with magnesium sulfate, and residues obtained by evaporation of the solvent were separation-purified by silica gel column chromatography to obtain 3.35 g (Yield: 82%) of Intermediate I-3. The obtained compound was then confirmed by LC-MS (C$_{30}$H$_{20}$N$_2$ M+ 408.24).

Synthesis of Intermediate I-4

4.08 g (10 mmol) of Intermediate I-3, 3.54 g (15 mmol) of 1,4-dibromobenzene, 0.18 g (0.2 mmol) of Pd$_2$(dba)$_3$, 0.02 g (0.2 mmol) of PtBu$_3$, and 1.68 g (15 mmol) of KOtBu were dissolved in 75 mL of toluene. The reacting solution was stirred at a temperature of 85° C. for 4 hours, cooled down to room temperature, and extracted with 50 mL of water three times and 50 mL of diethyl ether three times to collect an organic layer. The organic layer was then dried with magnesium sulfate, and residues obtained by evaporation of the solvent were separation-purified by silica gel column chromatography to obtain 4.45 g (Yield: 79%) of Intermediate I-4. The obtained compound was then confirmed by LC-MS (C$_{36}$H$_{23}$BrN$_2$ M+ 562.22).

Synthesis of Intermediate I-5

3.46 g (10 mmol) of Intermediate I-2, 1.77 g (15 mmol) of 4-aminobenzonitril, 0.18 g (0.2 mmol) of Pd$_2$(dba)$_3$, 0.02 g (0.2 mmol) of PtBu$_3$, and 1.68 g (15 mmol) of KOtBu were dissolved in 75 mL of toluene. The reacting solution was stirred at a temperature of 85° C. for 4 hours, cooled down to room temperature, and extracted with 50 mL of water three times and 50 mL of diethyl ether three times to collect an organic layer. The organic layer was then dried with magnesium sulfate, and residues obtained by evaporation of the solvent were separation-purified by silica gel column chromatography to obtain 3.34 g (Yield: 87%) of Intermediate I-5. The obtained compound was then confirmed by LC-MS (C$_{27}$H$_{17}$N$_3$ M+ 383.12).

Synthesis of Compound 2

2.82 g (5 mmol) of Intermediate I-4, 1.92 g (5 mmol) of Intermediate I-5, 0.09 g (0.1 mmol) of Pd$_2$(dba)$_3$, 0.01 g (0.1 mmol) of PtBu$_3$, and 0.84 g (7.5 mmol) of KOtBu were dissolved in 75 mL of toluene. The reacting solution was stirred at a temperature of 85° C. for 4 hours, cooled down to room temperature, and extracted with 50 mL of water three times and 50 mL of diethyl ether three times to collect an organic layer. The organic layer was then dried with magnesium sulfate, and residues obtained by evaporation of the solvent were separation-purified by silica gel column chromatography to obtain 3.51 g (Yield: 81%) of Compound 2. The obtained compound was then confirmed by MS/FAB and $^1$H NMR (C$_{63}$H$_{39}$N$_5$ cal. 865.32. found 865.41).

Synthesis Example 2

Synthesis of Compound 10

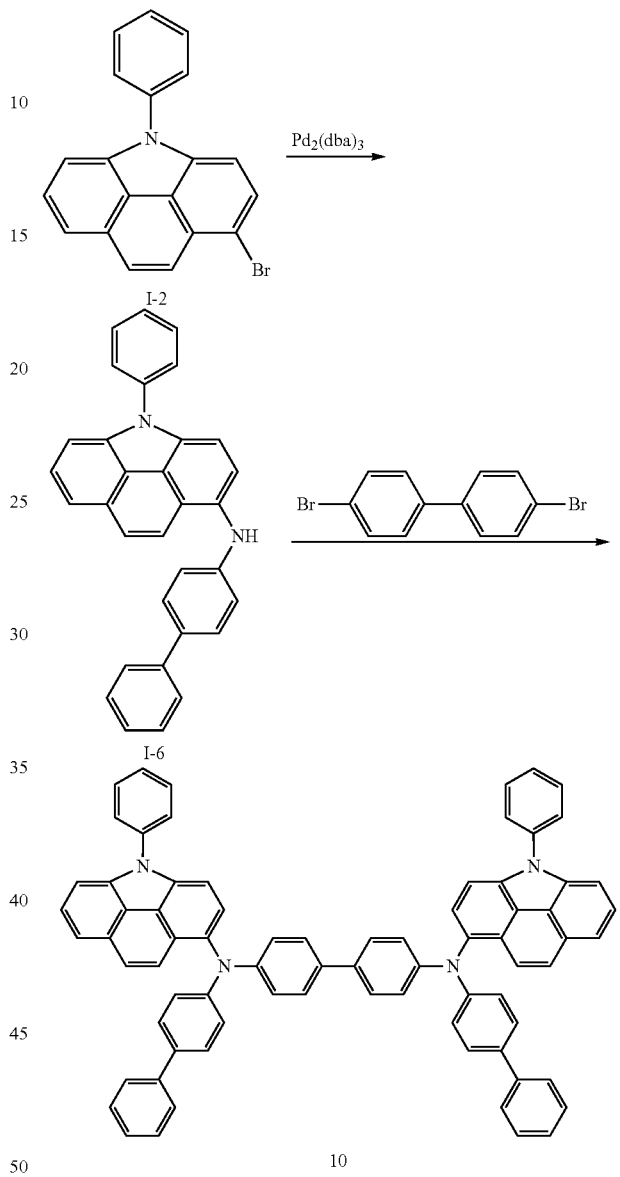

Synthesis of Intermediate I-6

3.46 g (10 mmol) of Intermediate I-2, 2.54 g (15 mmol) of [1,1'-biphenyl]-4-amine, 0.18 g (0.2 mmol) of Pd$_2$(dba)$_3$, 0.02 g (0.2 mmol) of PtBu$_3$, and 1.68 g (15 mmol) of KOtBu were dissolved in 75 mL of toluene. The reacting solution was stirred at a temperature of 85° C. for 4 hours, cooled down to room temperature, and extracted with 50 mL of water three times and 50 mL of diethyl ether three times to collect an organic layer. The organic layer was then dried with magnesium sulfate, and residues obtained by evaporation of the solvent were separation-purified by silica gel column chromatography to obtain 3.61 g (Yield: 83%) of Intermediate I-6. The obtained compound was then confirmed by LC-MS (C$_{32}$H$_{22}$N$_2$ M+ 434.22).

Synthesis of Compound 10

4.35 g (10 mmol) of Intermediate I-6, 1.56 g (5 mmol) of 4,4'-dibromo-1,1'-biphenyl, 0.09 g (0.1 mmol) of $Pd_2(dba)_3$, 0.01 g (0.1 mmol) of $PtBu_3$, and 1.68 g (15 mmol) of KOtBu were dissolved in 75 mL of toluene. The reacting solution was stirred at a temperature of 85° C. for 4 hours, cooled down to room temperature, and extracted with 50 mL of water three times and 50 mL of diethyl ether three times to collect an organic layer. The organic layer was then dried with magnesium sulfate, and residues obtained by evaporation of the solvent were separation-purified by silica gel column chromatography to obtain 4.03 g (Yield: 79%) of Compound 10. The obtained compound was then confirmed by MS/FAB and $^1$H NMR ($C_{76}H_{50}N_4$ cal. 1018.40. found 1018.35).

Synthesis Example 3

Synthesis of Compound 18

Synthesis of Intermediate I-7

3.62 g (Yield: 84%) of Intermediate I-7 was synthesized in the same manner as in the Synthesis of Intermediate I-6, except that 4-(trimethylsilyl)-aniline was used instead of [1,1'-biphenyl]-4-amine. The obtained compound was then confirmed by LC-MS ($C_{29}H_{26}N_2Si$ M+ 430.75).

Synthesis of Compound 18

3.94 g (Yield: 78%) of Compound 18 was synthesized in the same manner as in the Synthesis of Compound 10, except that Intermediate I-7 was used instead of Intermediate I-6, and 3,3'-dibromo-1,1'-biphenyl was used instead of 4,4'-dibromo-1,1'-biphenyl. The obtained compound was then confirmed by MS/FAB and $^1$H NMR ($C_{70}H_{58}N_4Si_2$ cal. 1010.42. found 1010.38).

Synthesis Example 4

Synthesis of Compound 31

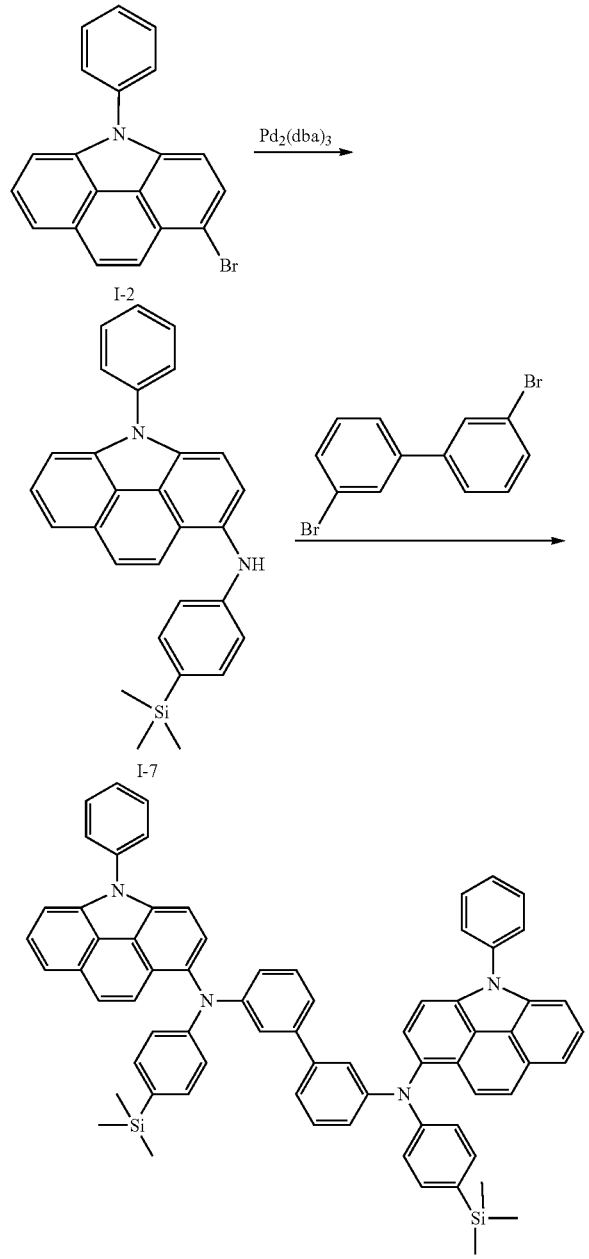

18

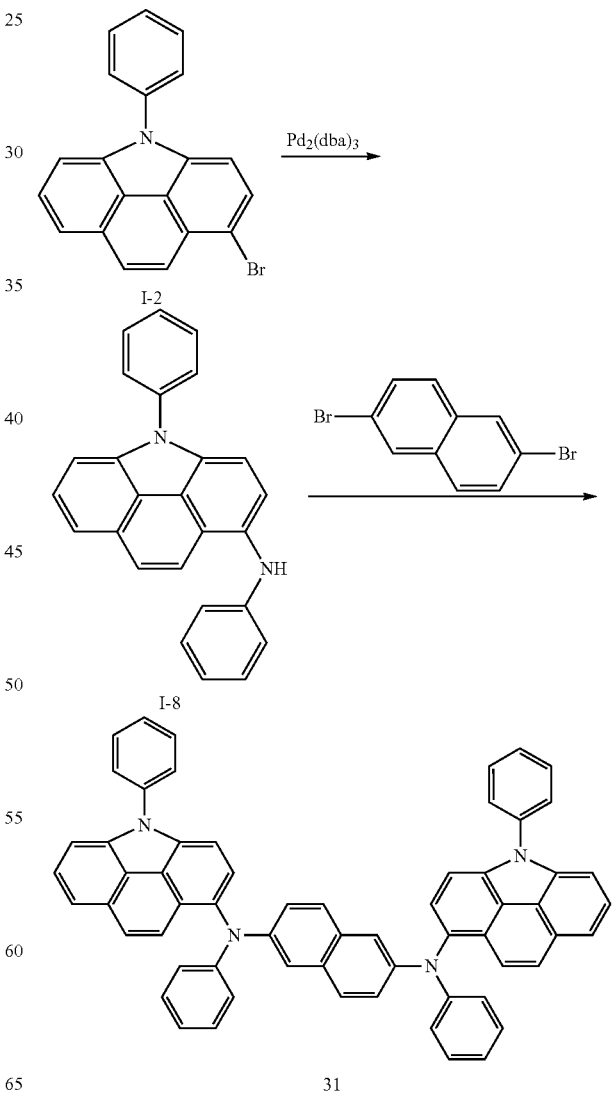

31

Synthesis of Intermediate I-8

3.15 g (Yield: 88%) of Intermediate I-8 was synthesized in the same manner as in the Synthesis of Intermediate I-6, except aniline was used instead of [1,1'-biphenyl]-4-amine. The obtained compound was then confirmed by LC-MS ($C_{26}H_{18}N_2$ M+ 358.20).

Synthesis of Compound 31

3.1 g (Yield: 74%) of Compound 31 was synthesized in the same manner as in the Synthesis of Compound 10, except that Intermediate I-8 was used instead of Intermediate I-6, and 2,6-dibromonaphthalene was used instead of 4,4'-dibromo-1,1'-biphenyl. The obtained compound was then confirmed by MS/FAB and $^1$H NMR ($C_{62}H_{40}N_4$ cal. 840.33. found 840.41).

Synthesis Example 5

Synthesis of Compound 40

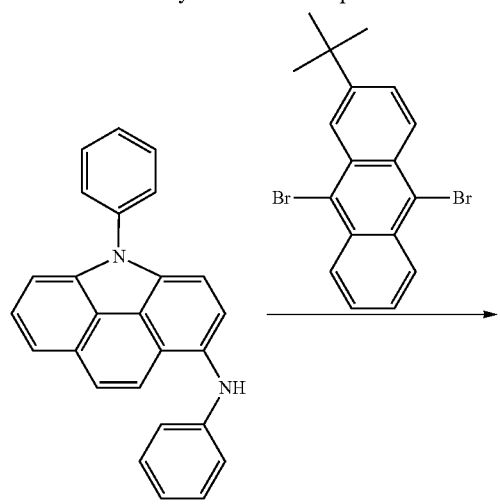

Synthesis of Compound 40

3.41 g (Yield: 72%) of Compound 40 was synthesized in the same manner as in the Synthesis of Compound 10, except that Intermediate I-8 was used instead of Intermediate I-6, and 9,10-dibromo-2-(tert-butyl)anthracene was used instead of 4,4'-dibromo-1,1'-biphenyl. The obtained compound was then confirmed by MS/FAB and $^1$H NMR ($C_{70}H_{50}N_4$ cal. 946.40. found 946.39).

Synthesis Example 6

Synthesis of Compound 47

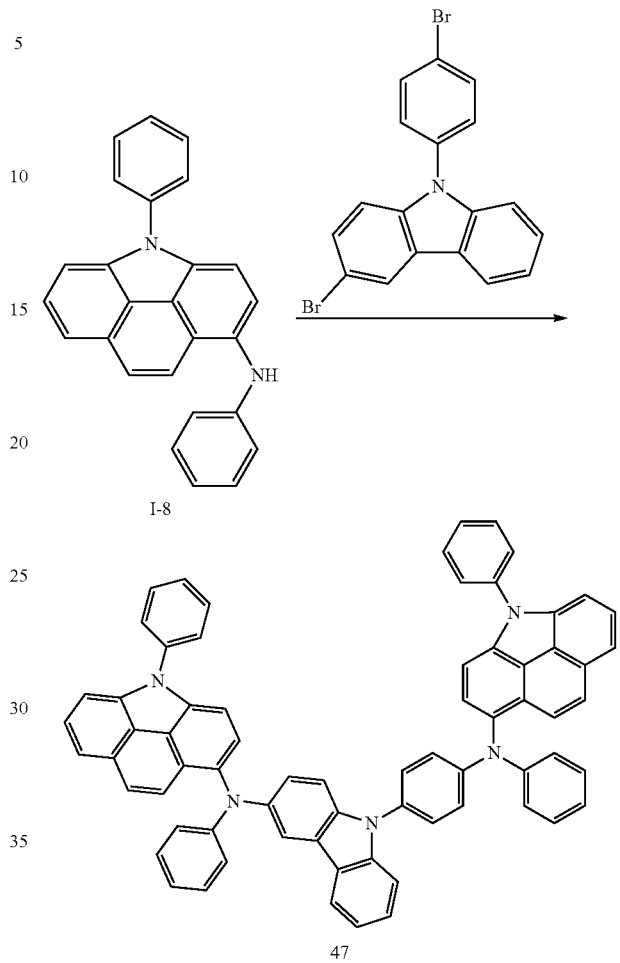

Synthesis of Compound 47

3.35 g (Yield: 70%) of Compound 47 was synthesized in the same manner as in the Synthesis of Compound 10, except that Intermediate I-8 was used instead of Intermediate I-6, and 3-bromo-9-(4-bromophenyl)-9H-carbazole was used instead of 4,4'-dibromo-1,1'-biphenyl. The obtained compound was then confirmed by MS/FAB and $^1$H NMR ($C_{70}H_{45}N_5$ cal. 955.37. found 955.42).

Synthesis Example 7

Synthesis of Compound 51

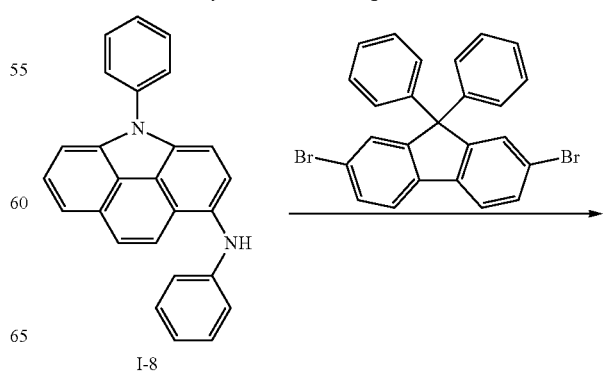

87
-continued

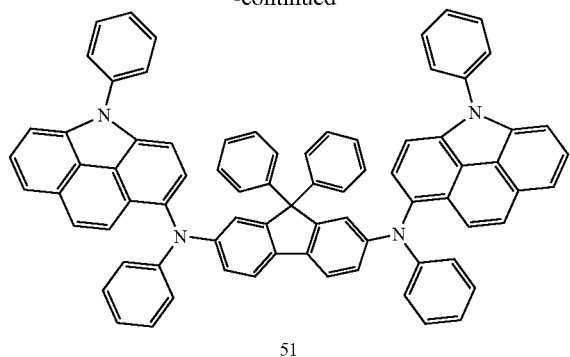

51

88
Synthesis of Compound 51

3.66 g (Yield: 71%) of Compound 51 was synthesized in the same manner as in the Synthesis of Compound 10, except that Intermediate I-8 was used instead of Intermediate I-6, and 2,7-dibromo-9,9-diphenyl-9H-fluorene was used instead of 4,4'-dibromo-1,1'-biphenyl. The obtained compound was then confirmed by MS/FAB and $^1$H NMR ($C_{77}H_{50}N_4$ cal. 1030.40. found 1030.38).

Synthesis Example 8

Synthesis of Compound 56

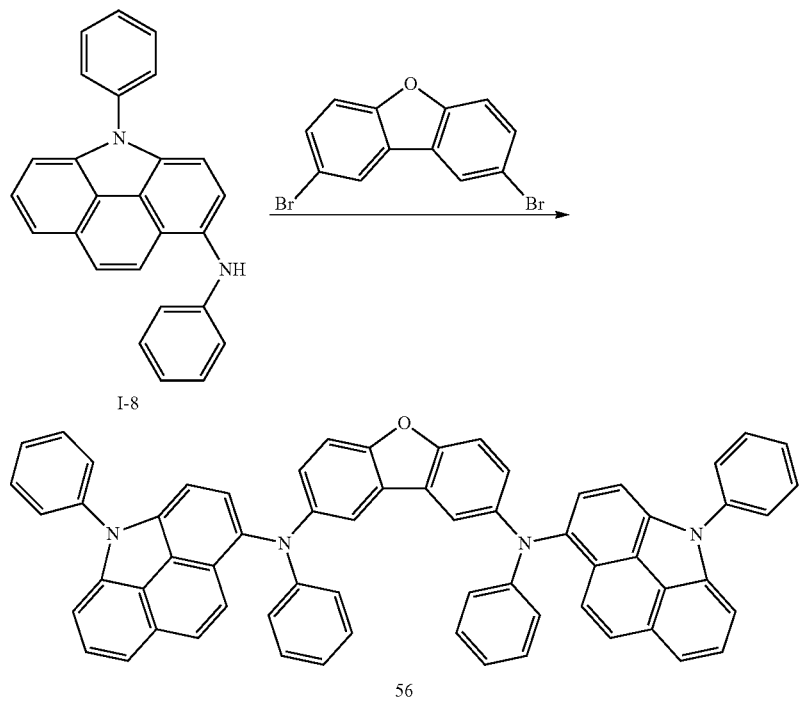

Synthesis of Compound 56

3.13 g (Yield: 71%) of Compound 56 was synthesized in the same manner as in the Synthesis of Compound 10, except that Intermediate I-8 was used instead of Intermediate I-6, and 2,8-dibromodibenzo[b,d]furan was used instead of 4,4'-dibromo-1,1'-biphenyl. The obtained compound was then confirmed by MS/FAB and $^1$H NMR ($C_{64}H_{40}N_4$ cal. 880.32. found 880.21).

Other additional compounds were synthesized by using suitable intermediate materials according to the above-described synthesis pathways. The results of $^1$H NMR and MS/FAB of the synthesized compounds are shown in Table 1 below.

TABLE 1

| Compound | 1H NMR (CDCl$_3$, 400 MHz) | MS/FAB found | MS/FAB calc. |
|---|---|---|---|
| 2 | δ = 7.95-7.92 (m, 3H), 7.80-7.78 (d, 1H), 7.72-7.60 (m, 14H), 7.58-7.50 (m, 12H), 7.34 (dd, 1H), 7.18-7.08 (m, 4H), 7.05 (m, 4H) | 865.41 | 865.32 |

TABLE 1-continued

| Compound | 1H NMR (CDCl$_3$, 400 MHz) | MS/FAB found | MS/FAB calc. |
|---|---|---|---|
| 4 | δ = 7.92-7.90 (dd, 2H), 7.85-7.81 (m, 4H), 7.72-7.68 (m, 12H), 7.60-7.50 (m, 12H), 7.35-7.32 (m, 5H), 7.25-7.23 (d, 2H), 7.21-7.19 (m, 2H), 7.02-6.98 (m, 4H), 6.88-6.86 (m, 1H), 6.80-6.78 (m, 2H) | 942.45 | 942.37 |
| 7 | δ = 8.12-8.10 (dd, 2H), 8.05-8.03 (dd, 2H), 8.01-7.99 (m, 2H), 7.95-7.92(m, 2H), 7.88-7.86(m, 2H), 7.80-7.76(m, 6H), 7.70-7.64(m, 6H), 7.58-7.52(m, 6H), 7.40-7.36(m, 4H), 7.32-7.28(m, 6H), 7.20-7.18(m, 2H), 7.12-7.10(m, 2H), 6.88-6.86 (m, 4H) | 966.45 | 966.37 |
| 10 | δ = 7.91-7.88 (d, 1H), 7.84-7.82 (d, 1H), 7.70-7.64 (m, 4H), 7.60-7.48 (m, 14H), 7.44-7.32 (m, 20H), 7.08-7.06 (s, 1H), 7.04-7.02(s, 1H), 6.94-6.90 (m, 8H) | 1018.35 | 1018.40 |
| 11 | δ = 8.15-8.13 (m, 1H), 7.98-7.89 (m, 5H), 7.80-7.76 (m, 11H), 7.74-7.68 (m, 9H), 7.48-7.44 (m, 4H), 7.40-7.38(d, 1H), 7.32-7.30(d, 1H), 7.22-7.20(m, 4H), 7.12-7.10(d, 1H), 6.97-6.95(m, 2H), 6.87-6.82 (m, 2H) | 867.44 | 867.34 |
| 15 | δ = 8.82-8.79 (m, 1H), 7.92-7.88 (m, 5H), 7.82-7.80 (m, 1H), 7.78-7.75 (m, 11H), 7.72-7.68 (m, 13H), 7.50-7.48 (m, 1H), 7.28-7.26 (m, 2H), 7.20-7.18(m, 1H), 7.16-7.14 (m, 2H), 7.02-6.98(m, 3H) | 948.30 | 948.40 |
| 18 | δ = 7.92-7.90 (d, 1H), 7.88-7.86(d, 1H), 7.78-7.70 (m, 12H), 7.67-7.62 (m, 12H), 7.58-7.56 (m, 2H), 7.42-7.40 (m, 2H), 7.25-7.23 (m, 2H), 7.18-7.15 (m, 6H), 6.82-6.80 (m, 2H), 0.25 (s, 18H) | 1010.38 | 1010.42 |
| 20 | δ = 7.88-7.86 (m, 2H), 7.84-7.82(m, 2H), 7.78(s, 1H), 7.76(s, 1H), 7.70-7.62 (m, 18H), 7.58-7.50 (m, 10H), 7.45-7.40 (m, 4H), 7.35-7.33 (m, 2H), 7.21-7.19 (m, 2H), 6.98 (d, 2H), 6.74-6.72 (m, 2H) | 966.47 | 966.37 |
| 22 | δ = 7.98-7.96 (m, 4H), 7.90-7.88 (d, 1H), 7.86-7.84(m, 1H), 7.80-7.78 (m, 2H), 7.70-7.62 (m, 14H), 7.54-7.44 (m, 10H), 7.38-7.36 (m, 2H), 7.32-7.28(m, 2H), 7.20-7.16 (m, 4H), 7.10-7.08 (m, 2H), 7.00-6.98 (d, 2H), 6.82-6.80(m, 2H) | 1046.26 | 1046.36 |
| 29 | δ = 8.10-8.08 (d, 2H), 8.00-7.96 (m, 4H), 7.92-7.90 (m, 2H), 7.82-7.78 (m, 4H), 7.72-7.60 (m, 14H), 7.55-7.53 (d, 2H), 7.48-7.46 (m, 2H), 7.40-7.36(m, 4H), 7.28-7.26 (m, 4H), 7.20-7.18 (m, 2H), 6.87-6.83(m, 4H) | 940.45 | 940.36 |
| 31 | δ = 7.97-7.95 (m, 2H), 7.82-7.78 (m, 14H), 7.76-7.70 (m, 10H), 7.56-7.52 (m, 6H), 7.48-7.46 (d, 2H), 7.38-7.32 (m, 2H), 7.05-7.00 (m, 4H) | 840.41 | 840.33 |
| 32 | δ = 7.87-7.85 (m, 2H), 7.78-7.72 (m, 14H), 7.70-7.62(m, 8H), 7.60-7.58 (d, 2H), 7.53-7.50 (m, 4H), 7.41-7.38 (m, 2H), 7.27-7.25 (d, 2H), 7.13-7.12(m, 2H), 6.68-6.64(m, 2H), 1.45(s, 18H) | 952.44 | 952.45 |
| 33 | δ = 7.88-7.86 (m, 2H), 7.79-7.58 (m, 26H), 7.50-7.46(m, 4H), 7.44-7.40 (m, 4H), 7.38-7.36 (d, 1H), 7.30-7.26 (m, 2H), 7.13-7.10 (d, 1H), 7.08-7.06 (m, 2H) 7.02-7.00 (m, 2H) | 917.23 | 917.13 |
| 38 | δ = 8.14-8.10 (m, 2H), 8.07-8.05 (m, 2H), 7.87-7.85(m, 2H), 7.80-7.76 (m, 6H), 7.72-7.68(m, 4H), 7.66-7.64 (m, 2H), 7.48-7.46 (d, 2H), 7.40-7.36 (m, 4H), 7.30-7.28(d, 2H), 7.20-7.16 (m, 2H), 7.02-6.98(m, 4H), 1.87(s, 18H) | 850.30 | 850.40 |
| 40 | δ = 8.12-8.08 (m, 2H), 7.96-7.93 (m, 3H), 7.88-7.80(m, 12H), 7.78-7.70 (m, 11H), 7.65-7.60(m, 5H), 7.48-7.46 (d, 2H), 7.42-7.40 (m, 2H), 7.18-7.14 (m, 2H), 7.10-7.08(m, 2H), 1.32(s, 9H) | 946.39 | 946.40 |
| 42 | δ = 7.95-7.97 (m, 2H), 7.88-7.80 (m, 12H), 7.78-7.70(m, 8H), 7.64-7.60 (m, 4H), 7.52-7.48(m, 4H), 7.46-7.44 (d, 2H), 7.42-7.40 (dd, 2H), 7.28-7.24 (m, 4H), 1.37(s, 6H) | 906.47 | 906.37 |
| 47 | δ = 8.32-8.30 (m, 1H), 7.87-7.85 (m, 2H), 7.78-7.70(m, 12H), 7.68-7.58 (m, 11H), 7.54-7.50 (m, 2H), 7.38-7.30 (m, 6H), 7.15-7.11 (m, 4H), 7.09-7.07 (m, 2H) 7.03-7.01 (d, 1H), 6.89-6.84(m, 4H) | 955.42 | 955.37 |
| 51 | δ = 7.84-7.82 (m, 2H), 7.78-7.76 (d, 1H), 7.74-7.72(d, 1H), 7.68-7.60 (m, 10H), 7.57-7.50 (m, 10H), 7.47-7.43 (m, 4H), 7.41-7.32 (m, 10H), 7.12-7.07(m, 2H), 7.05-7.02 (m, 2H), 6.97-6.92 (m, 4H), 6.87-6.83(m, 4H) | 1030.38 | 1030.40 |
| 54 | δ = 7.86-7.84 (m, 2H), 7.81-7.79(d, 1H), 7.72-7.68(d, 1H), 7.62-7.53 (m, 13H), 7.42-7.38(m, 11H), 7.32-7.27 (d, 1H), 7.25-7.20 (m, 4H), 7.04-7.03 (m, 2H), 6.97-6.93 (m, 3H), 6.88-6.86(m, 1H), 6.78-6.76 (m, 1H), 6.70-6.65 (m, 4H), 1.65(s, 6H) | 982.13 | 982.23 |
| 56 | δ = 7.87.-7.85(m, 2H), 7.79-7.75 (d, 2H), 7.73-7.64 (m, 14H), 7.60-7.51 (m, 8H), 7.34-7.30 (m, 4H), 7.23-7.18 (dd, 2H), 7.14-7.11 (d, 2H), 7.03-6.97(m, 2H), 6.85-6.83 (m, 4H), 6.87-6.83(m, 4H) | 880.21 | 880.32 |

Compounds other than the above-described compounds may be easily recognized based on the above-described synthesis pathways and the above-described raw materials.

Example 1

A first electrode (i.e., anode) was prepared by cutting an ITO glass substrate (Corning, 15 Ω/cm$^2$, and 1,200 Å) into a size of 50 mm×50 mm×0.7 mm, followed by ultrasonic cleaning for 5 minutes each time by using isopropyl alcohol and pure water. After that, the ITO glass substrate was subject to UV irradiation for 30 minutes and exposure to ozone for cleaning. Next, the ITO glass substrate was disposed in a vacuum deposition apparatus.

4,4',4"-tris(2-naphthyl([phenyl)amino)triphenylamine (hereinafter, referred to as 2-TNATA) known as an HIL was vacuum deposited on top of the ITO glass to a thickness of 600 Å. Then, Compound 2, as a hole-transporting compound, was vacuum-deposited on the HIL to a thickness of 300 Å.

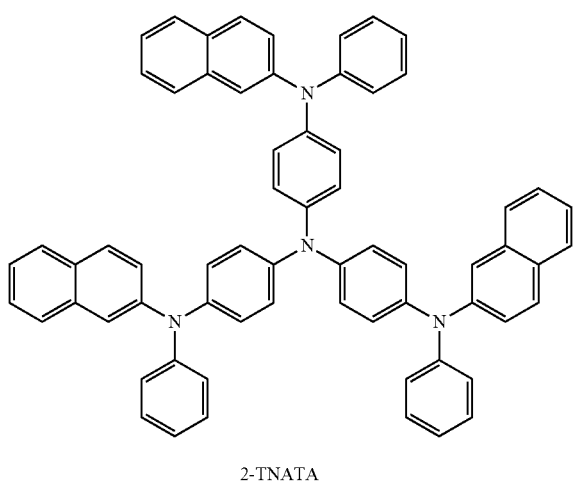 [SMILES: c1ccc(N(c2ccc(N(c3ccc(N(c4ccccc4)c4ccc5ccccc5c4)cc3)c3ccc(N(c4ccccc4)c4ccc5ccccc5c4)cc3)cc2)c2ccc3ccccc3c2)cc1]

2-TNATA

Next, 9,10-di(naphthylene-2-yl)anthracene (ADN) and 4,4'-bis[2-(4-(N,N-diphenylamino)phenyl)vinyl]biphenyl (DPAVBi) were co-deposited in a weight ratio of 98:2 to form an EML having a thickness of 300 Å.

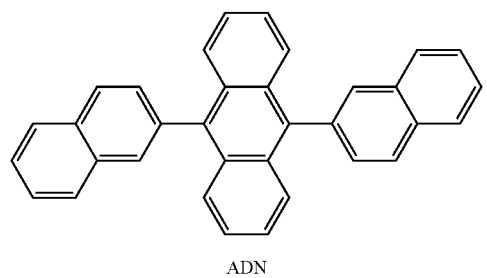

ADN

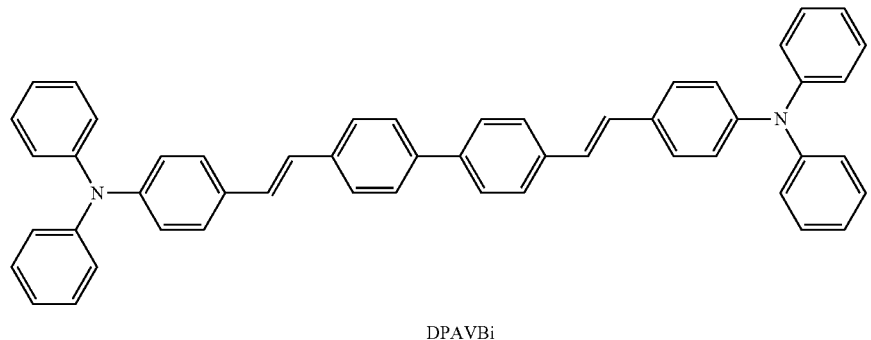

DPAVBi

After that, Alq$_3$ compound was deposited on the EML to form an ETL having a thickness of 300 Å. Then, the halogenated alkali metal (LiF) as an EIL and Al as a cathode were sequentially deposited on the ETL to a thickness of 10 Å and 2,000 Å, respectively, thereby completing a manufacture of an OLED.

Example 2

An OLED was manufactured in the same manner as in Example 1, except that Compound 10 was used instead of Compound 2 to form the HTL.

Example 3

An OLED was manufactured in the same manner as in Example 1, except that Compound 31 was used instead of Compound 2 to form the HTL.

Example 4

An OLED was manufactured in the same manner as in Example 1, except that Compound 47 was used instead of Compound 2 to form the HTL.

Example 5

An OLED was manufactured in the same manner as in Example 1, except that Compound 51 was used instead of 2-TNATA to form the HIL, and 4,4'-bis[N-(1-naphthyl)-N-phenylamino]biphenyl (hereinafter, referred to as NPB) was used instead of Compound 2 to form the HTL.

Example 6

An OLED was manufactured in the same manner as in Example 5, except that Compound 56 was used instead of Compound 51 to form the HIL.

Example 7

An OLED was manufactured in the same manner as in Example 1, except that Compound 18 was used instead of DPAVBi to form the EML, and NPB was used instead of Compound 2 to form the HTL.

Example 8

An OLED was manufactured in the same manner as in Example 7, except that Compound 40 was used instead of Compound 18 to form the EML.

Comparative Example 1

An OLED was manufactured in the same manner as in Example 1, except that NPB was used instead of Compound 2 to form the HTL.

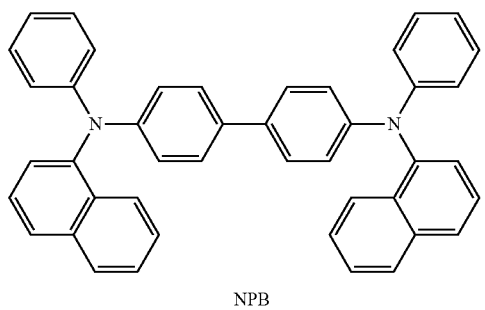 [SMILES: c1ccc(N(c2ccc(-c3ccc(N(c4ccccc4)c4cccc5ccccc45)cc3)cc2)c2cccc3ccccc23)cc1 ; "NPB"]

NPB

In the Examples that used the compounds of Formula 1, above, as hole-transporting materials for a blue diode, all the materials were found to have excellent I-V-L characteristics in which the driving voltage is decreased and the improved efficiency was significantly increased, compared to NPB. For example, lifespan improvement of the compounds of Formula 1, above, was so good that lifespan thereof was improved excellent. In some Examples that used the compounds of Formula 1, above, as hole-injecting materials for a blue diode, the materials were found to improve the driving voltage and the efficiency thereof, compared to 2-TNATA, to be suitable for the HIL. In some other Examples that used the compounds of Formula 1, above, as a dopant for a blue EML, the materials were found to improve the driving voltage and the efficiency thereof, compared to DPAVBi, to be suitable for the blue EML. The representative characteristics and results of lifespan improvement are shown in Table 2 below.

As described above, according to the one or more of the above embodiments, an organic light-emitting diode may include a compound represented by Formula 1, e.g., an arylamine compound represented by Formula 1, that is suitable for hole injection or hole transport in fluorescent and phosphorescent devices of all colors including red, green, blue, and white. The material may exhibit excellent light-emitting ability and hole-transporting ability. For example, the compound may be suitable as a material for emitting green, blue, and white colors of the fluorescent devices. An organic light-emitting diode including the compound may have high efficiency, low driving voltage, high brightness, and long lifespan.

The embodiments may provide a material that has excellent electrical stability, high charge-transport ability or light-emitting ability, high glass transition temperature, and the ability to prevent crystallization.

The embodiments may provide a material suitable for fluorescent and phosphorescent devices of all colors including red, green, blue, and white, wherein the material has excellent electrical stability, high charge-transport ability and light-emitting ability, high glass transition temperature, and the ability to prevent crystallization.

The embodiments may also provide an organic light-emitting diode (OLED) including the material and having high efficiency, low driving voltage, high brightness, and long lifespan.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

TABLE 2

| | HTL, HIL, EML materials | Driving voltage (V) | Current density (mA/cm$^2$) | Brightness (cd/m$^2$) | Efficiency (cd/A) | Emission color | Half lifespan (hr @ 100 mA/cm$^2$) |
|---|---|---|---|---|---|---|---|
| Example 1 | Compound 2 | 6.55 | 50 | 3,200 | 6.40 | Blue | 265 hr |
| Example 2 | Compound 10 | 6.15 | 50 | 3,375 | 6.75 | Blue | 330 hr |
| Example 3 | Compound 31 | 6.20 | 50 | 3,325 | 6.68 | Blue | 315 hr |
| Example 4 | Compound 47 | 6.33 | 50 | 3,375 | 6.75 | Blue | 282 hr |
| Example 5 | Compound 51 | 6.41 | 50 | 3,225 | 6.45 | Blue | 255 hr |
| Example 6 | Compound 56 | 6.45 | 50 | 3,210 | 6.42 | Blue | 250 hr |
| Example 7 | Compound 18 | 6.65 | 50 | 3,125 | 6.25 | Blue | 248 hr |
| Example 8 | Compound 40 | 6.70 | 50 | 3,250 | 6.50 | Blue | 230 hr |
| Comparative Example 1 | NPB | 7.35 | 50 | 2,065 | 4.13 | Blue | 145 hr |

What is claimed is:

1. A heterocyclic compound represented by Formula 1 below:

<Formula 1>

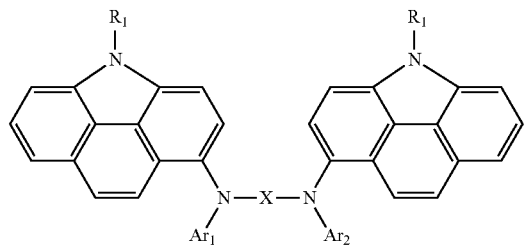

wherein:
X is a substituted or unsubstituted $C_6$-$C_{60}$ arylene group, a substituted or unsubstituted $C_2$-$C_{60}$ heteroarylene group, a substituted or unsubstituted $C_6$-$C_{60}$ condensed polycyclic group, or a divalent linking group that connects at least two of the arylene group, the heteroarylene group, and the condensed polycyclic group;

$R_1$ and $R_2$ are each independently a substituted or unsubstituted $C_1$-$C_{60}$ alkyl group, a substituted or unsubstituted $C_3$-$C_{30}$ cycloalkyl group, a substituted or unsubstituted $C_6$-$C_{60}$ aryl group, a substituted or unsubstituted $C_2$-$C_{60}$ heteroaryl group, or a substituted or unsubstituted $C_6$-$C_{60}$ condensed polycyclic group; and $Ar_1$ and $Ar_2$ are each independently a substituted or unsubstituted $C_6$-$C_{60}$ aryl group, a substituted or unsubstituted $C_2$-$C_{60}$ heteroaryl group, or a substituted or unsubstituted $C_6$-$C_{60}$ condensed polycyclic group.

2. The heterocyclic compound as claimed in claim 1, wherein $R_1$ and $R_2$ in Formula 1 are each independently a substituted or unsubstituted $C_6$-$C_{60}$ aryl group or a substituted or unsubstituted $C_2$-$C_{60}$ heteroaryl group.

3. The heterocyclic compound as claimed in claim 1, wherein $Ar_1$ and $Ar_2$ in Formula 1 are each independently a substituted or unsubstituted $C_6$-$C_{60}$ aryl group or a substituted or unsubstituted $C_2$-$C_{60}$ heteroaryl group.

4. The heterocyclic compound as claimed in claim 1, wherein $R_1$ and $R_2$ in Formula 1 are each independently a substituted or unsubstituted $C_1$-$C_{20}$ alkyl group or a group represented by one of Formulae 2a to 2d below:

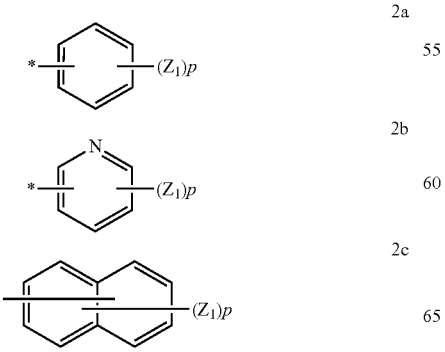

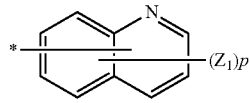

wherein:
$Z_1$ is a hydrogen, a deuterium, a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted $C_6$-$C_{20}$ condensed polycyclic group, a halogen atom, a cyano group, a nitro group, a hydroxyl group, a carboxyl group, or $Si(Q_3)(Q_4)(Q_5)$, in which $Q_3$ to $Q_5$ are each independently a hydrogen, a $C_1$-$C_{10}$ alkyl group, a $C_6$-$C_{20}$ aryl group, or a $C_2$-$C_{20}$ heteroaryl group, and each $Z_1$ is identical to or different from each other when numbers of $Z_1$s are two or greater;

in Formula 2a, p is an integer of 1 to 5;
in Formula 2b, p is an integer of 1 to 4;
in Formula 2c, p is an integer of 1 to 7;
in Formula 2d, p is an integer of 1 to 6; and
* indicates a binding site.

5. The heterocyclic compound as claimed in claim 1, wherein X in Formula 1 is a group represented by one of Formulae 3a to 3l below:

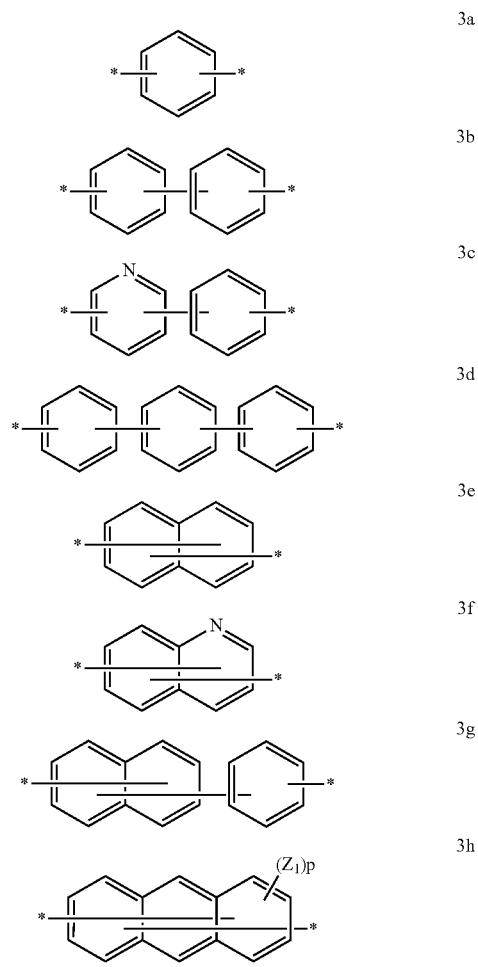

-continued

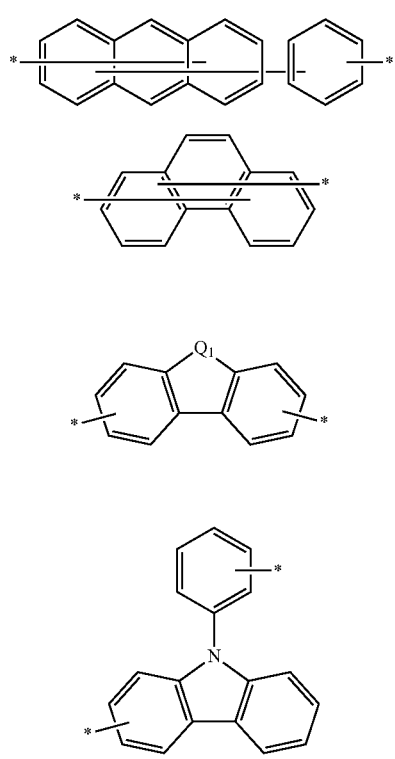

wherein:
$Q_1$ is $-CR_{11}R_{12}-$, $-S-$, $-SiR_{31}R_{32}-$, or $-O-$;
$R_{11}$, $R_{12}$, $R_{21}$, $R_{31}$, $R_{32}$, and $Z_1$ are each independently a hydrogen, a deuterium, a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted $C_6$-$C_{20}$ condensed polycyclic group, a halogen atom, a cyano group, a nitro group, a hydroxyl group, or a carboxyl group, each $Z_1$ being identical to or different from each other when numbers of $Z_1$s are two or greater;

p is an integer of 1 to 4; and
* indicates a binding site.

6. The heterocyclic compound as claimed in claim 1, wherein $Ar_1$ and $Ar_2$ in Formula 1 are each independently a group represented by one of Formulae 4a to 4c below:

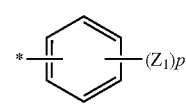

4a

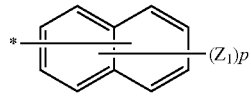

4b

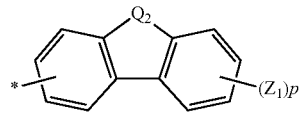

4c wherein:
$Q_2$ is $-CR_{11}R_{12}-$ or $-O-$;
$R_{11}$, $R_{12}$, and $Z_1$ are each independently a hydrogen, a deuterium, a substituted or unsubstituted $C_1$-$C_{20}$ alkyl group, a substituted or unsubstituted $C_6$-$C_{20}$ aryl group, a substituted or unsubstituted $C_2$-$C_{20}$ heteroaryl group, a substituted or unsubstituted $C_6$-$C_{20}$ condensed polycyclic group, a halogen atom, a cyano group, a nitro group, a hydroxyl group, or a carboxyl group, each $Z_1$ being identical to or different from each other when numbers of $Z_1$s are two or greater;
in Formula 4a, p is an integer of 1 to 5;
in Formula 4b, p is an integer of 1 to 7;
in Formula 4c, p is an integer of 1 to 4; and
* indicates a binding site.

7. The heterocyclic compound as claimed in claim 1, wherein the heterocyclic compound represented by Formula 1 is one of compounds 2, 10, 18, 31, 40, 47, 51, or 56, below:

2

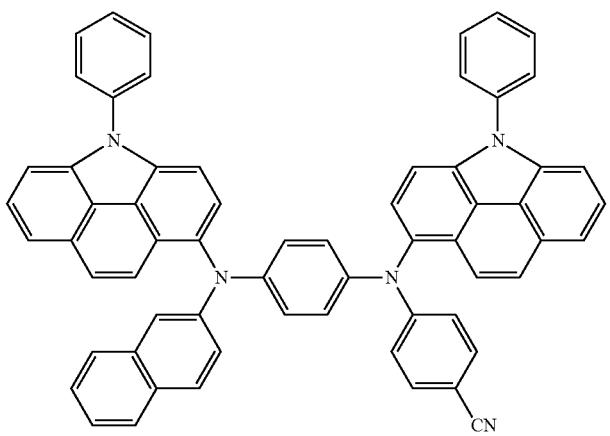

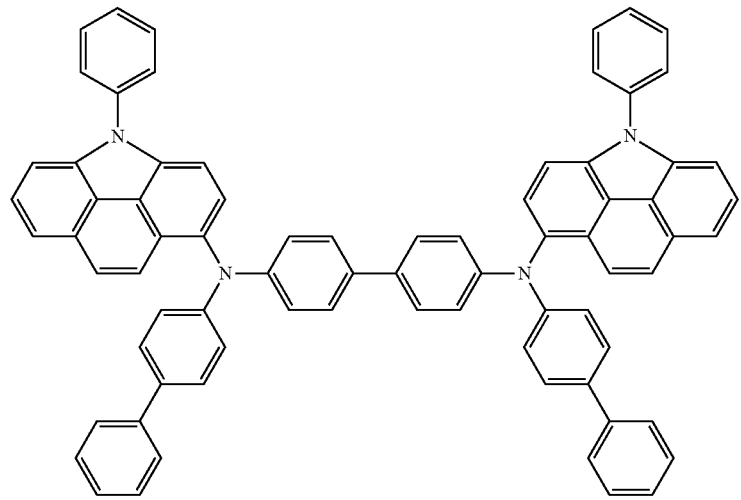
10
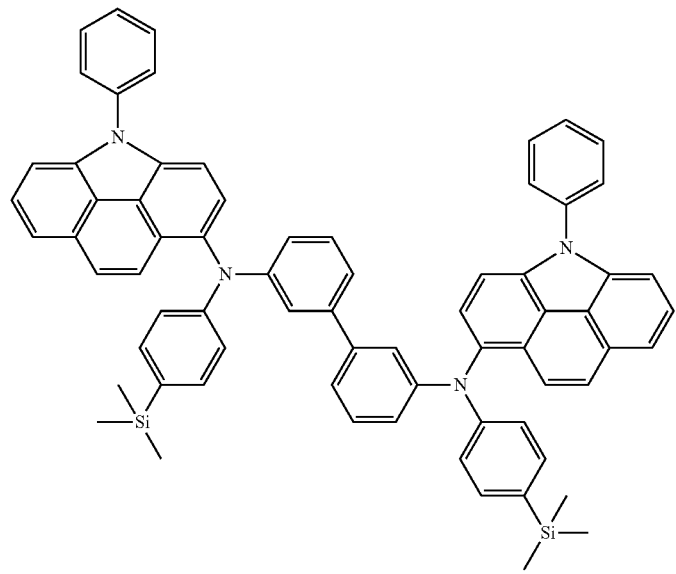
18
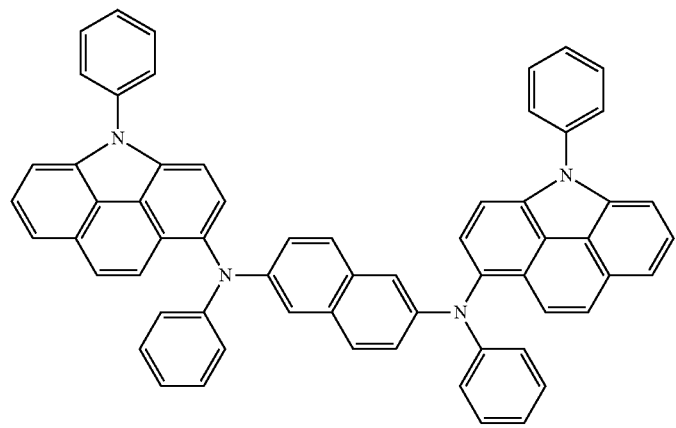
31

40
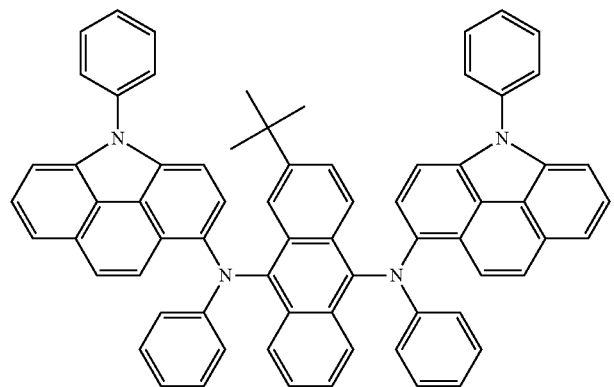
47
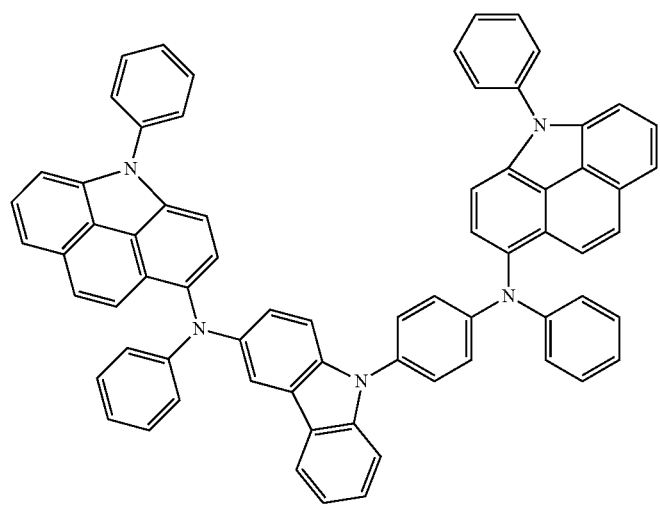
51
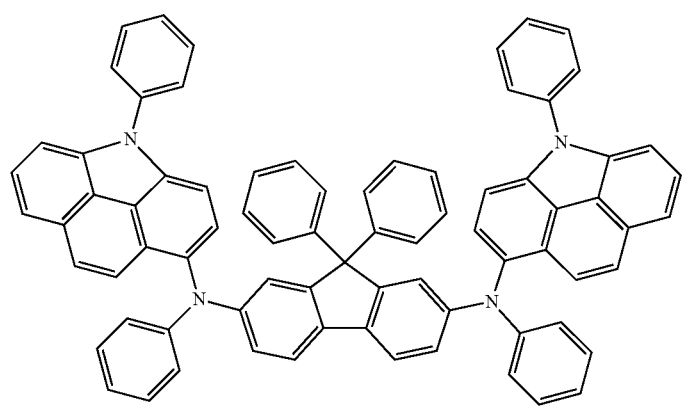
56
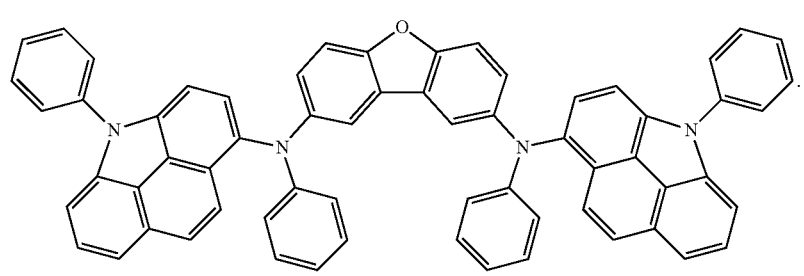

8. An organic light-emitting diode, comprising:
a first electrode;
a second electrode facing the first electrode; and
an organic layer between the first electrode and the second electrode, the organic layer including the heterocyclic compound as claimed in claim 1.

9. The organic light-emitting diode as claimed in claim 8, wherein the organic layer includes a hole transport layer, a hole injection layer, a functional layer having both hole injection and hole transport capabilities, or an emission layer.

10. The organic light-emitting diode as claimed in claim 8, wherein:
the organic layer includes an emission layer, and further includes an electron injection layer, an electron transport layer, a functional layer having both electron injection and electron transport capabilities, a hole injection layer, a hole transport layer, or a functional layer having both hole injection and hole transport capabilities, and
the emission layer includes an anthracene-based compound, an arylamine-based compound, or a styryl-based compound.

11. The organic light-emitting diode as claimed in claim 8, wherein:
the organic layer includes an emission layer, and further includes an electron injection layer, an electron transport layer, a functional layer having both electron injection and electron transport capabilities, a hole injection layer, a hole transport layer, or a functional layer having both hole injection and hole transport capabilities, and
at least one layer of a red emission layer, a green emission layer, a blue emission layer, and a white emission layer of the emission layer includes a phosphorescent compound.

12. The organic light-emitting diode as claimed in claim 11, wherein:
the organic layer includes the hole injection layer, the hole transport layer, or the functional layer having both hole injection and hole transport capabilities, and
the hole injection layer, the hole transport layer, or the functional layer having both hole injection and hole transport capabilities includes a charge-generating material.

13. The organic light-emitting diode as claimed in claim 12, wherein the charge-generating material is a p-dopant.

14. The organic light-emitting diode as claimed in claim 13, wherein the p-dopant is a quinone derivative.

15. The organic light-emitting diode as claimed in claim 13, wherein the p-dopant is a metal oxide.

16. The organic light-emitting diode as claimed in claim 13, wherein the p-dopant is a cyano group-containing compound.

17. The organic light-emitting diode as claimed in claim 8, wherein the organic layer includes an electron transport layer, the electron transport layer including a metal complex.

18. The organic light-emitting diode as claimed in claim 17, wherein the metal complex is a lithium complex.

19. The organic light-emitting diode as claimed in claim 8, wherein the organic layer including the heterocyclic compound is formed using a wet process.

20. The organic light-emitting diode as claimed in claim 8, wherein the first electrode of the OLED is electrically connected to a source electrode or a drain electrode in a thin film transistor (TFT).

* * * * *